United States Patent [19]
Kajiwara et al.

[11] Patent Number: 6,052,172
[45] Date of Patent: Apr. 18, 2000

[54] CONTACTING DEVICE FOR DISPLAY PANEL

[75] Inventors: Yasushi Kajiwara; Tetsufumi Ohta, both of Kawaguchi, Japan

[73] Assignee: Enplas Corporation, Japan

[21] Appl. No.: 08/865,279

[22] Filed: May 29, 1997

[30] Foreign Application Priority Data

May 31, 1996 [JP] Japan ................................ 8-160612
May 29, 1996 [JP] Japan ................................ 8-158803

[51] Int. Cl.[7] ................................................. G02F 1/1345
[52] U.S. Cl. ..................................... 349/152; 349/149
[58] Field of Search ................................ 349/149, 150, 349/152

Primary Examiner—Frank G. Font
Assistant Examiner—Michael P. Stafira
Attorney, Agent, or Firm—Fish & Richardson P.C.

[57] ABSTRACT

A display panel inspecting contact apparatus has a contact film which is to be brought into contact with individual electrodes on a substrate of a color display panel. Contactors for three colors and individual electrodes for three colors are arranged on one surface of the film substrate in a contact area of the front end of the contact film so that they are respectively brought into contact separately for each of the colors. Of the contactors, the contactors for the first color and second color are arranged at the front portion in the contact area at the front end of the contact film, while the contactors for the third color are arranged at the rear portion in the contact area at the front end of the contact film.

25 Claims, 35 Drawing Sheets

CONTACTING DEVICE FOR DISPLAY PANEL

BACKGROUND OF THE INVENTION

1. Field of the Invention

The present invention relates to a display panel contact apparatus, more particularly relates to a display panel contact apparatus capable of bringing contactors formed on a pliable film into contact with signal line terminals of a color liquid crystal display panel with a required pushing force so as to cause the color liquid crystal display panel to light up and display a selected color. Further, the present invention relates to a flexible printed circuit board in which it is possible to efficiently perform inspection of conduction after connecting a plurality of conductive patterns to a connector, IC tab, or other electronic component with a plurality of electrode patterns arranged at close distances or a large number of terminals formed in a row, an electrical connecting apparatus utilizing this, and a method of using the same.

2. Description of the Related Art

In general, a liquid crystal display panel of the active matrix system is formed by arranging a pixel at each intersecting portion of signal lines laid in the form of a lattice. Each pixel is comprised of a switching element made of a thin film transistor, a transparent pixel electrode connected to one electrode (drain electrode) thereof, and a transparent common electrode arranged facing this transparent electrode via a liquid crystal. Further, in the color liquid crystal display panel, a color filter comprised of dots of three colors of red (R), green (G), and blue (B) arranged in the form of a matrix is used. At the same time, the above transparent pixel electrodes are arranged corresponding to the dots of these colors. Further, in this type of liquid crystal display panel, terminals of the pixel electrode signal lines connected to the electrodes of the above pixel switching elements (source electrodes and gate electrodes), terminals of the common electrode signal lines connected to the transparent common electrodes, etc. are formed on a transparent insulating substrate at the periphery of the liquid crystal display portion arranged divided into blocks for every driving module. Conventionally, in order to inspect the display quality etc. of this type of liquid crystal display panel before connecting and fixing peripheral circuits such as the driving module, generally use has been made of a liquid crystal display panel inspecting apparatus which brings contactors formed by a conductor on one surface of a film substrate, generally referred to as a "contact film", into contact with the above signal line terminals of the liquid crystal display panel with a required pushing force so as to light up the liquid crystal display panel (for example, refer to Japanese Unexamined Patent Publication (Kokai) No. 2-78969).

In such a conventional color liquid crystal display panel inspecting apparatus, generally a single liquid crystal driving signal is simultaneously supplied to the signal line terminals for the separate-color pixel electrode of the color liquid crystal display panel via the contactors formed on the film substrate so as to light up the three colors of pixels to make the color liquid crystal display panel light up with a white color. Accordingly, generally the contactors on the film substrate in the conventional color liquid crystal display panel inspecting apparatus are formed into patterns in a direction cutting across the signal line terminals for the separate-color pixel electrodes so as to simultaneously contact the signal line terminals for the separate-color pixel electrodes of the color liquid crystal display panel. Accordingly, the signal supply wiring pattern connected to the contactors for contact with the signal line terminals for the pixel electrodes may be a streamlined, simple pattern and may be easily formed on one surface of the film substrate together with the wiring pattern connected to the contactors for contact with the common electrode signal line terminals.

In recent years, demand has been growing for strictly performing the lighting inspection of the color liquid crystal display panel by separate color. In this case, it is necessary to form the contactors on the film substrate at the same pitch as the signal line terminals for the separate-color pixel electrodes in the color liquid crystal display panel and, at the same time, it is necessary to individually supply signals to three contactor groups corresponding to the groups of the signal line terminals for the separate-color pixel electrodes. Therefore, where it is desired to form the signal wiring for individually supplying signals to these three contactor groups as independent patterns for each type of contactors on one surface of the film substrate together with the contactors, a pitch much larger than the pitch of the contactors must be secured at the signal input end of the signal wiring. Therefore the width of the film substrate is increased and the flexible printed circuit board, connector, etc. for connection with the signal wires on the film substrate become large and therefore it becomes impossible to form a portable contact-socket type display panel inspecting apparatus.

On the other hand, the problem can be solved if the signal wiring connected to each group of contactors on the film substrate has a pattern and shape terminated at the signal input end, but since the separate color pixels are formed alternately three colors at a time, it is impossible to form the signal wiring to be respectively connected to the three contactor groups corresponding to the separate color pixel electrode signal line terminal groups on one surface of the film substrate without causing short circuiting. Further, the method may be considered of dividing a single signal wire at the position of the branched wiring in the vicinity of the contactors, forming the portion of the wiring of the signal input end on the reverse surface of the film substrate, connecting the portion of the wiring of the signal input end and the portion of the wiring of the contactor side by through holes, and thereby forming a three-dimensional circuit, but a very large number of through holes of the same number as that of the contactors becomes necessary. Further, the branched wiring parts in the vicinity of the contactors have a very fine pitch, therefore a high level of precision is required for the formation of the through holes and, at the same time, a high positioning precision is required for the formation of the two portions of the wiring on the two surfaces of the film substrate. This causes a great rise in the manufacturing costs.

Further, in general, a plurality of IC tabs each configured by mounting a drive IC chip on an insulating film are respectively connected to the source side electrodes and the gate side electrodes on the substrate of the liquid crystal display panel. Accordingly, the individual source side electrodes and individual gate side electrodes of the liquid crystal display panel are formed together with common electrodes into blocks for each number of electrodes corresponding to the number of output side electrodes of the IC tabs.

In the process of manufacturing such a liquid crystal display panel, the inspection of the display quality etc. for detecting defective portions of the display is carried out for the liquid crystal display panel before connection of peripheral circuits such as the above IC tabs. Accordingly, in this type of inspection, a contact apparatus provided with contact members for contact with the electrodes arranged on the substrate of the liquid crystal display panel before the connection of peripheral circuits has been used. For example, as shown in Japanese Unexamined Patent Publication (Kokai) No. 6-08034, as the contact members for contact with the electrodes of the liquid crystal display panel, conventionally needle-shaped or wire-shaped probes and contact films constituted by forming contact conductor patterns on base films having pliability and an insulating property have been known. Along with the higher density and finer pitch of the electrodes, contact films have tended to be adopted from the viewpoints of the reliability of contact with the electrodes, facility of handling, and manufacturing costs.

In the liquid crystal display panel inspecting contact apparatus used in such an inspection, generally a contact film 8 as shown in FIG. 36 and FIG. 37 is used. The contact film 8 shown in the figures is comprised of a flexible substrate 8a having an insulating property and an IC tab 5 connected to one end of the flexible substrate by an anisotropic conductive sheet, soldering, or the like. A plurality of conductive patterns 8b arranged in parallel at a fine pitch are formed on one side surface of the flexible substrate 8a. The connection terminals of the IC tab 5 are individually connected to these conductive patterns 8b.

The contact film 8 configured as described above is brought into contact with one of the individual electrode groups 9a comprised of a predetermined number of electrodes of a liquid crystal display panel 9. The conductive patterns 8b are individually connected with the individual electrodes. Accordingly, by using the above contact film 8, individual electrodes extending from the liquid crystal display panel 9 can be reliably inspected one by one.

The conductive patterns 8b of the contact film 8 are formed precisely corresponding to the high density arrangement of the individual electrodes with a precision of for example about 0.01 mm. An extremely sophisticated level of technology is required for connecting the IC tab 5 to the conductive patterns 8b. For this reason, an extremely high precision becomes necessary for connecting the flexible printed circuit board 8a and the IC tab 5, so the inspection of conduction after connection could not be eliminated. However, it is extremely difficult to individually inspect a plurality of fine conductive patterns 8b formed on a completed contact film 8 and it is necessary to raise the inspection efficiency.

SUMMARY OF THE INVENTION

Accordingly, a first object of the present invention is to provide a small sized display panel contact apparatus with which the pixels of a color liquid crystal display panel can be lighted separately by color and in addition the electrical reliability at the time of inspection of the liquid crystal display panel can be secured with a low manufacturing cost.

Further, a second object of the present invention is to provide a flexible printed circuit board in which the inspection of conduction of the electronic components or electronic circuits individually connected to a flexible printed circuit board having a plurality of conductive patterns arranged with a fine pitch can be performed with a high efficiency, an electrical connecting apparatus using this, and a method using the same.

In order to achieve the above first object, according to the present invention, there is provided a display panel contact apparatus wherein a front end area of a contact film is brought into contact with a plurality of individual separate-color electrodes arranged on the substrate of the liquid crystal display panel having a function of displaying red, green, and blue colors and wherein signals for inspection of the display quality etc. are supplied for each of the colors, characterized in that the contact film is provided with a pliable film substrate and a plurality of separate-color contactors arranged corresponding to the arrangement of the individual electrodes on one surface at the front end of the film substrate; the contactors for any one of the colors among the contactors are sequentially arranged shifted in position to the front side or rear side of the contactors for the other two colors in the front end area of the film substrate; the contactors for each of the colors are connected to a signal input portion formed at the rear end of the contact film via a wiring pattern formed on the film substrate without mutual intersection; and the wiring patterns are covered by an insulating film at least at the front end area of the film substrate.

According to the above configuration, it becomes possible to individually light up the three colors to perform the inspection and further it becomes possible to utilize a contact film in which the circuits are printed on only one surface of the film substrate, so an extremely cheap and highly reliable display panel contact apparatus is provided.

In the above contact apparatus, preferably a first color wiring pattern for connecting first color contactors arranged at the front side in the front end area of the film substrate with a signal input portion has a trunk line pattern connected to the first color contactors at the front end of the front end area of the film substrate; a second color wiring pattern for connecting the second color contactors arranged at the front side or rear side in the front end area of the film substrate with a signal input portion has a trunk line pattern connected to the second color contactors between the contactors on the front side and the contactors on the rear side in the front end area of the film substrate; and a third color wiring pattern for connecting the third color contactors arranged at the rear side in the front end area of the film substrate with a signal input portion has a trunk line pattern connected to the third color contactors at the rear end of the front end area of the film substrate.

According to the above configuration, the wiring patterns connecting the different color contactors with the signal input portions can be arranged on one surface of the film substrate while ensuring a large effective area of contact of the different color contactors.

In the above contact apparatus, preferably, the first color wiring pattern extends to the signal input portion from the two ends of the trunk line pattern thereof; the second color wiring pattern extends to the signal input portion at the inside of the first color wiring pattern from the two ends of the trunk line pattern of the second color wiring pattern; and the third color wiring pattern extends to the signal input portion at the inside of the second color wiring pattern from substantially the center portion of the trunk line pattern of the third color wiring pattern.

According to the above configuration, since signals are supplied to the trunk line patterns connected to the three color contactors from the two ends thereof or the signals are supplied from the center portions, the levels of the signals supplied to a plurality of arranged contactors can be made uniform and a preciser inspection of the liquid crystal display can be realized.

In the above contact apparatus, preferably the first color wiring pattern arranged at the front side in the front end area of the film substrate for connecting the first color contactors with the signal input portion has a trunk line pattern connected to the first color contactors between the contactors at the front side and the contactors at the rear side in the front end area of the film substrate; the second color wiring pattern arranged at the front side or rear side in the front end area of the film substrate for connecting the second color contactors with the signal input portion has a trunk line pattern connected to the second color contactors between the contactors at front side and the contactors at the rear side in the front end area of the film substrate; and the third color wiring pattern arranged at the rear side in the front end area of the film substrate for connecting the third color contactors and the signal input portion has a trunk line pattern connected to the third color contactors at the rear side of the front end area of the film substrate.

According to the above configuration, since it is not necessary to form an insulating film covering the wiring patterns extending in the direction of arrangement of the contactors and an operation lever at the front end of the film substrate, the contactors at the front end area of the film substrate can be brought closer to the liquid crystal display panel and, at the same time, a large effective area of contact of the contactors can be secured.

In the above contact apparatus, preferably, at the front side in the front end area of the film substrate with respect to the substrate of the liquid crystal display panel, there is formed a conductive pattern located on a forward extension of the contactors arranged at the rear side in the front end area.

According to the above configuration, signals from the contactors at the rear side receiving a large electrical resistance from the contactors arranged at the front side of the front end area of the film substrate can be bypassed by the conductive pattern to be sent to the liquid crystal display panel, therefore the conditions of display of the three colors can be made substantially equal.

In the above contact apparatus, preferably, at a rear side in the front end area of the film substrate with respect to the substrate of the liquid crystal display panel, there is formed an auxiliary pattern located on a backward extension of the contactors arranged at the front side in the front end area.

According to the above configuration, the unevenness of arrangement of the contactors can be corrected by the auxiliary pattern, therefore where the film substrate and the front end area are brought into press-contact with the individual electrodes of the liquid crystal display panel, an almost equal pushing force can be generated over the entire surface thereof and a preciser inspection becomes possible.

In the above contact apparatus, preferably, a concave groove of a depth of an amount of at least the thickness of the insulating film is formed in a pushing surface of an elastic pad for pushing the contact film against the individual electrode side of the liquid crystal display panel corresponding to the area where the wiring patterns are covered by the insulating film.

According to the above configuration, the increase in thickness due to the insulating film can be absorbed by the concave groove, therefore the contactors of the contact film and the individual electrodes of the liquid crystal display panel can be brought into reliable contact with each other.

In the above contact apparatus, preferably, openings are formed behind the wiring patterns at the front end area of the film substrate.

According to the above configuration, by cutting away the film substrate behind the trunk line patterns, flexibility of the part of the trunk line patterns covered by the insulating film can be secured. Accordingly, when the contact film and the individual electrodes are brought into contact with each other, the insulation-covered trunk line patterns flexibly deform, therefore the contactors and the individual electrodes can be brought into reliable contact with each other.

In the above contact apparatus, preferably, a part of the film substrate between the contactors at the front side at the front end area and the contactors at the rear side is bent to the back surface side of the film substrate.

According to the above configuration, a distance between the contactors at the front side at the front end area of the film substrate and the contactors at the rear side can be shortened, therefore a larger effective area of contact of contactors can be secured at the front end area of the film substrate.

Further, in order to achieve the above first object, according to the present invention, there is provided a display panel contact apparatus which brings a contact film into contact with separate-color electrodes arranged successively in groups of three colors on the substrate of a color liquid crystal display panel and supplies signals for inspection of the display quality etc. for each of the colors, characterized in that the contact film is provided with a pliable film substrate, a plurality of separate-color contactors arranged on one surface of the film substrate in a one-to-one correspondence with the electrodes, and wiring patterns for connecting the separate-color contactors with separate-color signal input portions formed on the film substrate; the contactors for one color among the three colors are connected to each other via a wiring pattern, and the contactors for the other two colors are respectively independently formed separated from their respectively corresponding wiring patterns; an insulating film is formed on the film substrate so as to leave exposed the base end portions of the contactors for the two colors formed separated from the wiring patterns and a part of their wiring patterns; and the base end portions of the contactors for the two colors formed separated from the wiring patterns are respectively connected with the wiring patterns by conductive patterns formed on the insulating film.

According to the above configuration, a contact film wherein contactors for three colors and the signal input portions are connected separately for each of the colors on one surface of the film substrate can be easily obtained without requiring two-sided printing or formation of through holes of the film substrate and without requiring a plurality of film substrates, therefore a display panel contact apparatus capable of handling the increasingly narrower pitch of electrodes can be provided at a low cost. Further, the contactors for one color directly connected to a wiring pattern can be connected to the wiring pattern at the base ends thereof, therefore it becomes unnecessary to arrange the wiring pattern at the front ends of the contactors. Accordingly, the contactors for the respective colors on the contact film can be brought close to the base portions of the electrodes on the substrate of the liquid crystal display panel. As a result, the maximum area of contact between the contactors and electrodes can be secured and the reliability of contact is enhanced.

In the above contact apparatus, preferably, the base ends of the contactors for the two colors formed separated from the wiring patterns are arranged separate for each of the colors in a zig-zag manner along the directions of arrangement of the contactors, and the wiring patterns are located on the extensions of the directions of arrangement.

According to the above configuration, it is sufficient so far as the insulating film is formed into substantially a strip form along the zig-zag directions of arrangement of the base ends of the contactors for the two colors. Also, the conductive pattern for connecting the base ends of the contactors for the two colors with the wiring patterns for each of the colors can be formed linearly and in parallel, therefore the process of forming the insulating film and conductive patterns becomes simple and easy.

The above contact apparatus is preferably configured so as to bring the contact film into contact with the separate-color electrodes arranged successively in groups of three colors on the substrate of the color liquid crystal display panel and supply signals for inspection of the display quality etc. separately for each of the colors; the contact film is provided with a pliable film substrate, a plurality of separate-color contactors arranged on one surface of the film substrate in a one-to-one correspondence with the electrodes, and wiring patterns for connecting the separate-color contactors with separate-color signal input portions formed on the film substrate; the contactors for two colors among the three colors are connected to each other separately for each of the colors via the wiring patterns; the contactors for the other one color are respectively independently formed separated from the wiring pattern; an insulating film is formed on the film substrate so as to leave exposed the base ends of the contactors for the one color formed separated from the wiring pattern and a part of the wiring pattern; and the base ends of the contactors for the one color formed separated from the wiring pattern are connected with the wiring pattern by a conductive pattern formed on the insulating film.

According to the above configuration, a contact film wherein contactors for three colors and the signal input portions are connected separately for each of the colors on one surface of the film substrate can be easily obtained without requiring two-sided printing or formation of through holes of the film substrate and without requiring a plurality of film substrates, therefore a display panel contact apparatus capable of handling the increasingly narrower pitch of electrodes can be provided at a low cost. Further, the connection portions between the contactors and wiring patterns by conductive patterns can be reduced to the lowest limit.

In the above contact apparatus, preferably, the contactors of one color among the contactors for the two colors connected to each other separately for each of the colors via the wiring patterns are connected to the wiring pattern on the base ends thereof, while the other contactors are connected to the wiring pattern on the front ends thereof.

According to the above configuration, the wiring patterns directly connected to the contactors can be formed into simple patterns and shapes.

In the above contact apparatus, preferably, the base ends of the contactors for the one color formed separated from the wiring pattern are arranged in the form of a column along the direction of arrangement of the contactors, while the wiring pattern separated from the contactors for the one color is arranged along the direction of arrangement of the base ends of the contactors across the other wiring patterns.

According to the above configuration, it is sufficient so far as the insulating film is formed into substantially a strip form along the columnar direction of arrangement of the base ends of the contactors for the one color separated from the wiring pattern. Also, the conductive pattern for connecting the base ends of the contactors for the one color with the wiring pattern can be formed linearly. Therefore the process of forming the insulating film and conductive pattern becomes simple and easy. Further, it is not necessary to provide connection portions by the conductive pattern out-side of the area of arrangement of the contactors, so the influence of the contactors upon the arrangement pitch can be suppressed to the lowest limit.

Further, in order to achieve the above first object, according to the present invention, there is provided a display panel contact film wherein contactors are arranged on one surface of the contact film body enabling them to be individually connected with each of signal line terminals for pixel electrodes for three colors of a display panel; the front ends of the contactors corresponding to any one color among the three colors are connected with a wiring pattern linked with the signal input portion of the same color; the base ends of the contactors corresponding to any of the other colors are connected with a wiring pattern linked with the signal input portion of that color; connection lands long in the front-back direction are provided at the base ends of the contactors corresponding to other color between the two colors; a connection film bonded with the contact film body in the form of a laminate is provided with connection terminals at each of the portions corresponding to the front and rear ends of the connection lands; the front ends and the rear ends of these connection terminals are alternately connected and are connected to all of the connection lands in series to lay the wiring; and the two ends thereof are linked with the separately arranged signal input portion of the other one color between the two colors.

According to the above configuration, it is possible to inexpensively produce the contact film body having wiring patterns on one surface and the connection film, so a reduction of the manufacturing costs in comparison with a case where a two-sided substrate etc. is used becomes possible. Further, since the film can be constituted without requiring through holes and without causing short circuiting of the three signal wirings, it can be used for the signal line terminals for the pixel electrodes arranged at fine distances and it becomes possible to reduce the size of the contact apparatus using the contact film. Further, where the connection configuration of the signal wirings communicated with the wiring patterns formed on the connection film enable the connection of all contactors to be confirmed by performing a conduction test between a pair of separately provided signal input portions when performing a confirmation test on the state of connection to the contact film body. This enables the inspection process, which increases due to the bonding of two flexible substrates, to can be made extremely easy and reliable. Further, by inputting signals from the signal input portions divided to the left and right of the connection film, the signals supplied to the contactors are averaged, and thus a more accurate inspection of the display panel is realized.

In the above display panel contact film, preferably, an insulating film is formed as a laminate on the wiring pattern connected to the front ends of the contactors corresponding to any one color among the three colors formed on the contact film body. Further, the insulating film is formed as a laminate on the portions of the other wiring patterns except the connection terminals of the connection film and the signal input portions. Further, the contact film body and the connection film are hot-bonded using an anisotropic conductive film or solder plating.

According to the above configuration, a state of insulation between the wiring patterns for the three signals can be secured and, at the same time, mechanical connection and electrical connection between the contact film body and the connection film can be extremely easily realized, so the number of steps required for manufacture can be decreased and the price of the contact apparatus for inspection of display panels using the contact film can be lowered.

In the above display panel contact film, preferably, signal input portions provided at the two ends of the wiring pattern of the other color among the two colors are arranged on the connection film so as to adjoin each other around a single through hole in a state where mutual insulation is held.

According to the above configuration, when inspecting the state of electrical connection between the contact film body and the connection film, it is possible to perform a test of the conduction of electricity between two signal input portions separately held in insulated states. When the test is completed and the signal input portions are connected to the signal supply side provided on the other substrate, the two signal input portions are connected to each other simultaneously with the filling of a conductor such as solder into the through hole for connection, so connection can be completed by a single process.

In the above display panel contact film, preferably, three signal input portions selected from among the two ends and the middle of the wiring pattern of the other color between the two colors are arranged on the connection film adjoining each other around a single through hole separately held in insulated states.

According to the above configuration, when inspecting the state of electrical connection between the contact film body and the connection film, it is possible to test the conduction of signals between the left side signal input portion and the center signal input portion among the three signal input portions separately held in insulated states or between the center signal input portion and the right side signal input portion. When a connection defect occurs, since the area inspected has been finely divided, discovery of the defective portion becomes extremely easy. Further, when the test is completed and the signal input portions are connected to the signal supply side provided on the other substrate, the three signal input portions can be connected to each other simultaneously with the filling of a conductor such as solder into the through hole for connection, so connection can be completed by a single process. Further, an overall uniform signal strength can be secured by the left, right, and center signal input portions, so an extremely accurate inspection of the display panel can be realized.

In the above display panel contact film, preferably, the connection terminals provided on the connection film are made shapes that engage or mesh along the contours of the connection lands formed on the contact film body.

According to the above configuration, since the connection terminals and the connection lands engage or mesh, even if the connection configuration cannot be confirmed by the naked eye, the matching of the bonding position can be recognized, so accurate bonding can be reliably carried out.

Further, in order to achieve the above first object, according to the present invention, there is provided a display panel inspecting contact film formed, corresponding to three-color pixel electrode terminals of a display panel, on one surface of a pliable film having an insulating property, with a plurality of separate-color contactors able to be individually brought into contact with the pixel electrode terminals at the front end of the pliable film, separate-color signal input portions located at the other end of the pliable film, and separate-color signal lines for connecting the rear ends of the contactors and the signal input portions separately for each of the colors, characterized in that the signal lines connected to the contactors for one color and the signal input portion for the one color are extended separating the signal lines connected to the contactors for the other two colors;

the signal lines connected to the contactors for the other two colors are mutually connected separately for each of the colors by a conductive film formed on an insulating film formed on the pliable film so as to cover the signal lines while leaving open predetermined portions of the same, whereby the contactors for the other two colors are connected to the signal input portions for the other two colors separately for each of the colors via signal lines connected to the rear end thereof; and the contactors for the other two colors are connected to one of the signal input portions via coupling lines mutually coupling the front ends thereof, and the coupling lines are cut off after electrolytic plating is applied to at least the surface of the contactors and the signal lines.

According to the above configuration, the contactors for the three colors and the signal input portions for the three colors are respectively connected separately for each of the colors via signal lines on one surface of the pliable film, so it is possible to bring the contactors of the contact film into contact with the pixel electrode terminals of the color display panel and send signals separately for each of the colors, whereby it is possible to light up the color display panel separately for each of the colors to inspect for display defects, the display quality, etc. In addition, since electrolytic plating is performed in a state where all of the contactors for the three colors are conductive with one of the signal input portions, a high quality contact surface can be formed on the contactors. Further, the coupling lines of the contactors on the front end are cut off after formation of the electrolytic plating, so the front ends of the contactors for the three colors can be brought close to the bases of the pixel electrode terminals of the display panel with its relatively large resistance value for contact with the same. Accordingly, the maximum area of contact between the electrode terminals of the display panel and the contactors can be secured and, at the same time, the loss of the level of the signals input to the display panel can be suppressed to the lowest limit, so the precision and reliability of the inspection of the display quality of the display panel can be enhanced.

In the above contact film, preferably, the coupling lines are connected to the front ends of the contactors for one color, whereby the front ends of the contactors for the other two colors are coupled with the signal input portion for the one color via the contactors for the one color and the signal lines.

According to the above configuration, the layout of the signal lines and coupling lines with respect to the contactors can be simplified, therefore the process for forming the contactors, signal lines, and coupling lines can be simplified.

In the above contact film, preferably, at least the outermost side contactor located at one end in the direction of arrangement of the contactors is one of the contactors for the other two colors; the rear end of the outermost side contactor is connected to the signal input portion via a signal line without being separated by the signal line connecting the rear ends of the contactors for the one color and the signal input portion for the one color; and a coupling line is extended at a distance away from the front ends of the contactors for the one color to be connected to the front end of the outermost contactor.

According to the above configuration, since it is not necessary to extend a coupling line to the front ends of the contactors for the one color, the manufacturing cost of the display panel inspecting contact film can be reduced. Further, the number of positions where conductive portions are cut when cutting the coupling line of the front ends of the contactors for the one color by a cutter can be reduced, so the service life of the cutter can be increased.

In the above contact film, preferably, the conductive film is divided into at least two and extended in the form of strips on the insulating film along the direction of arrangement of the contactors.

According to the above configuration, the conductive film for connecting the signal lines separately for each of the colors can be formed as simple strips, so the manufacturing process of the display panel inspecting contact film can be simplified.

In the above contact film, preferably, electrolytic plating is performed on the surface of the signal lines and contactors exposed from the insulating film.

According to the above configuration, electrolytic plating is not performed on the surface of the signal lines covered by the insulating film, so the plating material can be saved.

In the above contact film, preferably, a cut off portion is formed at the middle of the signal lines connecting the contactors for the one color and the signal input portion for the one color; and the cut off portion of the signal lines is connected by the conductive film formed on the insulating film.

According to the above configuration, all of the signal lines connecting the contactors for the three colors and signal input portions for the three colors separately for each of the colors are connected conductively via the conductive film on the insulating film, therefore the resistance values between the contactors for the three colors and the signal input portions for the three colors can be easily made uniform and equal.

Further, in order to achieve the above second object, according to the present invention, there is provided a flexible printed circuit board wherein a plurality of conductive patterns are arranged on one surface of an insulating film, characterized in that the front ends of each two adjoining conductive patterns located inside the outermost left and right conductive patterns are mutually connected via a connection portion;

a plurality of by-pass patterns are formed on the insulating film separated a predetermined distance from the base ends of all of the conductive patterns; and each two adjoining by-pass patterns are mutually coupled via a connection portion.

According to the above configuration, by connecting the connection parts of other electronic components straddling the conductive patterns and the by-pass patterns, a circuit in which all conductive patterns are connected can be obtained, therefore the connection of all of the conductive patterns to the electronic components can be extremely easily inspected by just performing an inspection of the conduction between the conductive patterns on the left and right ends. Further, by cutting the front end of the flexible printed circuit board including the connection portions in the form of a strip and then cutting the base end of the flexible printed circuit board including the by-pass patterns in the form of a strip, the conductive patterns can be individually made independent, therefore the production efficiency of the connection configuration of the flexible printed circuit board and the electrical components or electronic components can be enhanced.

In the flexible printed circuit board, preferably, the front ends of the left and right conductive patterns at the outermost sides are extended further to the front end than the front end connection portions to form conduction inspecting terminals.

According to the above configuration, the inspection of conduction can be easily carried out by the conduction inspecting terminals extended from the left and right end conductive patterns.

In the above flexible printed circuit board, preferably, the conduction inspecting terminals are connected to one or two or more of the front end connection portions among a plurality of front end connection portions.

According to the above configuration, for example, when connecting the flexible printed circuit board to the electrical components or electronic components, the conduction of the circuit formed by connection of the outermost conductive patterns can be inspected while divided into a plurality of sections, therefore it becomes possible to easily determine conduction defects without that much of a reduction of the efficiency of inspection of the conduction.

Further, in order to achieve the above second object, according to the present invention, there is provided a method of using a flexible printed circuit board characterized by connecting terminals of the electrical components or electronic components between the conductive patterns and by-pass patterns of the flexible printed circuit board; performing the inspection of the conduction by the supply of power to the conductive patterns; then separating the front end of the flexible printed circuit board including the front end connection portions from the front end of the conductive patterns and, at the same time, separating the base end of the flexible printed circuit board including the by-pass connection portions from the by-pass patterns.

According to the above configuration, it becomes possible to efficiently perform the inspection of the conduction after connecting the flexible printed circuit board and the terminals of electrical components or electronic components.

Further, in order to achieve the above second object, according to the present invention, there is provided a method of using a flexible printed circuit board characterized by folding the flexible printed circuit board in the vicinity of the base ends of the conductive patterns, with the conductive patterns on the outside, and inserting this into clip terminals of the connectors;

electrically connecting the clip terminals of the connectors so that they straddle both of the conductive patterns of the flexible printed circuit board and the by-pass patterns facing them, then performing the inspection of conduction by the supply of power to the conductive patterns; then separating the front end of the flexible printed circuit board including the front end connection portions from the front ends of the conductive patterns and, at the same time, separating the base ends of the flexible printed circuit board including the by-pass connection portions from the by-pass patterns.

According to the above configuration, it is possible to efficiently perform the inspection of the conduction after the flexible printed circuit board and the clip terminals of the connectors are connected.

Further, in order to achieve the above second object, according to the present invention, there is provided an electrical connection apparatus comprised of a plurality of conductive patterns arranged on one surface of an insulating film of a flexible printed circuit board for individual connection with connection terminals of electronic components;

characterized in that each two adjoining front ends of conductive patterns located inside the left and right conductive patterns at the outermost sides of the flexible printed circuit board are mutually connected via connection portions, a plurality of by-pass patterns are formed facing them on the insulating film spaced a predetermined distance from the base ends of all of the conductive patterns;

each two adjoining by-pass patterns are mutually coupled via connection portions; and the connection terminals of the electronic components are connected straddling across both of the conductive patterns and by-pass patterns facing them.

According to the above configuration, it is possible to perform the inspection of conduction of the connection configuration between the flexible printed circuit board and the terminals of the electronic components efficiently in a short time.

In the above electrical connection apparatus, preferably, the electronic part is an IC tab formed by mounting an IC chip on the flexible printed circuit board; and the terminal of an electrical part is a conductive pattern formed on the reverse surface of the flexible printed circuit board.

According to the above configuration, it is possible to perform the inspection of conduction of an electrical connection apparatus comprised of IC tabs and a flexible printed circuit board connected with each other efficiently in a short time, therefore an electrical connection apparatus comprising a flexible printed circuit board and IC tabs without conductive defects can be efficiently provided.

In the above electrical connection apparatus, preferably, the front ends of each of the left and right outermost side conductive patterns are extended further to the front end than the front end connection portions to form conduction inspecting terminals.

According to the above configuration, the inspection of conduction of the electrical connection apparatus can be easily carried out by the conduction inspecting terminals extended from the left and right end conductive patterns.

In the above electrical connection apparatus, preferably, the conduction inspecting terminals are connected to any one, two, or more of the front end connection portions among a plurality of front end connection portions.

According to the above configuration, the inspection of conduction can be carried out while dividing the circuit in which the outermost conductive patterns are connected into a plurality of sections, therefore it becomes possible to easily find conductive defects without that much of a reduction of the efficiency of the conduction inspection.

Further, in order to achieve the above second object, according to the present invention, there is provided a method of using an electrical connection apparatus characterized by, after carrying out an inspection of conduction by the supply of power to the conductive patterns, separating the front end of the flexible printed circuit board including the front end connection portions from the front ends of the conductive pattern ands, at the same time, separating the base end of the flexible printed circuit board including the by-pass connection portions from the by-pass patterns.

According to the above configuration, the inspection of the conduction after connecting the flexible printed circuit board and the terminals of the electronic components can be efficiently carried out.

Below, an explanation will be made of preferred embodiments of the present invention referring to the drawings.

DESCRIPTION OF THE PREFERRED EMBODIMENTS

At first, an explanation will be made of a first embodiment of the present invention by referring to FIG. 1 to FIG. 3.

Figure 1:
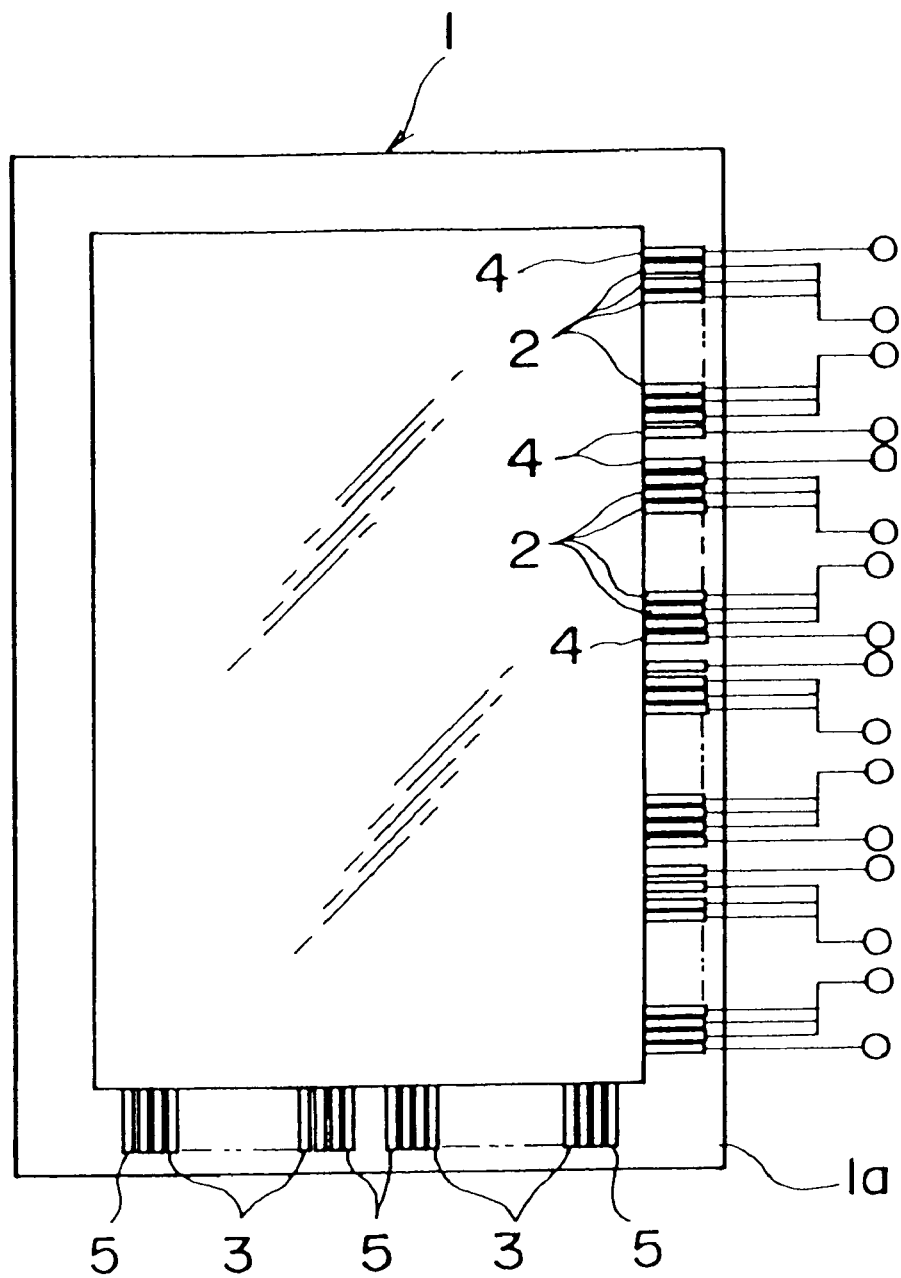
FIG. 1 is a plan view of a liquid crystal display panel.

FIG. 1 is a schematic plan view of a liquid crystal display panel; FIG. 2 is a plan view of a wiring pattern of the contact film; and FIG. 3 is a sectional view of a principal part of the contact apparatus.

A plurality of individual electrodes 2 of the liquid crystal display panel 1 shown in FIG. 1 are arranged on a substrate 1a of the liquid crystal display panel 1 divided into a plurality (four in the illustrated example) of blocks. Common electrodes 4 are arranged in the vicinity of the two ends of the area of array of the electrodes 2 of each block. A contact apparatus 10 simultaneously supplies signals for inspection of the display quality etc. to all of the electrodes 2.

Figure 2:
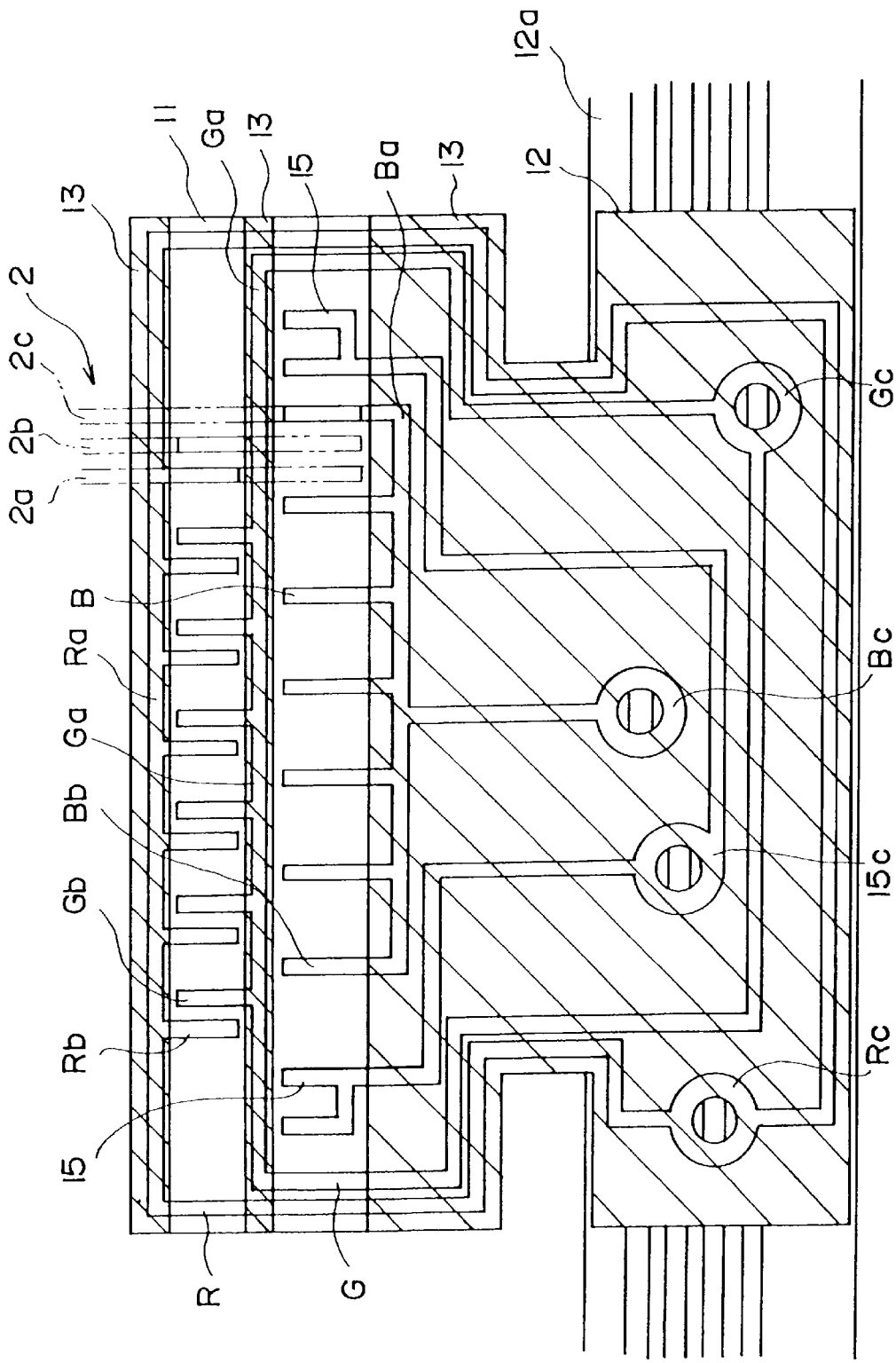
FIG. 2 is a plan view of the wiring of a contact film.

Accordingly, as shown in FIG. 2, the contact film 11 on the source side in this embodiment is comprised of a polyamide or other film substrate 12 having pliability and an insulating property on which is formed a plurality of individual electrode wiring patterns for contact with the plurality of individual electrodes 2 in the blocks of the liquid crystal display panel 1. The three color contactors Rb, Gb, and Bb mentioned later are formed at the front end area of the contact film 11 for contact with the individual electrodes 2.

The plurality of individual electrode wiring patterns include a red wiring pattern R extending around the outermost side of the end portion of the film substrate 12 close to the liquid crystal display panel 1. A green wiring pattern G is formed extending around the inside of this red pattern R. Further, a blue wiring pattern B is arranged inside the green pattern G. The trunk line parts Ra, Ga, and Ba of the wiring patterns R, G, and B running along the edge of the front end of the contact film 11 are arranged in parallel to each other. The contactors Rb, Gb, and Bb extending branched from the trunk line parts Ra, Ga, and Ba at substantially right angle are arranged alternately with each other. The red contactors Rb extend backward from the red trunk line pattern Ra located at the front end, while the green contactors Gb extend forward from the green trunk line pattern Ga. The red contactors Rb and the green contactors Gb are arranged so as to adjoin each other. The blue contactors Bb extending forward from the blue trunk line pattern Ba are arranged at the back of the two color contactors Rb and Gb to the side. Seven sets of the three color contactors Rb, Gb, and Bb are formed in FIG. 2. The array of these three color contactors Rb, Gb, and Bb is treated as one unit. Note that the pitch between the contactors Rb, Gb, and Bb is preferably set to about 50 to 60 μm. Further, it is desirable from the viewpoints of durability against rust etc. that the wiring patterns R, G, and B be formed by copper-plating the flexible substrate, then etching and then nonelectrolytically plating with gold or nickel. Alternatively, the wiring patterns R, G, and B may be formed by electrolytic plating gold or nickel on copper which has been plated on the entire surface of the substrate in a superimposed manner, then etching. The method of production is not particularly limited.

The three color contactors Rb, Gb, and Bb arranged in this way are arranged so as to respectively contact the corresponding red, green, and blue electrodes 2a, 2b, and 2c of the individual electrodes 2 extended from the side of the liquid crystal display panel 1 and indicated by the two-dot chain lines in FIG. 2.

The contactors Rb, Gb, and Bb are extended from the trunk line portions Ra, Ga, and Ba of the wiring patterns to form a comb-like shape. The front two contactors Rb and Bb are arranged adjoining each other so as to engage with each other. The distances separating each of the three color contactors Rb, Gb, and Bb in the left and right direction are set to be the same. The contactors are constituted so as to contact either the front or rear sides of the individual electrodes 2a, 2b, and 2c without fail.

Note that common electrode contactors 15 branched to the left and right are arranged between the green wiring pattern G and the blue wiring pattern B and are arranged so as to adjoin the blue contactors Bb at the left and right outsides.

Each left and right wiring ends of the wiring patterns R, G, and B and the common electrode contactors 15 extend backward and form closed circuits from each other and, at the same time, are provided with through holes Rc, Gc, Bc, and 15c arranged different from each other in front-rear positions. Further, they are joined with another source side wiring substrate 12a bonded with the film substrate 12.

Further, an insulating film 13 is formed in strips parallel to the wiring patterns R, G, and B covering the respective trunk line pattern portions Ra, Ga, and Ba from the left to right. The insulating film 13 is for example made of a polyimide family photoresist and preferably has a thickness dimension of about 0.02 mm. Note that it may be of the acrylic, rubber, epoxy, or other family as well. The insulating film 13 covers the red trunk line pattern Ra at the front most end of the contact film 11 and the green trunk line pattern Ga at an intermediate portion. Further, the insulating film is formed covering the entire range including the rear most blue trunk line pattern Ba and the base portions and through hole Rc, Gc, Bc and 15c portions of all of the wiring patterns.

Figure 3:
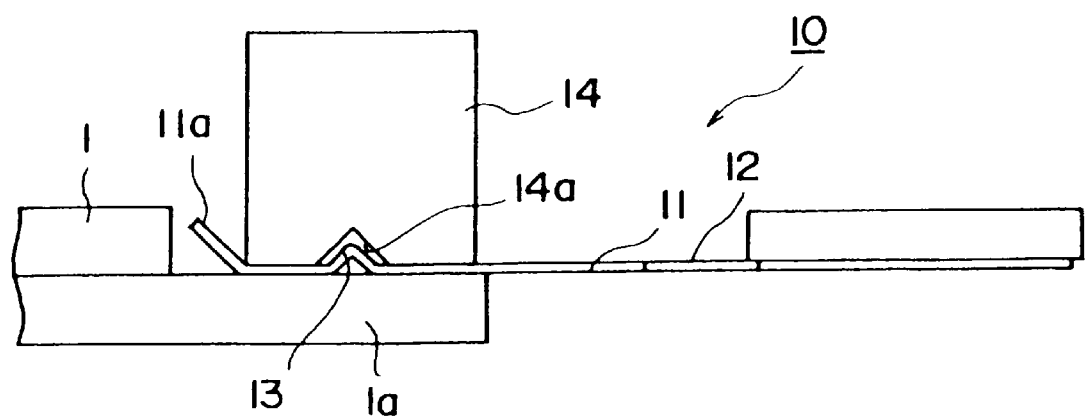
FIG. 3 is a schematic side view of a contact apparatus using the contact film of FIG. 2.

The contact film 11 constituted as described above is designed to be pushed against the individual electrode 2 side of the liquid crystal display panel 1 for connection with the same by an elastic pad 14 made of for example a synthetic rubber as shown in the side view of the principal parts of the contact apparatus of FIG. 3 so as to perform the inspection. The contactors Rb, Gb, and Bb can be made to further approach the liquid crystal display panel 1 by bending the edge portion of the contact film 11 exposed from the elastic pad 14 to the liquid crystal display panel 1 side to form a rising edge 11a. This enables a good conductivity to be held and an accurate inspection to be realized.

Further, by forming a concave groove 14a recessed over the left-right direction in the part of the elastic pad 14 corresponding to the center insulating film 13, it is possible to prevent strong pushing at only part of the insulating film 13, to prevent abnormal deformation of the rubber, and even out the distribution of the pushing force so as thereby to prevent occurrence of an uneven pushing force.

Note that the arrangements of the wiring patterns R, G, and B and the red, green, and blue contactors Rb, Gb, and Bb are not limitative. They can be mutually changed in accordance with the arrangement of the individual electrodes 2 of the liquid crystal display panel 1. Further, the above contactors Rb, Gb, and Bb are continuously arranged in units of front, front, and rear arrays, but it is also possible to change the arrangement to any of a front, rear, and rear, a rear, front, and front, a rear, rear, and front, or other array.

Note that, the contact film is preferably the flexible printed circuit board, but even an insulating substrate poor in flexibility can be used if it can be uniformly connected with the individual electrodes 2.

Figure 4:
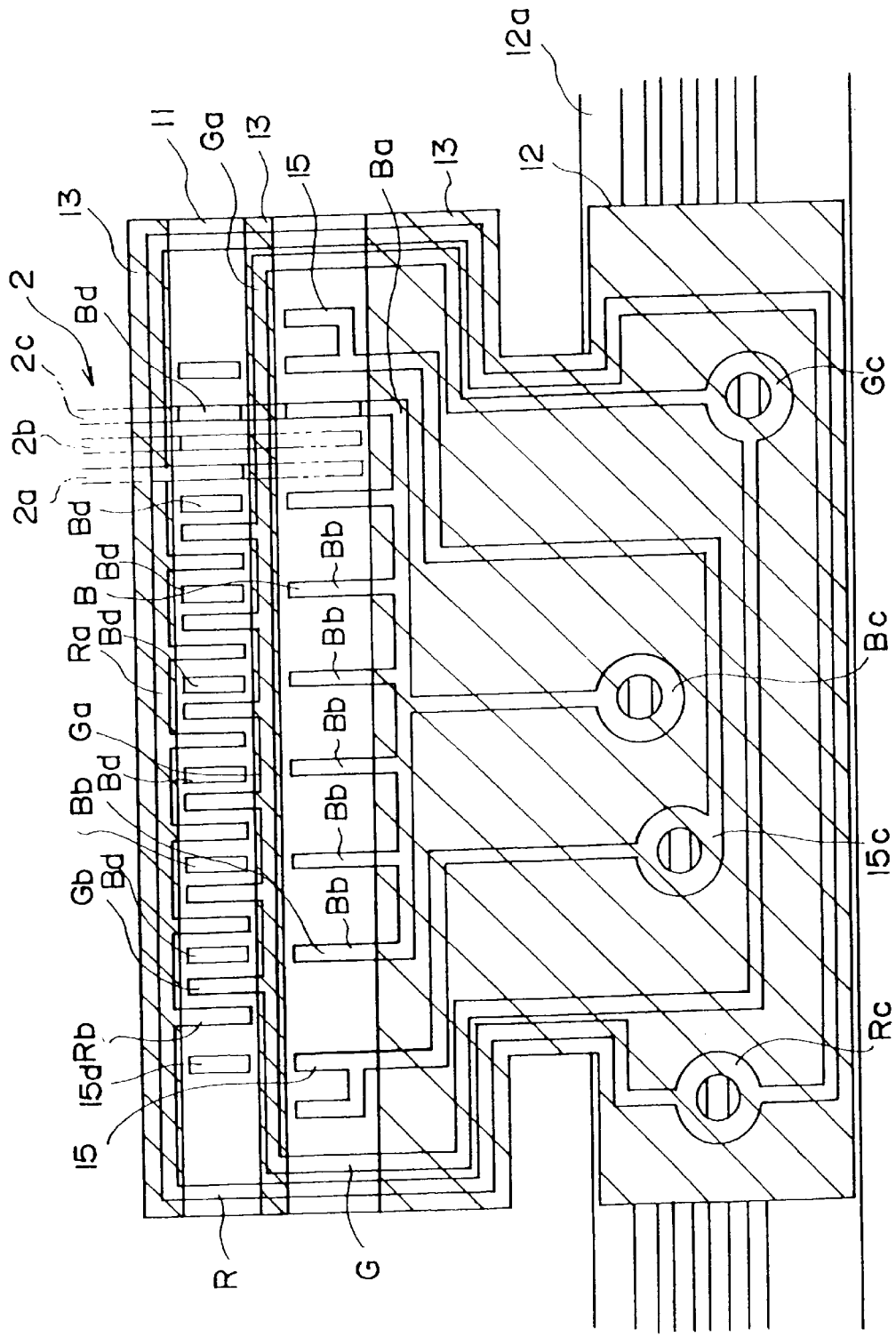
FIG. 4 is a plan view of the wiring of the contact film according to a second embodiment.

Next, a second embodiment of the present invention will be explained by referring to FIG. 4. Note that almost all of the basic configuration of the contact film 11 shown in FIG. 4 is the same as that of the contact film 11 in the first embodiment explained referring to FIG. 2, therefore the same references are given to the same structural parts and explanations thereof will be omitted. New references will be given to and explanations made of only the different parts.

In the figure, at the front end of the blue contactors Bb located at the rear most position of the contact film 11, there is formed a bypass conductive pattern Bd arranged in a configuration and position similar to the red contactors Rb and green contactors Gb. The conductive pattern Bd is formed independent from all other wiring patterns and formed by a conductive pattern having a lower electrical resistance than that of the individual electrodes 2 of the liquid crystal display panel 1. When the individual electrodes 2c on the liquid crystal display panel 1 side indicated by the two-dot chain lines in FIG. 4 are contacted and voltage is received from the blue contactors Bb, the current flowing through the individual electrodes 2c flow through the conductive pattern Bd in the range where the conductive pattern Bd is provided, whereby it becomes possible to set the conditions of the electrical resistance of the blue contactors Bb arranged away from the other two red and green contactors Rb and Gb to be substantially equivalent with them.

Further, this embodiment is constituted with a similar conductive pattern 15d arranged also at the front end of the above common electrode contactors 15 whereby a similar bypass effect is exhibited.

Note that the contactors Rb, Gb, and Bb are arranged in accordance with the arrangement of the individual electrodes 2 of the liquid crystal display panel 1. The arrangement can be set according to need. That is, in FIG. 4, the contactors are continuously arranged in the order of red, green, and blue from the left and are arranged with red and green at the front end and blue at a rear portion, but the arrangement is not limited to this. For example, also, they may also be continuously arranged in the order of green, blue, and red from the left and arranged with green and blue at the front end and red in the rear portion. In this case, of course, the conductive pattern is provided corresponding to the contactors located at the rear side.

Next, a third embodiment of the present invention will be explained by referring to FIG. 5 to FIG. 7.

Figure 5:
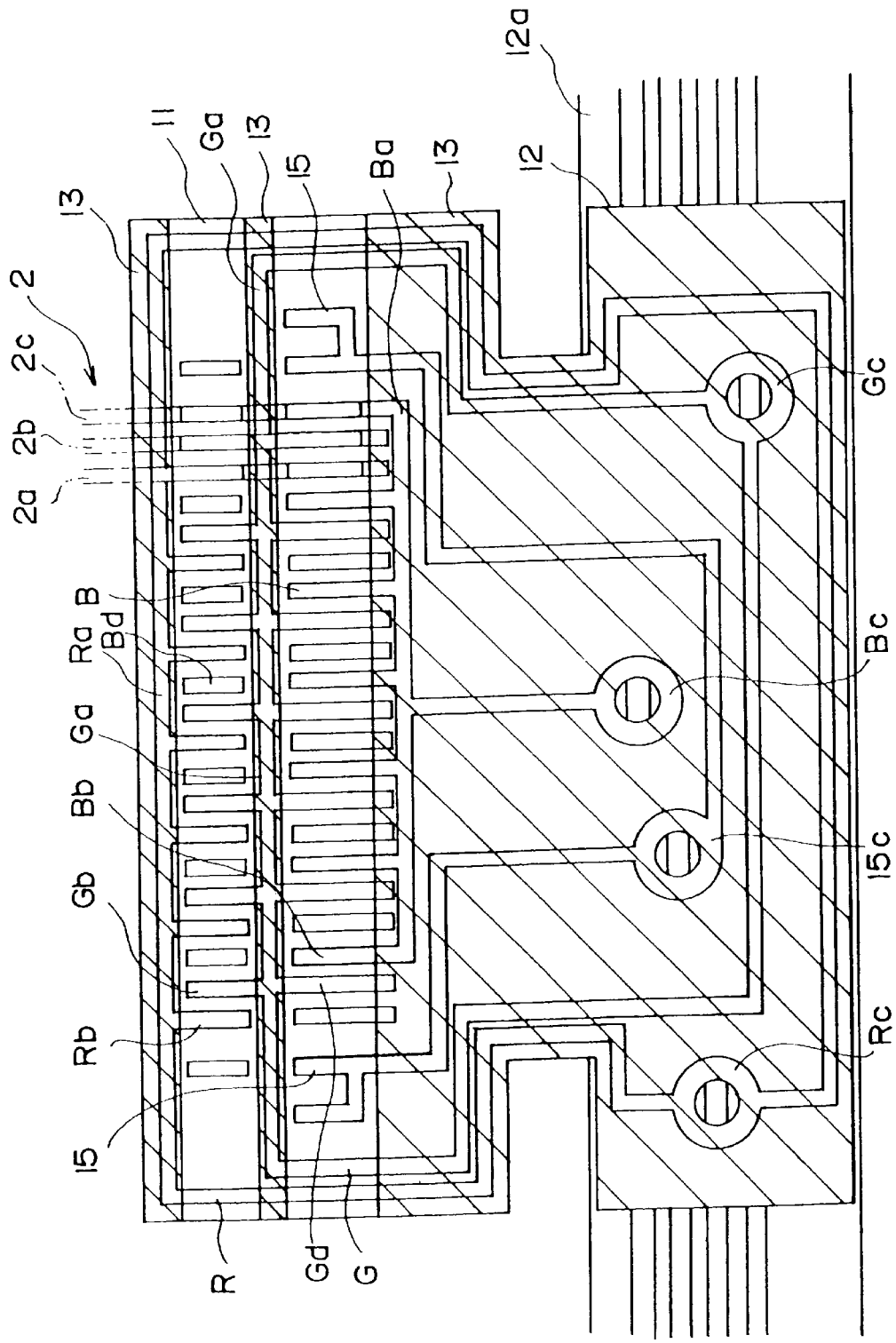
FIG. 5 is a plan view of the wiring of the contact film according to a third embodiment.

FIG. 5 is a plan view of the wiring patterns of the contact film; FIG. 6 is a sectional view of an A—A cross-section of the contact apparatus in FIG. 5; and FIG. 7 is a sectional view of another example of the A—A cross-section of the contact apparatus of FIG. 5. Note that the basic configuration of the third embodiment is similar to those of the above two embodiments, therefore new references will be given to and explanations made of the different parts and explanations concerning the same parts will be omitted. An auxiliary pattern Rd independent from all of the other wiring patterns is formed to the rear of the red contactors Rb shown in the figure across the green trunk line pattern Ga.

Further, an auxiliary pattern Gd is formed at corresponding positions of the green trunk line pattern Ga to the rear of the green contactors Gb.

By respectively forming the conductive pattern Bd and auxiliary patterns Rd and Gd on opposite sides of the contactors Rb, Gb, and Bb across the green trunk line pattern Ga in this way, a height difference (change of thickness) due to the presence of the wiring patterns is eliminated, a difference of pushing force when pushed in contact with the individual electrodes 2 of the liquid crystal display panel 1 is reduced, and the contact conditions can be made substantially equal over the entire surface.

Figure 6:
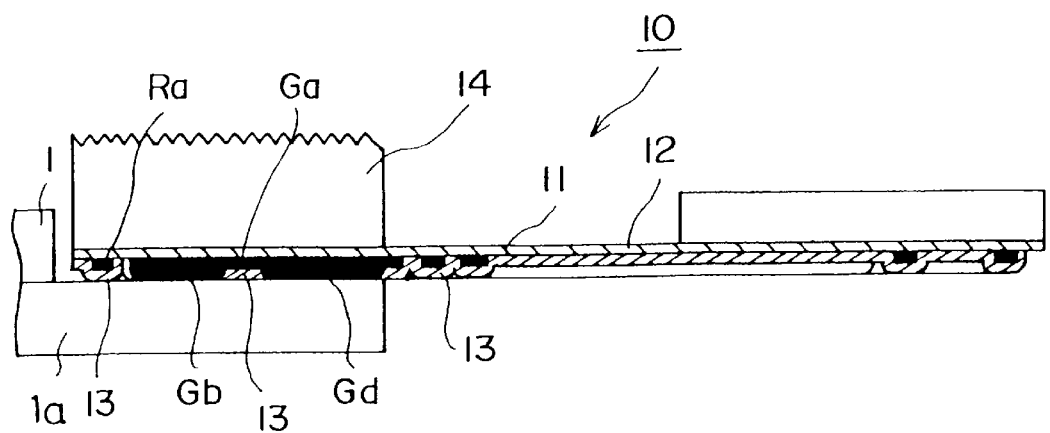
FIG. 6 is a side sectional view of part A—A of FIG. 5.

As shown in FIG. 6, each contactor (Gb in the figure) is formed so as to form substantially the same contact surface according to the thickness of the insulating film 13 so as to give a more reliable contact.

Figure 7:
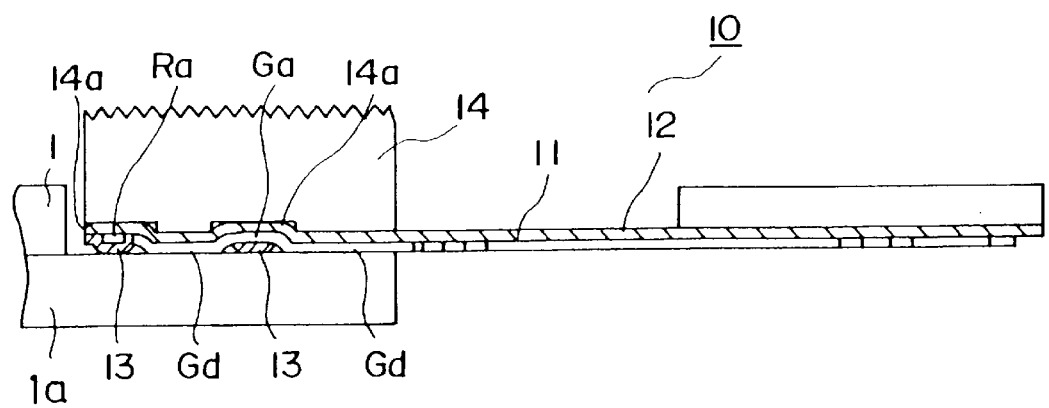
FIG. 7 is a side sectional view of another example of part A—A of FIG. 5.

Further, as shown in FIG. 7, by changing the structure so as to form a recessed portion 14a extending to the left and right in the elastic pad 14 corresponding to the thickness of the insulating film 13 applied to the contact film 11, it is deformed so that the amount of thickness of the insulating film 13 is absorbed at the elastic pad 14 side, therefore substantially the entire surface of the contactors Rb, Gb, and Bb can be brought into contact with the individual electrodes 2 and it is also possible to make more reliable inspection possible. The part of the contact film 11 covered with the insulating film 13 is formed so as to be bent and deformed by pressing by the elastic pad 14, but it is also possible to fold it back in advance.

Note that the wiring patterns are not limited to the above colors. It is possible to change the corresponding colors in the same way as in the embodiments mentioned above.

Next, a fourth embodiment of the present invention will be explained by referring to FIG. 8 to FIG. 9.

Figure 8:
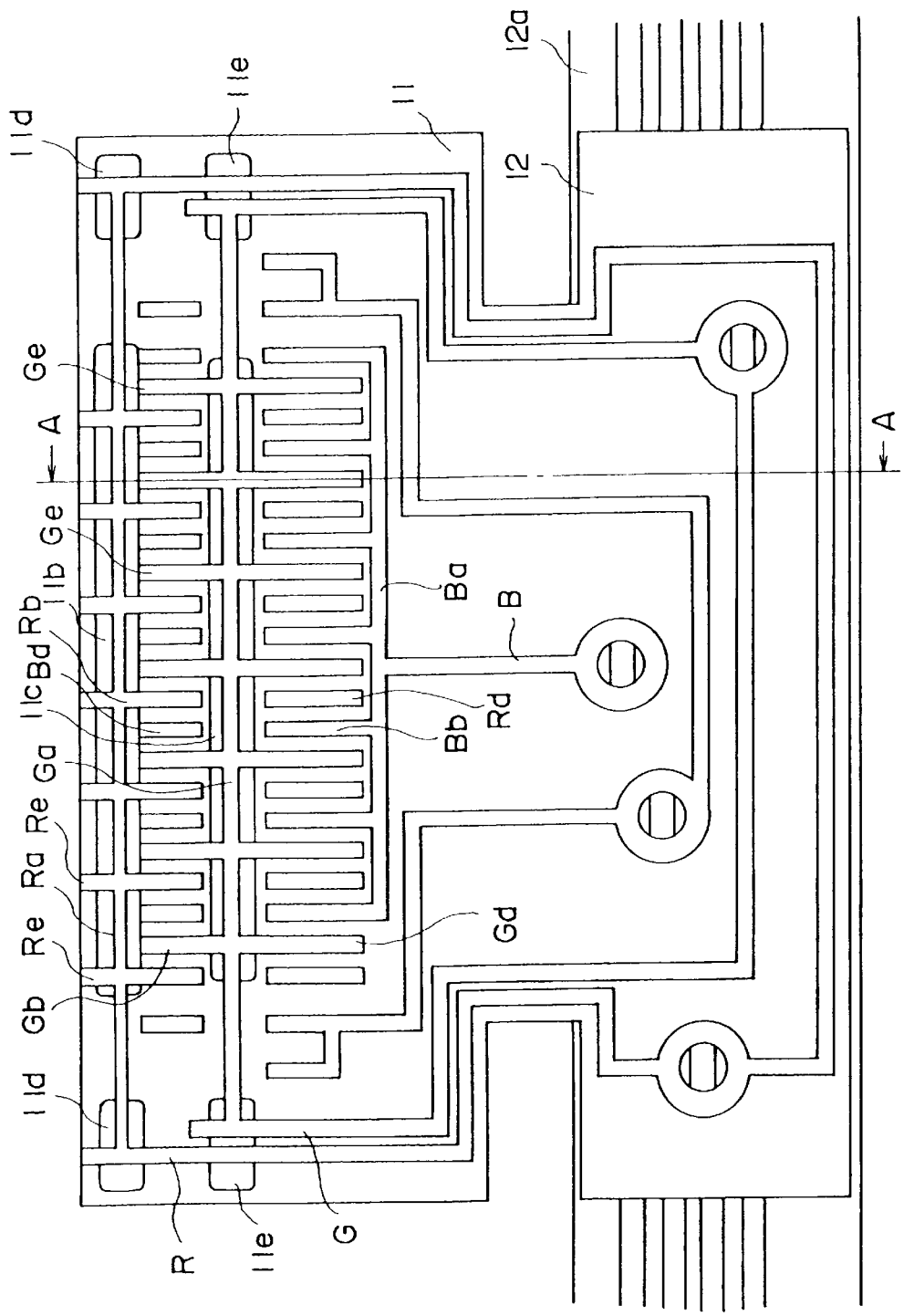
FIG. 8 is a plan view of the wiring of the contact film according to a fourth embodiment.
Figure 9:
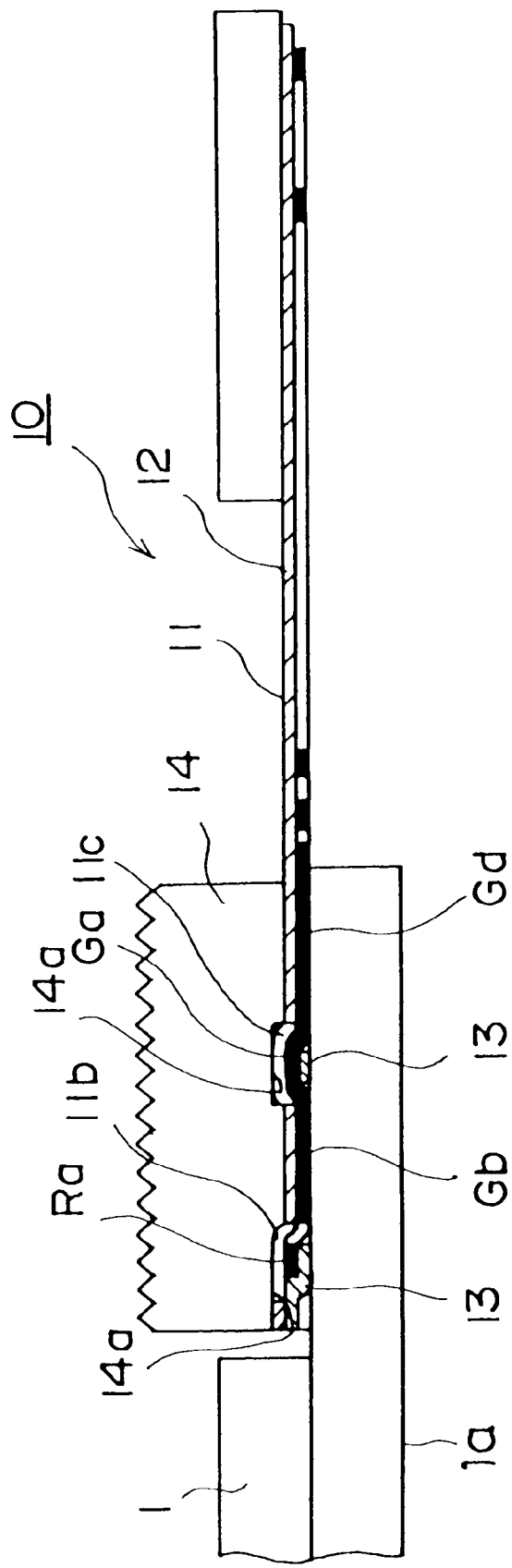
FIG. 9 is a side sectional view of a part A—A of FIG. 8.

FIG. 8 is a plan view of the wiring patterns of the contact film; and FIG. 9 is a side sectional view of the part A—A of FIG. 8. Note that the basic configuration of the fourth embodiment is similar to those of the above embodiments, therefore new references will be given to and explanations made of only the different parts.

Rectangular-shaped openings 11b and 11c are respectively made in the film substrate 12 at the reverse sides of the red trunk line pattern Ra and the green trunk line pattern Ga of the contact film 11 shown in the figure. Further, reinforcing patterns Re and Ge extending so as to form cross shapes and held by bonding to the contact film 11 are respectively provided at the contactors Rb and Gb branched from the red trunk line pattern Ra and the green trunk line pattern Ga corresponding to the openings 11b and 11c. The reinforcing pattern Ge is connected to the green trunk line pattern Ga, therefore it can also perform the role of the contactors Gb.

Further, openings 11d and 11e are respectively made in the film substrate 12 at the back of the left and right bent portions of the red trunk line pattern Ra and the green trunk line pattern Ga and reinforcing patterns Re and Ge are provided.

The insulating film 13 shown in FIG. 9 is provided on the contact film 11 constituted in this way in the same way as the embodiments mentioned above. The openings 11b and 11c and openings 11d and 11e are made at positions corresponding to this insulating film 13. Further, recessed portions 14a cut extending from the left to right are formed at positions corresponding to the insulating film 13 in the pushing surface of the elastic pad 14 pushing the contact film 11 against the individual electrodes 2 of the liquid crystal display panel 1.

When the contact film 11 constituted as described above is pushed by the elastic pad 14, as shown in FIG. 9, since the rigidity of the parts of the openings 11b and 11c and openings 11d and 11e corresponding to the insulating film 13 is low, the contact film 11 sinks inside the recessed portion 14a of the elastic pad 14 and the contactors Rb, Gb, and Bb can be pushed with a more uniform pressure.

Figure 10:
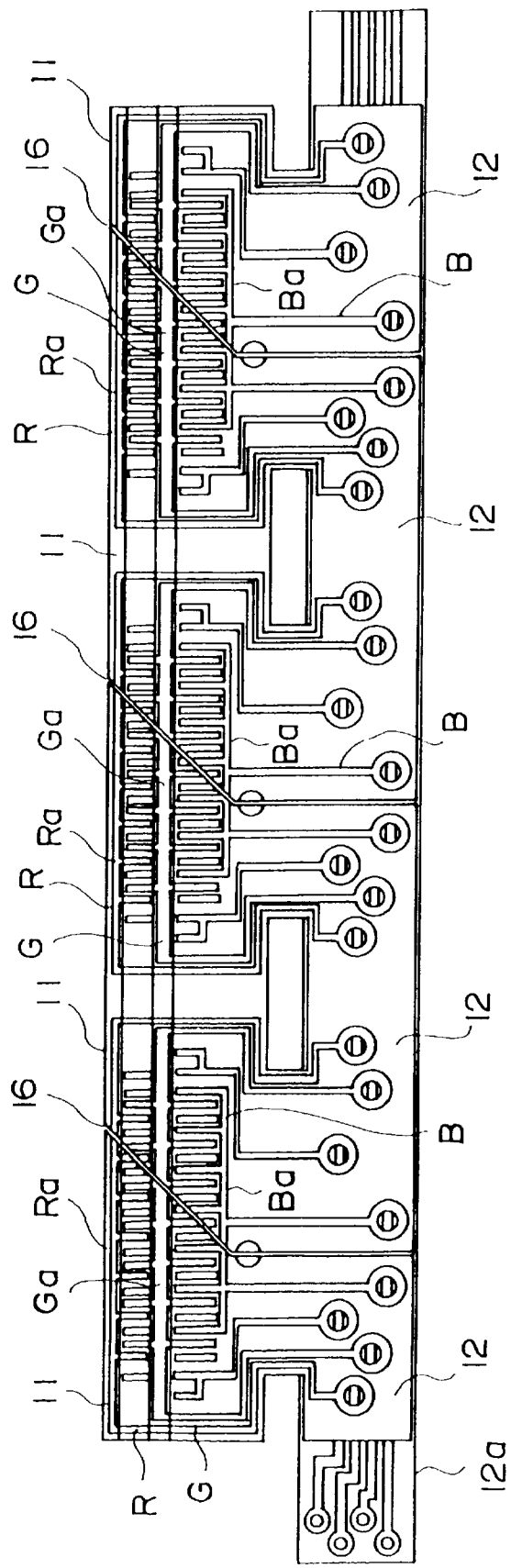
FIG. 10 is a plan view of a divided structure of the contact film.

Note that a plurality of contact films 11 explained above are continuously formed in the left and right direction as shown in FIG. 10. Each unit substrate can be completed by obliquely cutting the trunk line pattern parts Ra, Ga, and Ba and contactors Rb, Gb, and Bb at separation boundaries 16 and combining the same. According to this obliquely cut structure, changes in the dimensions of the contact film 11, which expands and contracts along with changes in the temperature or other parts of its environment, are dispersed and absorbed well by finely dividing the film, so it is possible to prevent concentration of the amount of deformation and to secure precision in correspondence to the individual electrodes 2.

Next, a fifth embodiment of the present invention will be explained by referring to FIGS. 11A to 11C.

Figure 11:
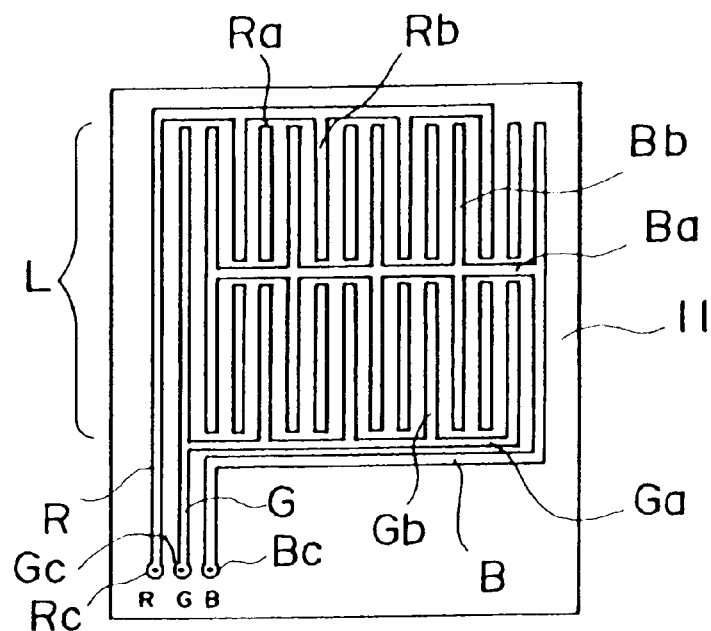
FIGS. 11A, 11B, and 11C are explanatory views of the manufacturing process and structure of the contact film according to a fifth embodiment.
Figure 11:
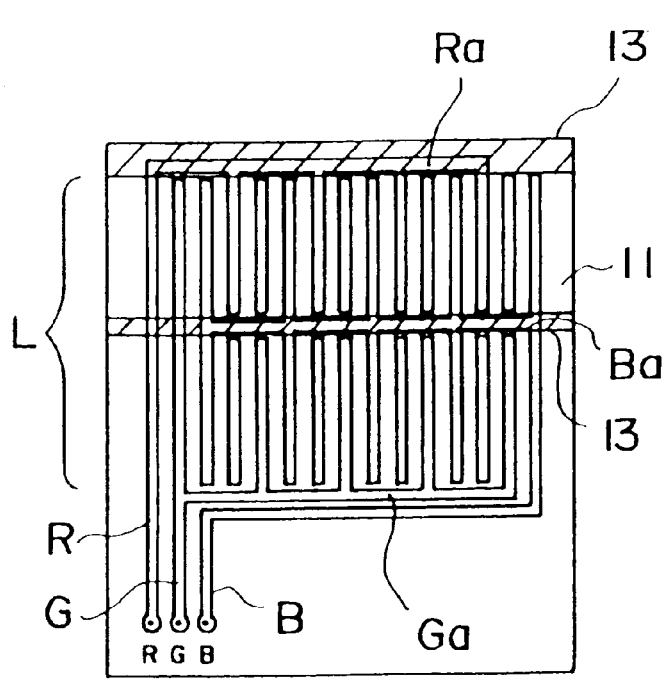
Figure 11:
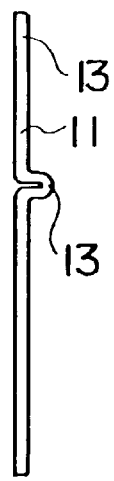

FIG. 11A is a plan view of a contact film applied with the wiring patterns; FIG. 11B is a plan view of a contact film applied with an insulating film; and FIG. 11C is a side view of the contact film.

The contact film 11 shown in these figures has three through holes Rc, Gc, and Bc arranged left to right at the left side base portion. The wiring patterns R, G, and B extending from these through holes Rc, Gc, and Bc toward the front end are arranged in the form of combs parallel to the front end edge portion and are located so as to alternately intermesh with a high density.

Of wiring patterns R, G, and B, the wiring pattern R for the red display is extended straight from the through hole Rc at left end to the front end of the contact film 11 and then is bent to the right side at the edge of the front end, where by a trunk line pattern Ra extending toward the right side is formed. A plurality of contactors Rb directed toward the rear side of the contact film 11 are extended in parallel from the middle portion and front end portion of the trunk line pattern Ra.

Further, the green wiring pattern G is extended straight from the through hole Gc located at the center among the three through holes to the front end whereby a contactor Gb is formed at the front end thereof. Further, a trunk line pattern Ga extending branched from the middle portion toward the right is formed. A plurality of contactors Gb directed toward the front end of the contact film 11 are formed parallel from the middle portion and the front end portion of the trunk line pattern Ga.

Further, the blue wiring pattern B extending forward from the through hole Bc located at the right side among three through holes is similarly bent to the right slightly back from the portion of the green wiring pattern G branched to the right, extended, then bent forward at the right most side and extended to form a contactor Bb. Further, a blue trunk line pattern Ba is extended in the left and right direction between the contactors Rb located at the front portion and the contactors Gb located at the rear portion. The front end thereof is arranged at a position adjoining the contactor Gb extended straight from the through hole Gc. At the front end portion and the middle portion, it extends so as to extend in the forward and rear directions of the contact film 11 and intermesh with the front and rear contactors Rb and Gb. All the contactors Rb, Gb, and Bb are arranged so as to become uniform in distance in the left and right direction.

Further, as shown in FIG. 11B, an insulating film 13 is applied to the trunk line patterns Ra and Ba so as to complete the inspection circuit—although a single surface printed board. Further, as shown in FIG. 11C, by bending and folding the center portion of the insulating film 13 to the back surface side, the contactors Rb, Gb, and Bb separated to the front and back are made closer, whereby a larger contact area can be secured.

By the configuration as mentioned above, it becomes possible to use as contactors the middle portions of the wiring of the different color wiring patterns R, G, and B where the contactors Rb, Gb, and Bb originally could not be formed, so utilization of wiring with a high space efficiency becomes possible.

Note that, in FIG. 11A and FIG. 11B, the range indicated by L is a range of contact with the individual electrodes of the liquid crystal display panel.

Next, a sixth embodiment of the present invention will be explained by referring to FIGS. 12A to 12C.

Figure 12:
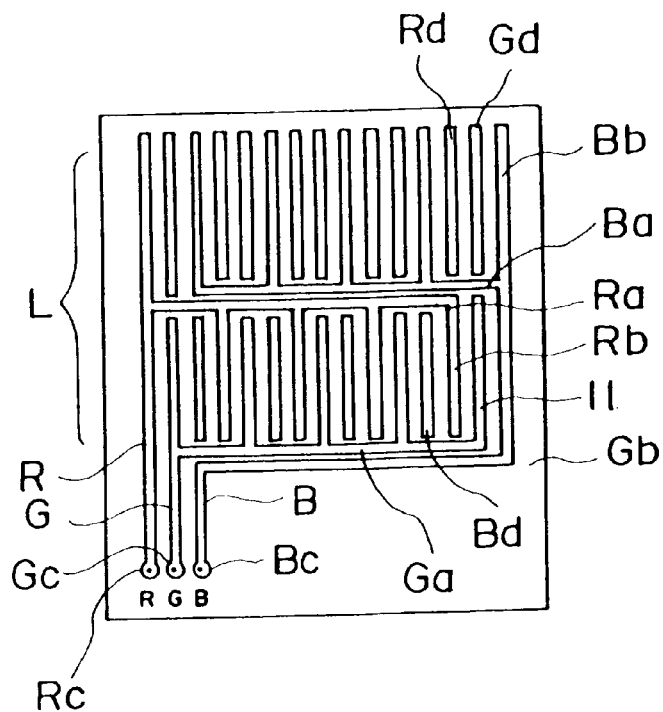
FIGS. 12A, 12B, and 12C are explanatory views of the manufacturing process and structure of the contact film according to a sixth embodiment.
Figure 12:
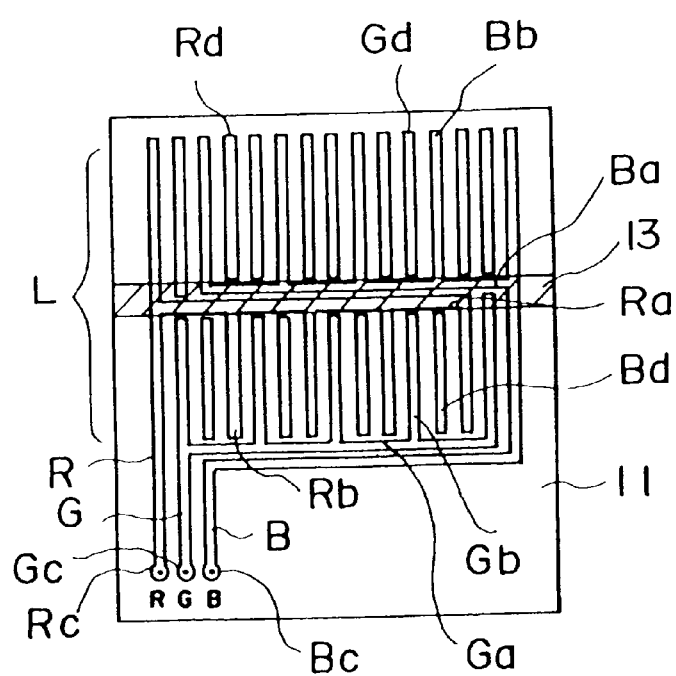
Figure 12:
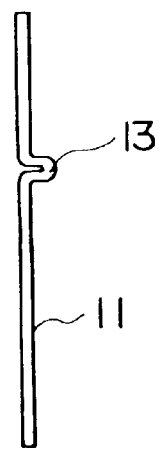

FIG. 12A is a plan view of a contact film applied with wiring patterns; FIG. 12B is a plan view of the contact film applied with an insulating film; and FIG. 12C is a side view of the contact film.

In the contact film 11 shown in the figure, three through holes Rc, Gc and Bc are arranged from the left to right at the left base portion. The wiring patterns R, G, and B extending from these through holes Rc, Gc, and Bc toward the front end are arranged in the form of a comb parallel to the front end edge portion and are arranged densely by alternately meshing with each other.

Of the wiring patterns R, G, and B, the wiring pattern R for the red display is extended straight from the through hole Rc on the left end to the front end of the contact film 11 and is bent to the right from the middle portion and extended to form the trunk line pattern Ra. A plurality of contactors Rb directed toward the rear of the contact film 11 are extended in parallel from the middle and front end of the trunk line pattern Ra.

Further, the green wiring pattern G is extended straight from the through hole Gc located at the center among the three through holes to the front end. A contactor Gb is formed at the front end thereof. A trunk line pattern Ga branched and extended from the middle portion toward the right is formed. A plurality of contactors Gb directed toward the front end of the contact film 11 are formed in parallel from the middle portion and the front end portion of the trunk line pattern Ga.

Further, the blue wiring pattern B extending forward from the through hole Bc located at the right side among the three through holes is similarly bent to the right slightly back from the portion of the green wiring pattern G branched to the right, extended, then bent forward at the right most side and extended to form the contactor Bb. Further a blue trunk line pattern Ba is extended from the right to left side at the front of the contactors Rb and Gb located at the rear portion. The blue trunk line pattern Ba is arranged adjoining the front side of the red trunk line pattern Ra. A plurality of contactors Bb directed toward the front end of the contact film 11 are branched and extended in parallel from the front end and middle portions.

Further, the red contactors Rb and the green contactors Gb arranged at the rear portion of the contact film 11 are provided with corresponding conductive patterns Rd and Gd at the front side across the green trunk line pattern Ga. The conductive patterns Rd and Gd are conductive patterns independent from the contactors Rb and Gb and are constituted so as to give a by-pass effect with a high electrical conductivity in the area of arrangement when connected with the individual electrodes of the not illustrated liquid crystal display panel.

Further, an auxiliary pattern Bd is formed at the rear side of the red trunk line pattern Ra corresponding to the blue contactors Bb. The auxiliary pattern Bd is also formed independently without connection to any other conductive patterns in the same way as the conductive patterns Rd and Gd and is constituted so as to adjoin the other adjoining contactors Rb and Gb and secure overall uniform pushing force conditions where connected with the individual electrodes of the not illustrated liquid crystal display panel.

Further, as shown in FIG. 12B, an insulating film 13 is applied to the trunk line patterns Ra and Ba to complete the inspection circuit—though a one-surface printed circuit board. Further, as shown in FIG. 12C, by folding the insulating film 13 at the center, the contactors Rb, Gb, and Bb divided at the front and rear are brought closer to secure a larger area of contact.

By the above configuration, in the same way as the fifth embodiment, it becomes possible to utilize as the contactors the middle portions of the wiring patterns R, G, and B of the respective colors which originally could not be used to form the contactors Rb, Gb and Bb, so utilization with a high space efficiency becomes possible. Further, the trunk line patterns at the front end of the contact film 11 can be eliminated, so an arrangement of the contactors closer to the liquid crystal display panel side becomes possible.

Note that, in FIG. 12A and FIG. 12B, the range indicated by L is a range of contact with respect to the individual electrodes of the liquid crystal display panel.

Next, an explanation will be made of a seventh embodiment of the present invention by referring to FIG. 13 to FIG. 16.

Figure 13:
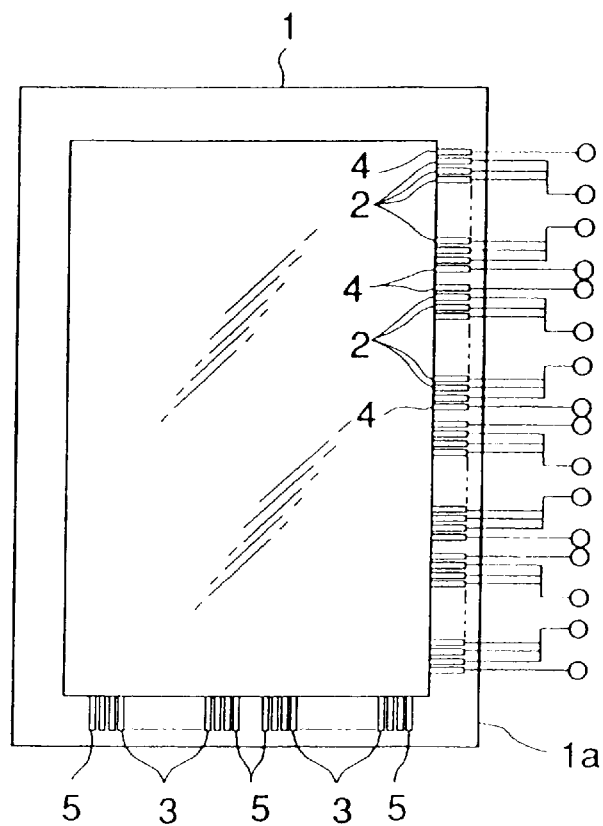
FIG. 13 is a plan view of the color liquid crystal display panel.
Figure 14:
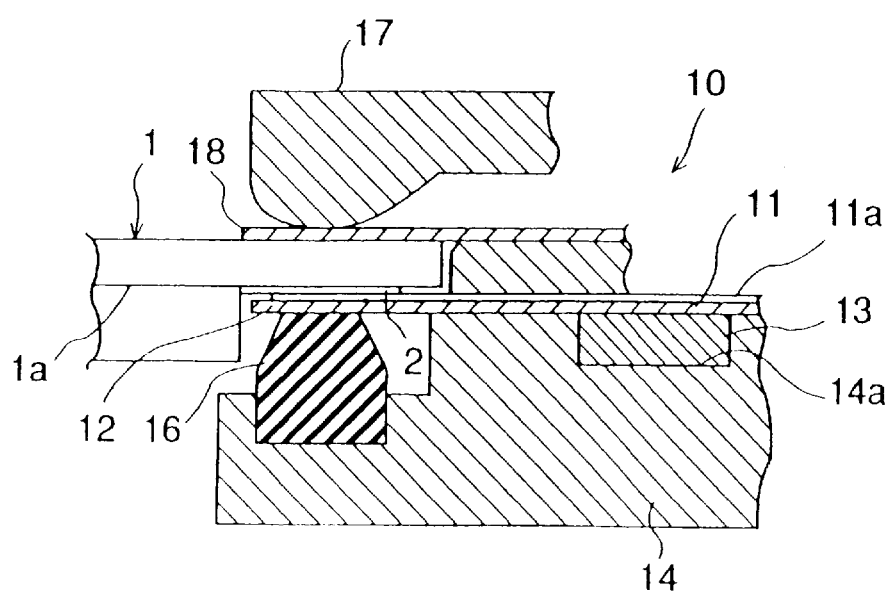
FIG. 14 is a side sectional view of a principal part of an inspecting contact apparatus according to a seventh embodiment of the present invention.
Figure 15:
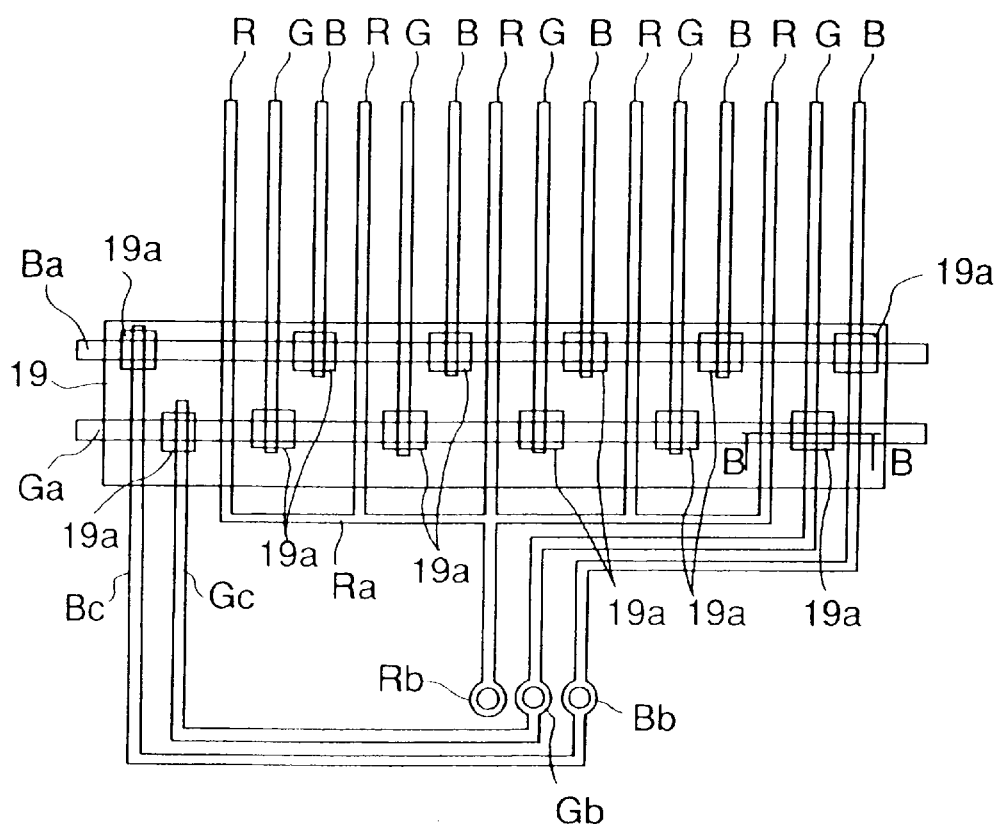
FIG. 15 is a plan view of the wiring of the contact film of the seventh embodiment.
Figure 16:
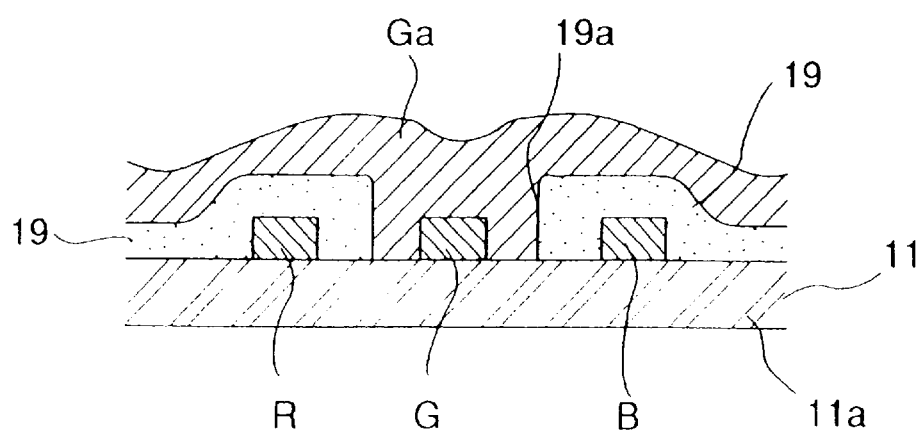
FIG. 16 is a sectional view of a principal part of the contact film taken along a line B—B in FIG.

FIG. 13 is a plan view of the liquid crystal display panel; and FIG. 14 is a side sectional view of the contact apparatus for inspecting the liquid crystal display panel. FIG. 15 is a plan view of the wiring patterns of the contact film; and FIG. 16 is a sectional view of the portion along the line B—B in FIG. 15.

A plurality of individual electrodes 2 of the liquid crystal display panel 1 shown in FIG. 13 are arranged divided into a plurality of (four in the illustrated example) blocks on the substrate 1a of the liquid crystal display panel . Common electrodes 4 are respectively arranged in the vicinity of the two ends of the areas of arrangement of the individual electrodes in the blocks. The contact apparatus 10 simultaneously supplies signals for inspection of the display quality etc. to all individual electrodes 2 on the source side.

Referring to FIG. 14, the contact film 11 is tightly fixed to the upper surface of an attachment plate 13 with the individual electrode wiring patterns 12 etc. located at the top. The attachment plate 13 is held in a concave groove 14a formed in the upper surface of the base plate 14 of the contact apparatus 10. Further, an elastic support member 16 for supporting the contact film 11 at the reverse surface of the individual electrode patterns is attached to the base plate 14. The liquid crystal display panel 1 is placed on the contact film 11 with the electrodes 2 to 5 facing downward. The upper surface of the liquid crystal display panel 1 is pushed from the top via a protective film 18 in accordance with need by a pushing member 17, whereby the individual electrodes 2 and common electrodes 4 on the source side of the liquid crystal display panel 1 and the individual electrode linear patterns and common electrode linear patterns of the contact film 11 can be brought into contact with them with the required contact pressure, respectively.

The contact film 11 to be pushed and connected as described above is formed with contactors for contact with a plurality of individual electrodes 2 in the blocks of the liquid crystal display panel 1 on one surface of a polyimide or other base film 11a having pliability and an insulating property. The contactors correspond to the three primary colors of red, green, and blue, respectively.

Referring to FIG. 15 and FIG. 16, the contactors R, G, and B are arranged alternately and in parallel to each other and are made to be brought into contact with the individual electrodes 2 on the liquid crystal display panel 1 side in a one-to-one correspondence. Further, the red contactors R are extended the furthest to the rear compared with the other two types of contactors G and B, are coupled by the conductive pattern Ra extending to the left and right at all rear ends thereof, and are connected via the conductive pattern Ra to the signal input portion Rb located at the rear thereof.

Further, green contactors G adjoining the red contactors R and formed shorter than the red S contactors R are arranged so that the rear ends thereof are aligned on the same line in the left and right direction. A conductive pattern extending from the rear end of the green contactor G arranged at the right most end is connected to the green signal input portion Gb adjoining the red signal input portion Rb. Further, the end portion of the conductive pattern Gc extending to the left from the signal input portion Gb is arranged so as to align with the left end of the line formed by the arrangement of the rear ends of the green contactors G.

Further, the blue contactors B adjoining the green contactors G and formed shorter than the green contactors G are arranged so that the rear ends thereof are aligned on the same line in the left and right direction, the conductive pattern extending from the rear end of the blue contactor B arranged at the right most end is connected to the blue signal input portion Bb adjoining the green signal input portion Gb, and further the end portion of the conductive pattern Bc extending to the left from the signal input portion Bb is arranged so as to align with the left end of the line formed by the arrangement of the rear ends of the blue contactors B.

An insulating film 19 is formed over the wiring patterns arranged as described above. The insulating film 19 is formed in a laterally long rectangular shape so as to continuously cover a range at the rear end including all rear end portions of the green contactors G and blue contactors B. The portions of the insulating film 19 corresponding to the rear ends of the green contactors G and the blue contactors B and the end portions of the conductive patterns Gc and Bc extending to the left are respectively cut off to form contact windows 19a through which the conductive portions are exposed.

A green conductive pattern Ga and a blue conductive pattern Ba are printed in the form of a laminate on the top of the insulating film 19. That is, the green conductive pattern Ga is printed so as to connect the front end of the green conductive pattern Gc exposed from the contact window 19a of the insulating film 19 and the rear end portions of all green contactors G in the form of a lateral straight line so as to transfer electric signals from the signal input portion Gb to the contactors G.

Further, the blue conductive pattern Ba exhibits a connection configuration similar to that of the green conductive pattern Ga. The blue conductive pattern Ba is printed so as to connect the front end of the blue conductive pattern Bc exposed from the contact window 19a of the insulating film 19 and the rear end portions of all the blue contactors B in the form of a lateral straight line so as to transfer electric signals from the signal input portion Bb to the contactors B.

Referring to FIG. 16, the contact window 19a is formed at the portion of the green contactors G among the contactors R, G, and B covered and insulated by the insulating film 19, the green conductive pattern Ga is printed on the insulating film 19, and the conductive pattern Ga is selectively connected to only the contactors G corresponding to one color among the contactors R, G, and B of three colors though it has a structure of only one-side printing.

Note that the arrangement of the contactors R, G, and B shown in the seventh embodiment is not particularly limitative. It is also possible to perform switch these contactors around, for example, switching the contactors explained as the red contactors R in the embodiment with the blue contactors B. Further, a similar circuit can be formed even if the above wiring patterns is structured reversed from left to right. Further, it is also possible to extend the conductive patterns Bc and Gc extended to the left in FIG. 15 as the contactors.

Next, an explanation will be made of an eighth embodiment of the present invention by referring to FIG. 17 to FIG. 20.

Figure 17:
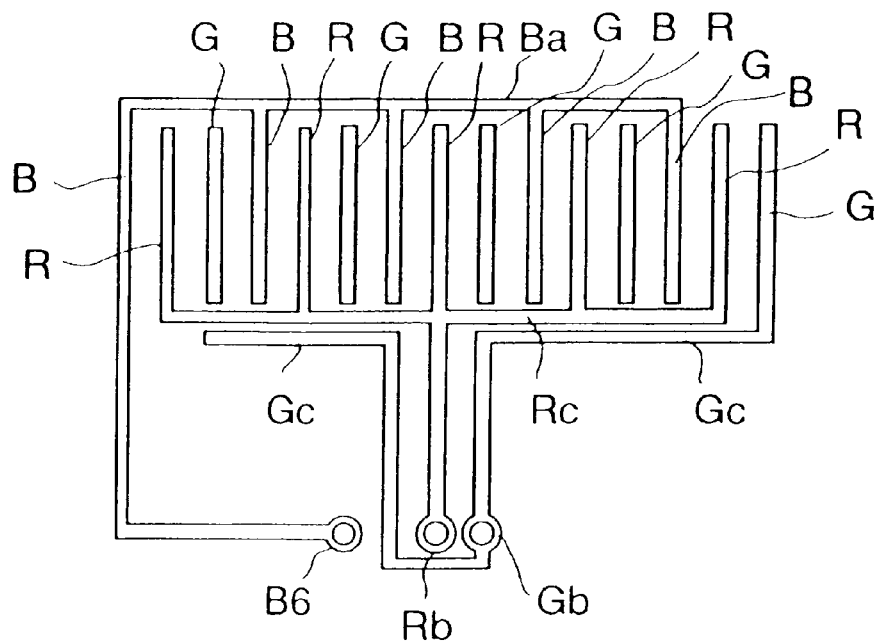
FIG. 17 is a plan view of the wiring pattern of the contact film of the contact apparatus according to an eighth embodiment of the present invention.
Figure 18:
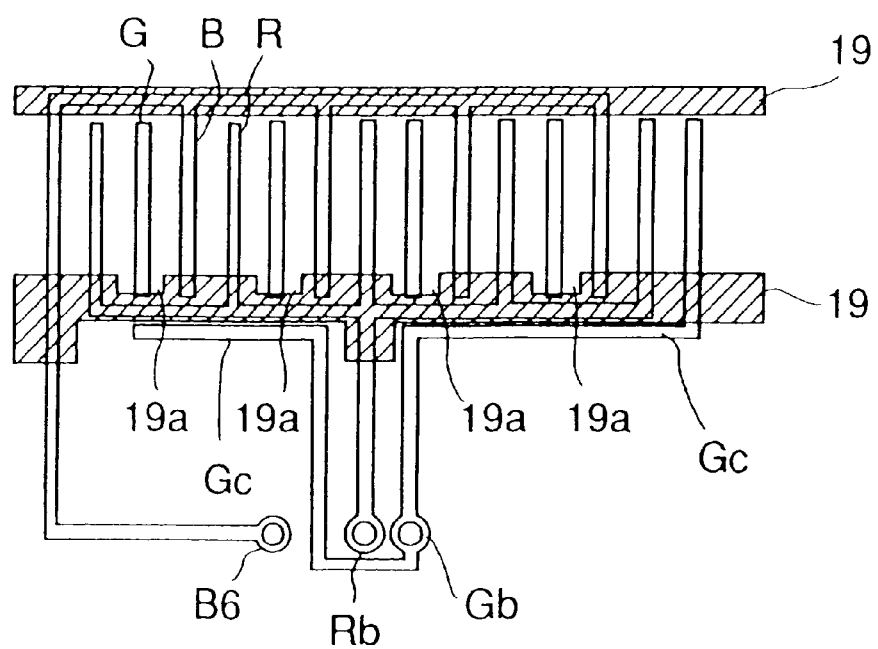
FIG. 18 is a plan view of the contact film showing a state where an insulating film is applied to the wiring patterns of FIG. 17.
Figure 19:
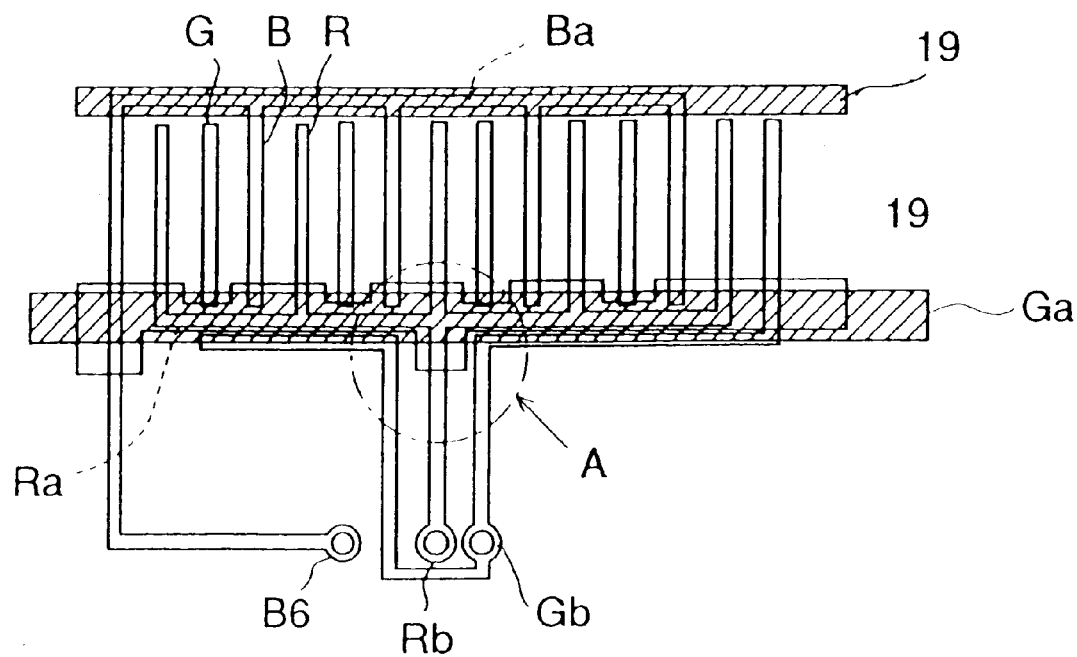
FIG. 19 is a plan view of the contact film showing the state where a conductive pattern is printed on the insulating film of FIG. 18.
Figure 20:
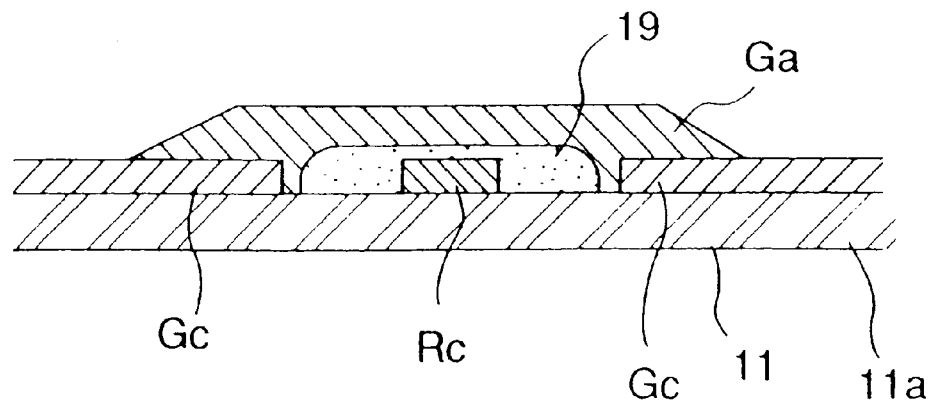
FIG. 20 is a sectional view of the part indicated by an arrow A of FIG. 19.

FIG. 17 to FIG. 19 are plan views showing the process for forming the wiring patterns on the contact film; while FIG. 20 is a sectional view of the part A in FIG. 19.

The wiring patterns shown in the figures are formed on one surface of the contact film 11 already explained in the seventh embodiment. First, giving an explanation of the structure of the wiring patterns corresponding to the three colors of red, green, and blue shown in FIG. 17, a plurality of red contactors R are arranged in parallel branched forward substantially perpendicularly with respect to a conductive pattern Ra extended from a center connection land Rb and then extended in the lateral direction. A plurality of blue contactors B are arranged in parallel branched rearward substantially perpendicularly from a conductive pattern Ba formed extended going around the left side from a similar connection land Bb provided close to the red connection land Rb and then extended in the lateral direction at the front most end. The red contactors R and the blue contactors B are arranged as intermeshing combs facing each other.

Further, regarding the green contactors G, a wiring pattern Gc extended from a green connection land Gb provided close to the above other connection lands Rb and Bb and extended to the right and left going around the red connection land Rb is laterally extended along the red conductive pattern Ra. It is then extended so as to form a single green contactor G along the red contactor R located at the right end.

Further, green contactors G are regularly arranged between the red contactors R and the blue contactors B in a state completely independent from the other wiring patterns. They are constituted so that the contactors R, G, and B are arranged in the order of red, green, and blue.

An insulating film 19 as shown in FIG. 18 is applied to the wiring patterns constituted as described above. The insulating film 19 is constituted so as to cover the blue conductive pattern Ba portion and secure an insulating property when the contact film is brought into contact with the liquid crystal display panel and is further formed so as to cover the red conductive pattern Ra part and the base ends of the red and blue contactors R and B. In this state, the base ends of the green contactors G are not covered by the insulating film 19 and are left exposed.

On the top of the insulating film 19 applied onto the wiring patterns in this way, as shown in FIG. 19, a green conductive pattern Ga formed by a conductive pattern is printed in the form of a laminate. The green conductive pattern Ga connects the green wiring patterns Gc arranged at the left and right and the independent green contactors G.

Referring to FIG. 20, the insulating film 19 is applied to the red wiring pattern Rc. The left and right parts of the green wiring pattern Gc arranged across this are provided with a green conductive pattern Ga extending over the top of the insulating film 19 in the form of a laminate. Due to this, it becomes possible to connect the parts of the green wiring pattern Gc while securing a state of insulation from the red wiring pattern Rc and it becomes possible to provide a display panel contact apparatus which can handle the three color individual electrodes 2 of a liquid crystal display panel 1 just by printing wiring on one surface of the contact film 11.

Next, an explanation will be made of a ninth embodiment of the present invention by referring to FIG. 21 and FIG. 22.

Figure 21:
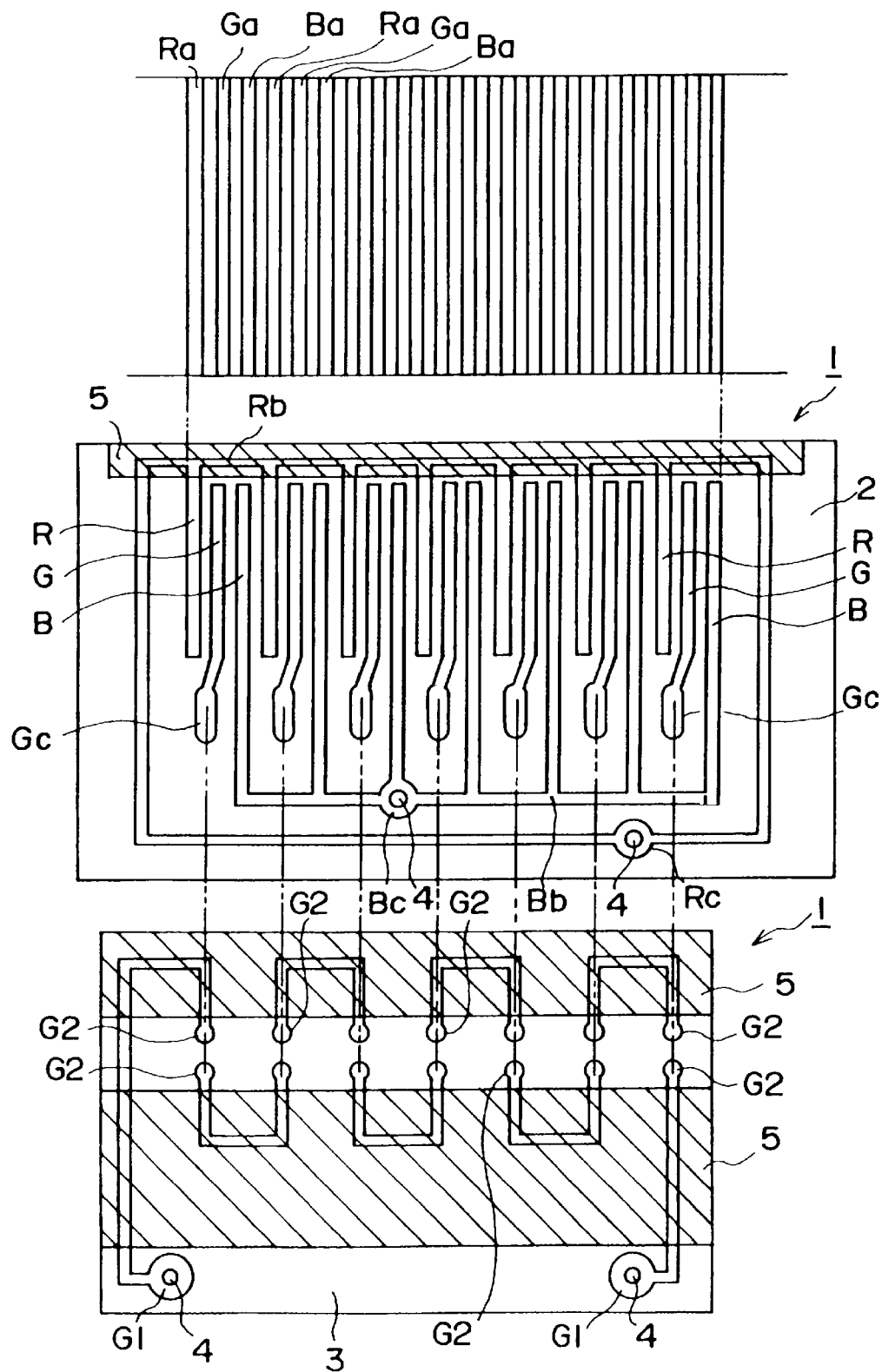
FIG. 21 is a plan view of the state of correspondence of the contact film body and the connection film with respect to the signal line terminals of the display panel of a ninth embodiment.
Figure 22:
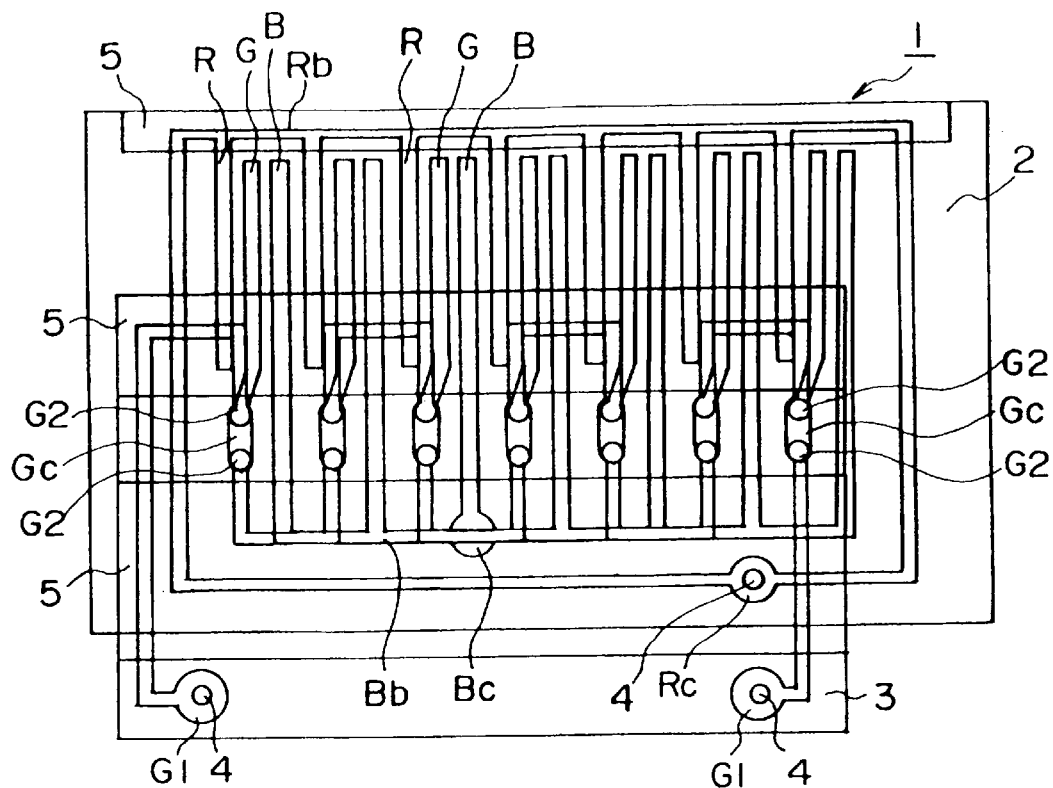
FIG. 22 is an explanatory view showing the wiring patterns of the contact film of FIG. 21 through the film as if it were transparent.

FIG. 21 is a plan view showing a contact film before assembly in correspondence to the signal line terminals of the color liquid crystal display panel; while FIG. 22 is an explanatory view showing the contact film completed in assembly as if it were transparent.

The contact film 1 shown in FIG. 21 is provided with a contact film body 2 and a connection film 3 bonded in the form of a laminate to the surface of the contact film body 2 on which the wiring patterns are formed. On one surface of the contact film body 2, contactors R, G, and B, corresponding to the three colors of red Ra, green Ga, and blue Ba of the plurality of signal line terminals for the pixel electrodes arranged on a substrate extended from the contour edge portions of the liquid crystal display panel, are alternately arranged in units of three colors so that signals for inspection of the display quality etc. can be individually supplied to all of the three color signal line terminals Ra, Ga, and Ba.

The contact film body 2 is a flexible substrate formed in a substantially rectangular shape and made of a plastic having pliability such as a polyimide film or a polyester film. The vicinity of the edge portion on the long side of one surface is made the contact surface for connection with the signal line terminals Ra, Ga, and Ba of the display panel. The contactors R, G, and B are arranged in parallel on this contact surface portion. The contactors R, G, and B are alternately arranged in the order of red R, green G, and blue B and set to substantially the same width and length dimension as each other.

All of the red contactors R are further extended toward the front end edge of the contact film body 2 and connected to a wiring pattern Rb extended along the front end edge of the contact film body 2. The two end portions of the wiring pattern Rb are extended backward along the contour edge of the contact film body 2 and connected at the rear portion so as to form a closed circuit. A red signal input portion Rc is formed so as to exhibit a circular land shape at the middle portion of the wiring pattern at the rear portion. A through hole 4 is made at the center of the red signal input portion Rc. The entire red wiring pattern Rb is covered by a strip shaped insulating film 5 comprised of a resist etc.

Note that it is sufficient so far the insulating film 5 is a film which is thin and is rich in flexibility and with which a highly reliable insulating effect is obtained. It may be an adhered thin film sheet or a coating formed by an insulating paint. The same is true for also the insulating film 5 to be used below.

Further, the green contactors G adjoining the red contactors R are inclined and extended backward so that all of their rear ends are close to the adjoining red contactors R. Elliptically shaped connection lands Gc long in the vertical direction are formed on the end portions thereof. These connection lands Gc are arranged at constant distances in the lateral direction and are designed to be connected with the wiring pattern formed on the connection film 3 mentioned later.

Further, the blue contactors B adjoining the green contactors G are extended backward at all of their rear ends linearly as they are and are connected to the wiring pattern Bb extended in the lateral direction located between the green connection lands Gc and the red signal input portion Rc. A circular blue signal input portion Bc is formed at the middle portion of the wiring pattern Bb. A through hole 4 is made at the center of this blue signal input portion Bc.

On the other hand, green signal input portions G1 are respectively formed at the left and right rear portions of the bonding surface of the connection film 3. Through holes 4 are respectively made at the center portions of the two signal input portions G1. Then, wiring patterns respectively extending forward symmetrically from the left and right signal input portions G1 are extended up to the front end of the connection film 3, then folded so as to form a substantially J-shape. Connection terminals G2 having diameters corresponding to the circular portions of the elliptical end portions are formed at positions corresponding to the elliptical front end portions of the green connection lands Gc. Similar connection terminals G2 are formed also at positions corresponding to the rear end portions of the green connection lands Gc. Further, the rear end connection terminals G2 are connected to the connection terminals G2 arranged corresponding to the rear end portions of the adjoining green connection lands Gc by wiring patterns folded so as to form a substantially U-shape. Further, the connection terminals G2 arranged corresponding to the front end portions of the adjoining green connection lands Gc are further connected to the connection terminals G2 corresponding to the front end portions of the connection lands Gc located at the adjoining positions by wiring patterns folded to form a substantially inverted U-shape. Similarly, the wiring patterns formed from the left to right are formed so that when bonded with the contact film body 2, the green connection lands Gc are connected so as to form a zigzag shape and the electric power is supplied in series.

Further, the other wiring pattern portions except the left and right signal input portions G1 and connection terminals G2 of the connection film 3 are covered by an insulating film 5.

The connection film 3 is joined in the form of a laminate to the contact film body 2 constituted as described above and, for example, bonded by hot bonding using, for example, an anisotropic conductive film or solder plating. When joining the two, all of the connection terminals G2 formed on the connection film 3 are connected to the corresponding front and rear ends of the green connection lands Gc on the contact film body 2 side, whereby a circuit comprising a continuous green wiring pattern between the left and right signal input portions G1 is formed By providing the connection film 3, the necessity of making through holes for each of the signal contactors R, G, and B is eliminated even though wiring patterns are provided for three colors, the distance between the contactors R, G, and B can be made finer, and the usage of a contact film body 2 having wiring patterns on only one surface, which can be produced at relatively low cost, becomes possible. Further, at the time of the inspection of the state of connection after the connection film 3 is bonded, all electrical connection portions (connection lands Gc and connection terminals G2) are arranged in series, so it becomes possible to inspect all of the green contactors G just by performing a test of the conduction between the left and right signal input portions G1.

Further, signals can be input from the left and right by the left and right signal input portions G1, therefore stabler signal input becomes possible.

Figure 23:
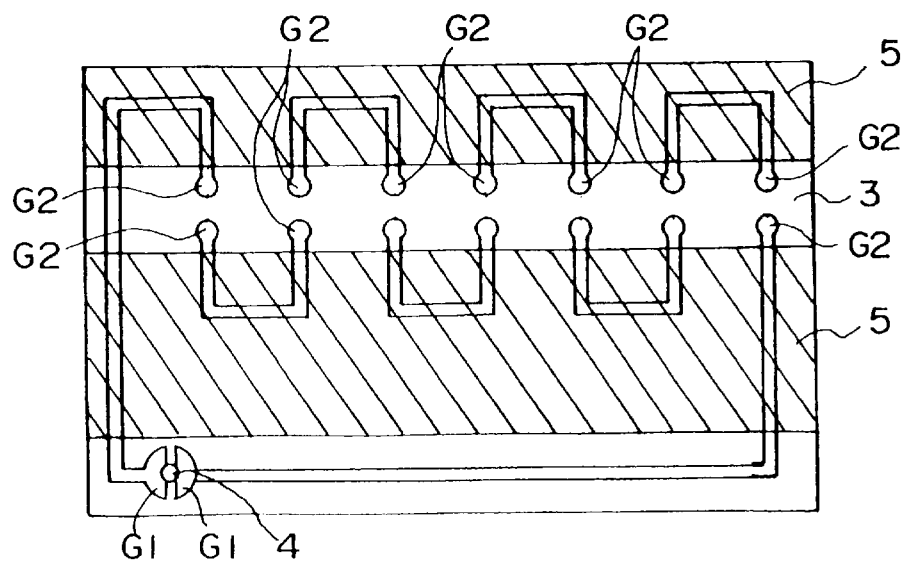
FIG. 23 is a plan view of an example of application of the wiring patterns of the connection film.

Note that, it is also possible to change the wiring patterns of the connection film 3 to those shown in FIG. 23. In the wiring patterns of FIG. 23, the left and right wiring patterns extended backward are gathered together at one position at the rear where they form a pair of left and right semicircular signal input portions G1. A through hole 4 is made between these signal input portions G1. The signal input portions G1 are formed electrically isolated from each other. At the time of the conduction test, the test of the conduction is carried out in the state where the left and right portions are separated from each other. When completing the bonding with the contact film body 2, to pass the signals, a conductor such as solder is filled into the through hole 4 so as to connect the left and right signal input portions G1.

Note that, the order of arrangement of the red (R), green (G), and blue (B) contactors R, G, and B, the signal line input portions Rc, Bc, and G1, and the wiring patterns connecting them are not limited to those of the above embodiments. It is also possible to change the order of arrangement of the colors and change the corresponding colors of the signal line input portions Rc, Bc, and G1 and the wiring patterns in accordance with the arrangement of the signal line terminals 1 of the liquid crystal display panel.

Next, an explanation will be made of a 10th embodiment of the present invention by referring to FIG. 24 to FIG. 26.

Figure 24:
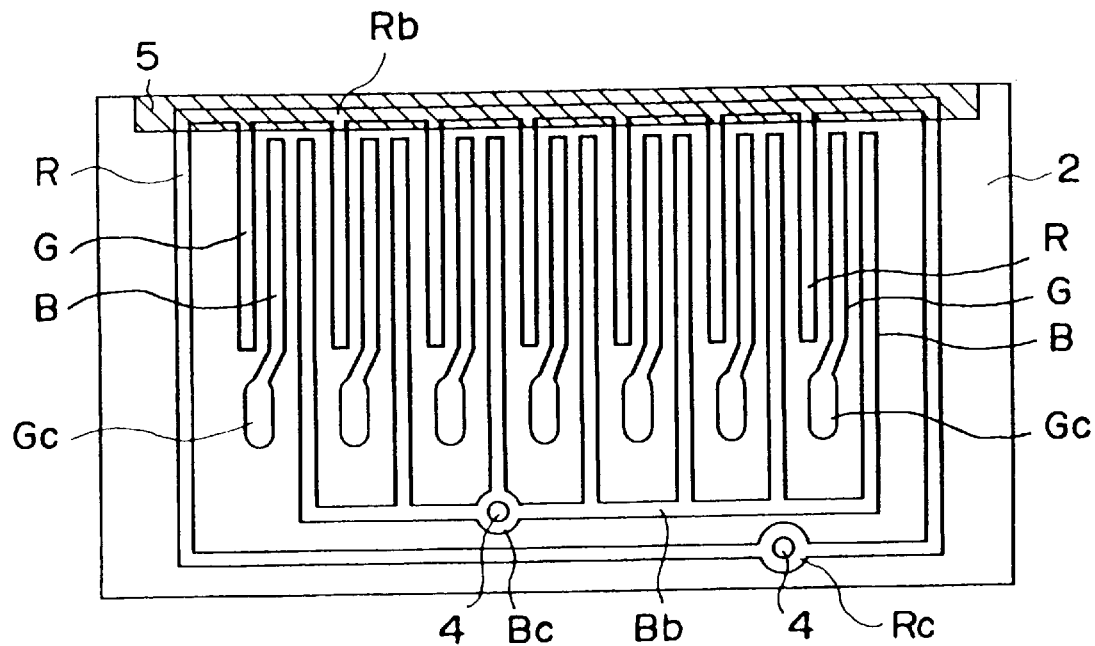
FIG. 24 is a plan view of the contact film body according to a 10th embodiment.

FIG. 24 is a plan view of the contact film body; FIG. 25 is a plan view of the connection film; and FIG. 26 is an explanatory view showing the completed contact film as if it were transparent. The configuration of the contact film body 2 shown in FIG. 24 and FIG. 26 is basically the same as that shown in FIG. 21 and FIG. 22, so the same references are given to the same structural parts and explanations thereof omitted while the explanation will be made of the connection film 3 having a different configuration.

Figure 25:
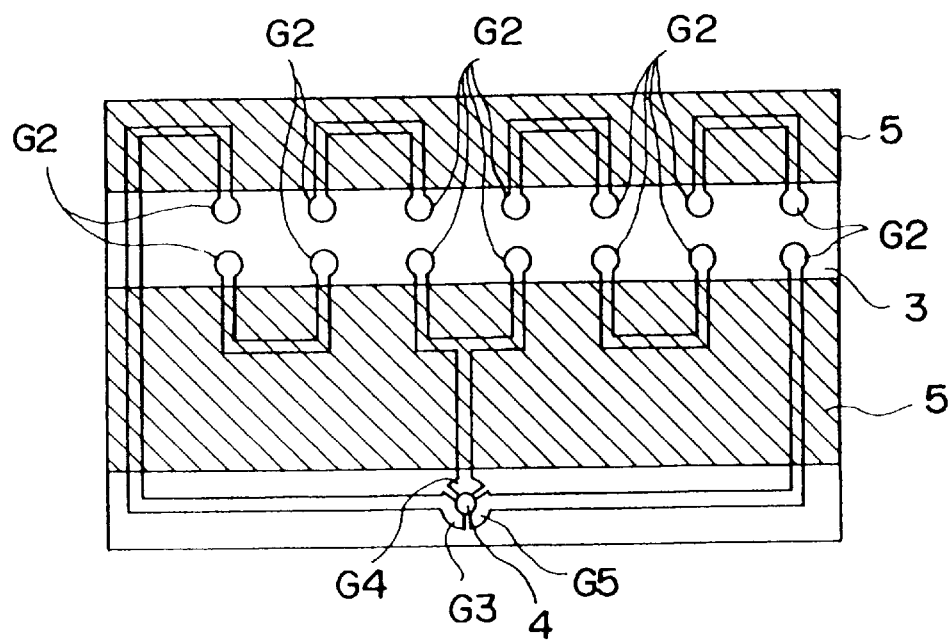
FIG. 25 is a plan view of the wiring patterns of the connection film of the 10th embodiment.
Figure 26:
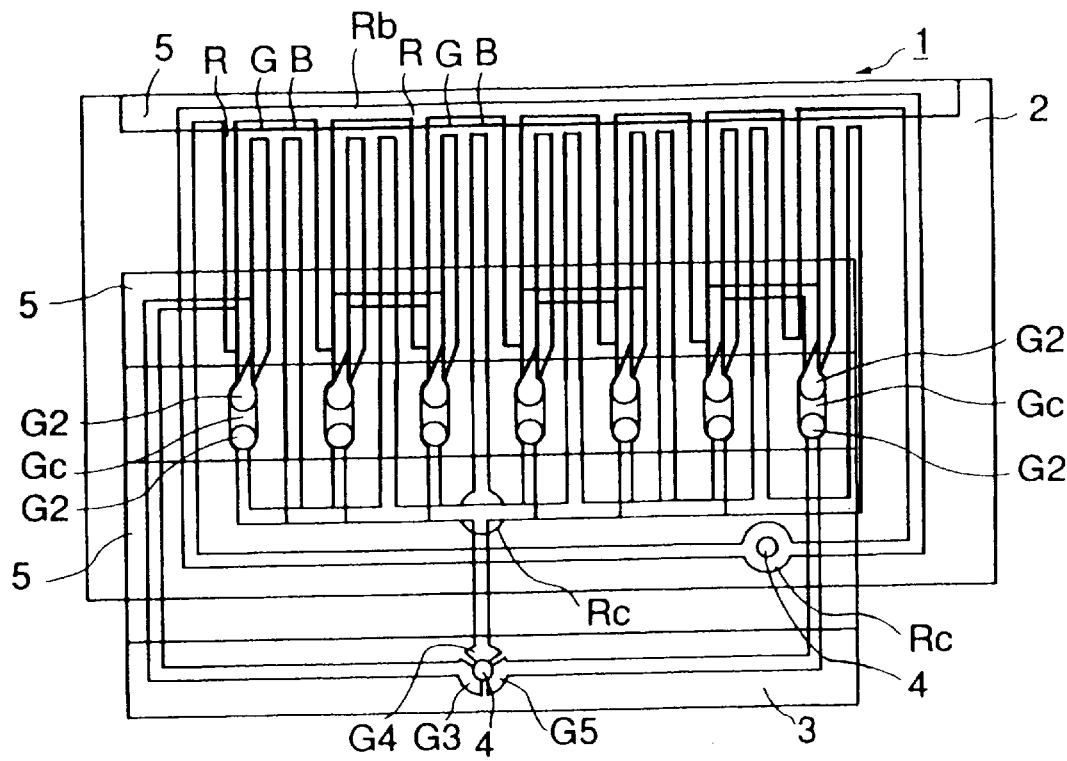
FIG. 26 is an explanatory view showing the contact film of the 10th embodiment as if it were transparent.

In the connection film 3 shown in FIG. 25, the difference from the connection film shown in the ninth embodiment resides in the fact that the signal input portions G1 which had been arranged at the left and right are arranged at the center and form a single circular land divided into three parts. The three wiring patterns extending from the left, right, and center connection terminals G2 are connected to the three signal input portions G3, G4, and G5, respectively.

A through hole 4 is made at the center of the three signal input portions G3, G4, and G5. In the state of the connection film 3 alone before being bonded with the contact film body 2, the signal input portions G3, G4, and G5 are electrically isolated from each other. When testing the state of conduction of the green contactors G after bonding the film to the contact film body 2 in the form of a laminate, it becomes possible to perform the test of conduction between for example the left side signal input portion G3 and center signal input portion G4 and to separately perform the test of conduction between the center signal input portion G4 and the right side signal input portion G5. Even if a defect occurs, it can be quickly confirmed at what connection terminal G2 of the contactor G the connection defect occurred.

Further, when completing and then using the contact film 1, the signals are input from the left, right, and center portions to the green contactors G arranged in the lateral direction, therefore it becomes possible to reduce the unevenness in input of the signals and achieve a stabler signal input.

Next, an explanation will be made of an 11th embodiment of the present invention by referring to FIG. 27 to FIG. 31.

Figure 27:
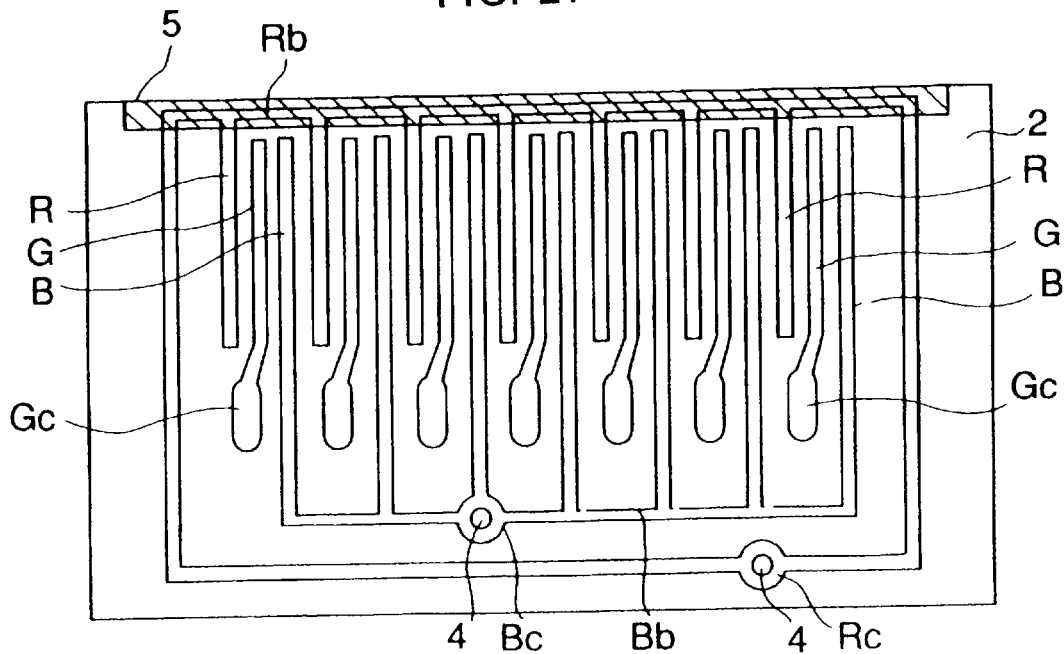
FIG. 27 is a plan view of the contact film body according to an 11th embodiment.
Figure 28:
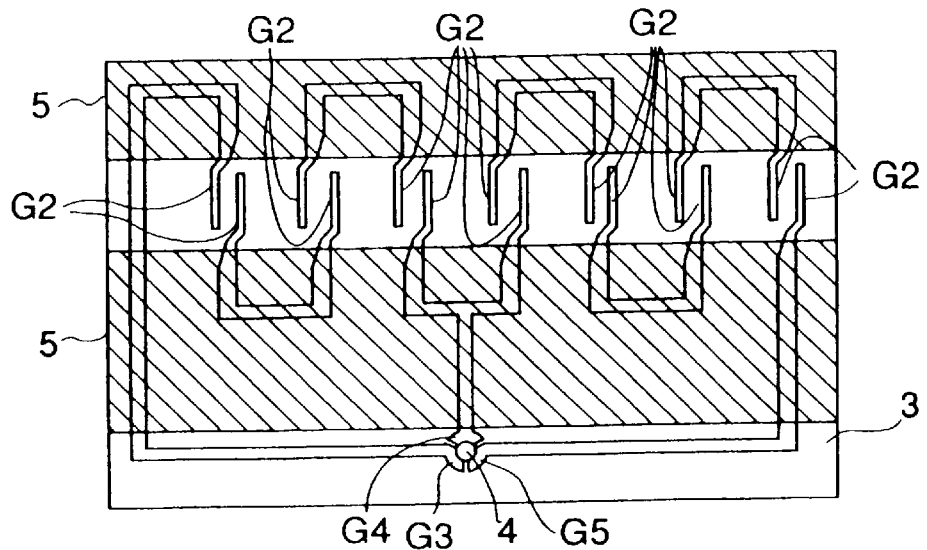
FIG. 28 is a plan view of the wiring patterns of the connection film of the 11th embodiment.
Figure 29:
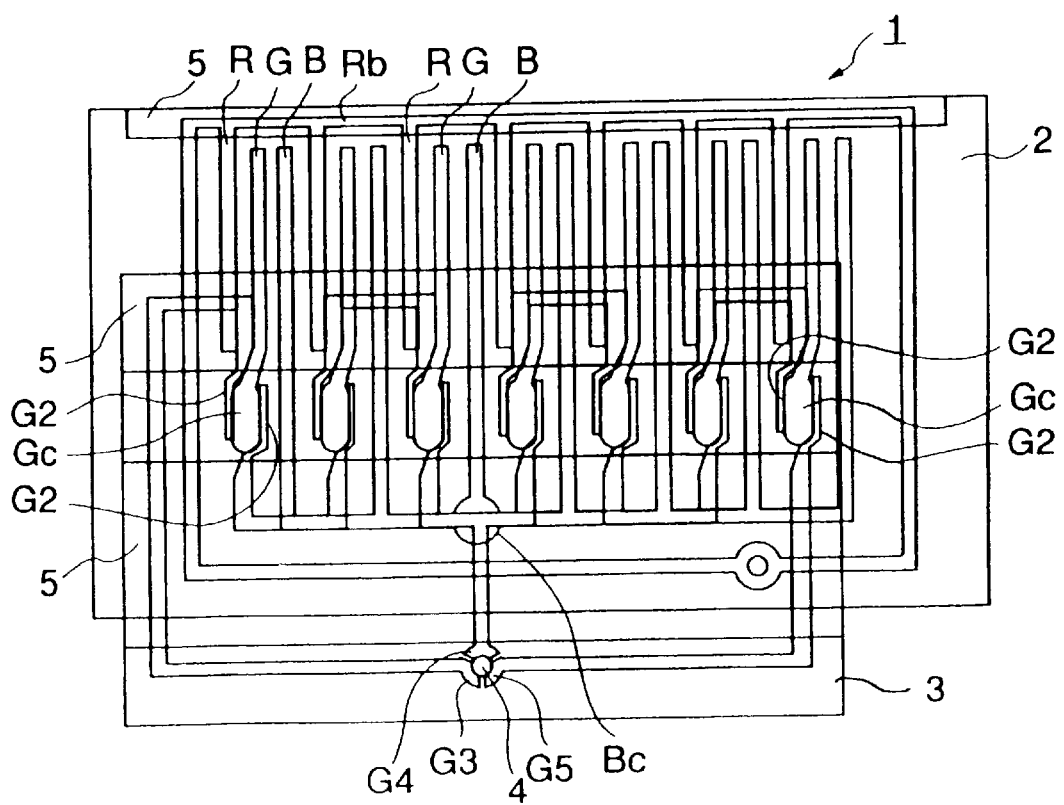
FIG. 29 is an explanatory view showing the contact film of the 11th embodiment as if it were transparent.
Figure 30:
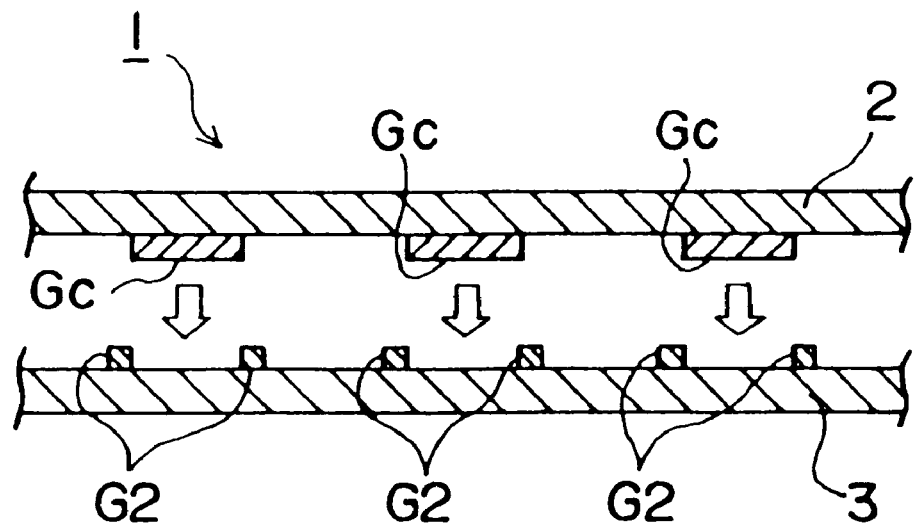
FIG. 30 is an explanatory view explaining a state of engagement between the connection lands of the contact film body and connection terminals of the connection film.
Figure 31:
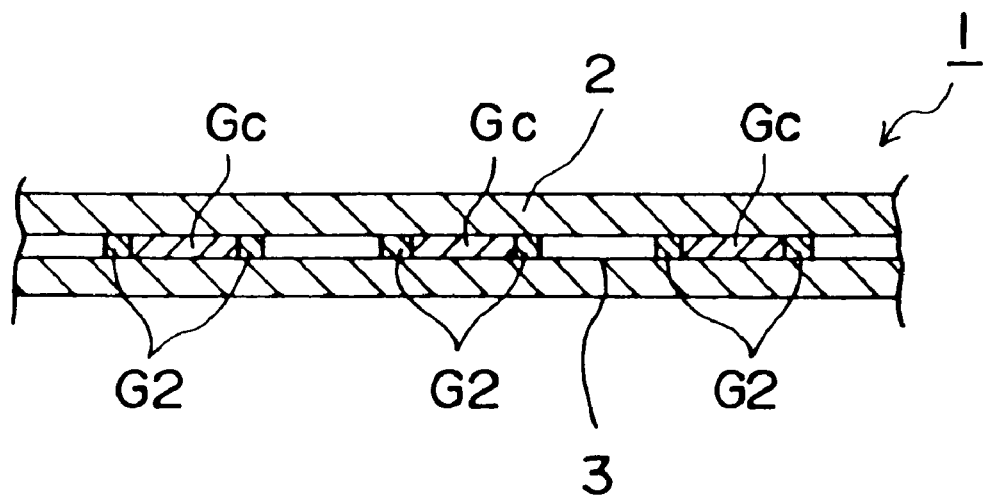
FIG. 31 is an explanatory view explaining a state of engagement between the connection lands of the contact film body and connection terminals of the connection film.

FIG. 27 is a plan view of the contact film body; FIG. 28 is a plan view of the connection film; FIG. 29 is an explanatory view showing the completed contact film as if it were transparent; FIG. 30 is a sectional view diagrammatically showing the state of connection between the connection lands of the contact film body 2 and the connection terminals of the connection film 3; and FIG. 31 is a sectional view of the state where the connections of FIG. 30 are completed. Note that, in FIG. 30 and FIG. 31, only the structure of engagement of the connection terminals is shown. The illustration of the other wiring patterns is omitted.

The configuration of the contact film body 2 shown in FIG. 27 and FIG. 29 is basically the same as that shown in FIG. 21 and FIG. 22, so the same references are given to the same structural parts and explanations omitted and the explanation will be made below of the connection film 3 having a different structure from that of the above embodiment.

In the connection film 3 shown in FIG. 28, the difference from the connection film shown in the 10th embodiment resides in the shape of the connection terminals G2. The connection terminals G2 are formed so as to exhibit substantially J-shapes corresponding to the contour shapes of the elliptical connection lands Gc formed on the contact film body 2 side to be bonded. The connection terminals G2 arranged at the front end correspond to the edge portions of the left side of the elliptical connection lands Gc. The connection lands G2 arranged at the rear portion correspond to the edge portions of the right side of the elliptical connection lands Gc. By adopting the connection terminals G2 formed in this way, the positioning when bonding the contact film body 2 and the connection film 3 can be carried out by the engagement of the connection terminals G2 and the connection lands Gc, therefore even in a case where the joined portions cannot be examined by the naked eye, accurate positioning is possible by the feeling of engagement.

Note that when bonding the contact film body 2 and the connection film 3, in the same way as the above embodiments, they are bonded by hot bonding by using for example an anisotropic conductive film or solder plating.

As described above, according to the configurations of the first to 11th embodiments, it is possible to provide a display panel inspecting contact apparatus capable of turning on pixels of a color liquid crystal display panel separately for each of the colors and, in addition, secure electrical reliability with a low manufacturing cost and achieve a small size.

Next, an explanation will be made of a 12th embodiment of the present invention by referring to FIG. 32 and FIG. 33.

Figure 32:
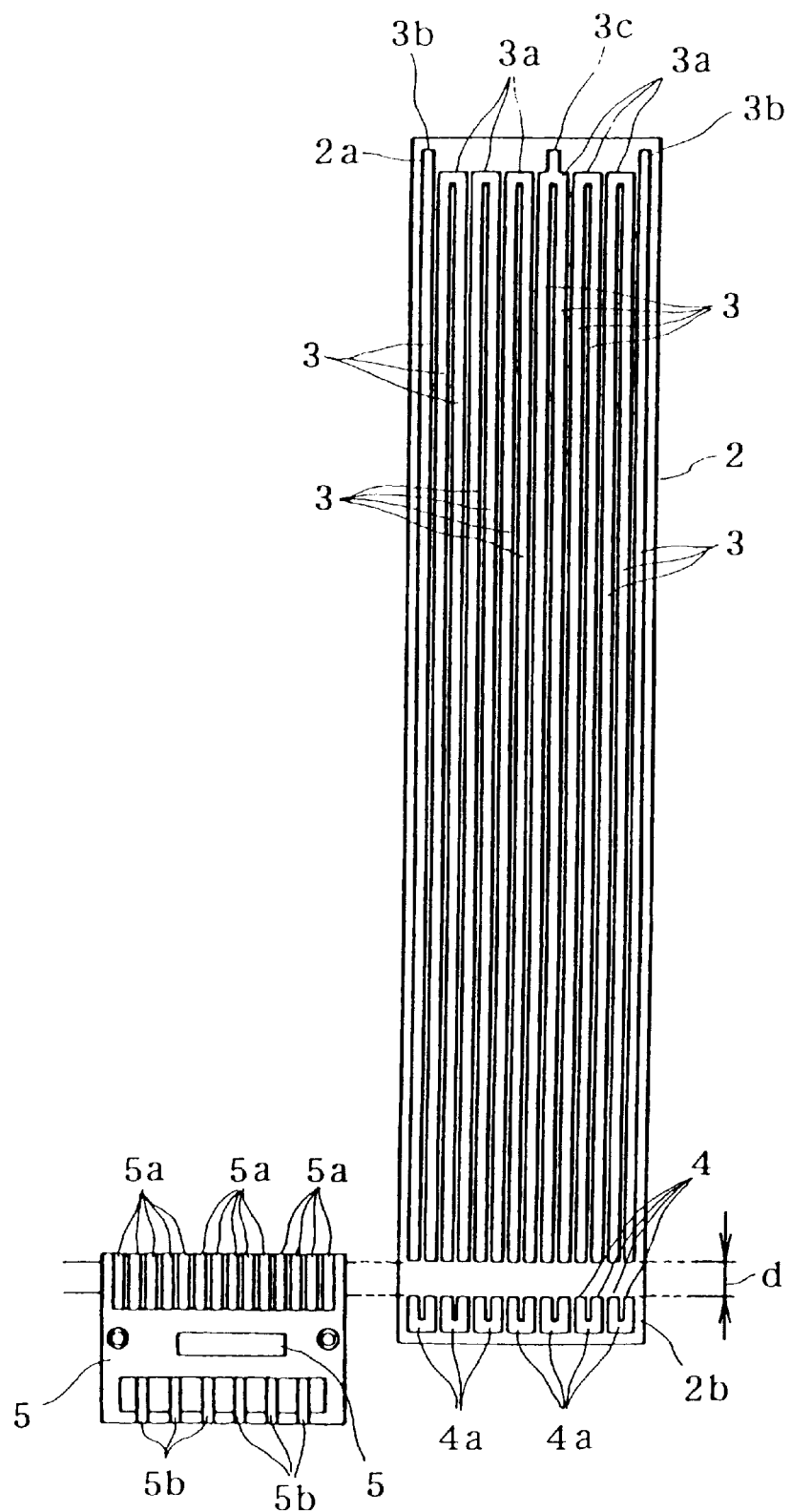
FIG. 32 is a plan view of a connection configuration of the flexible printed circuit board and the IC tabs according to a 12th embodiment.
Figure 33:
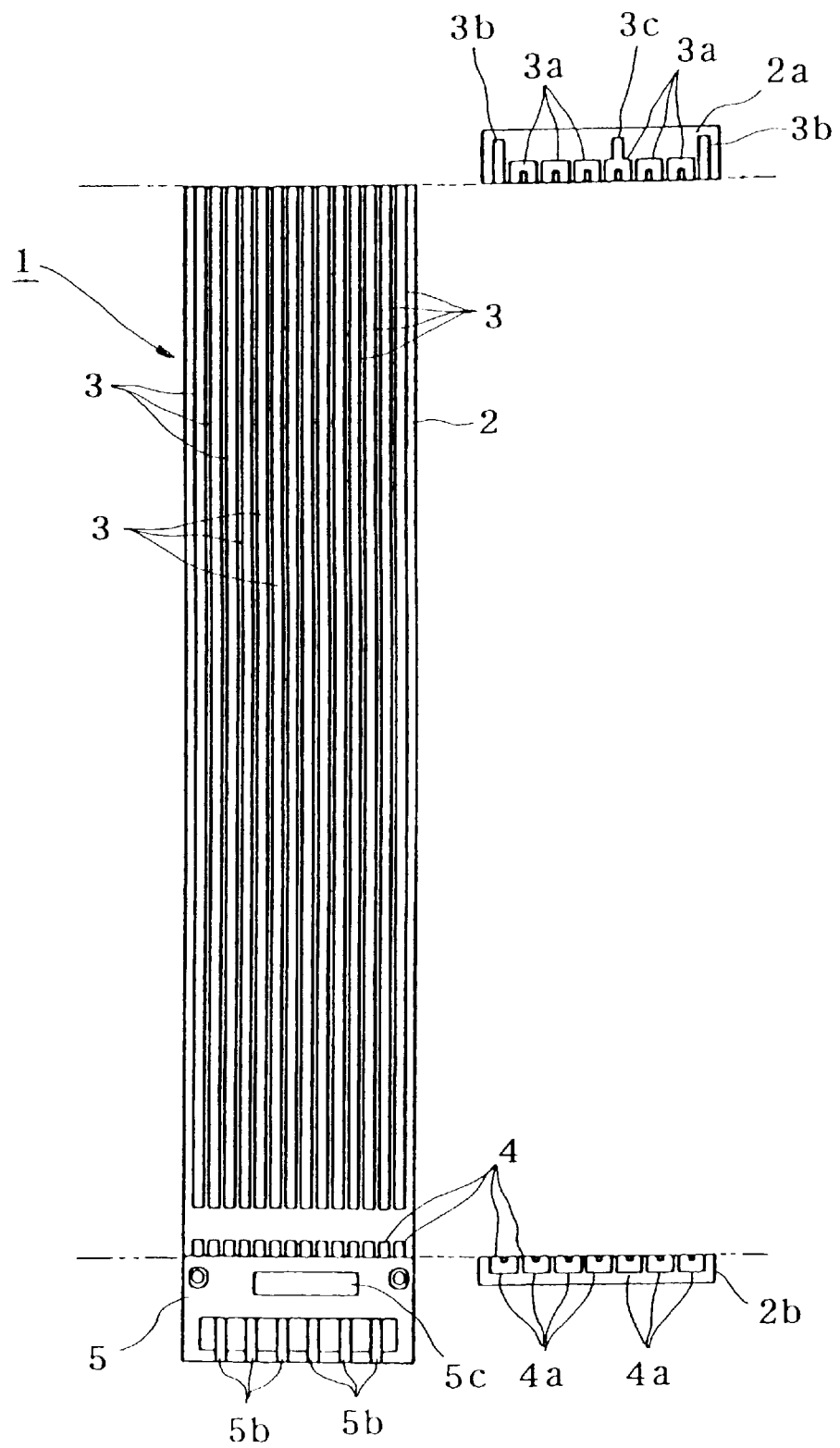
FIG. 33 is a plan view of the state where the front end and rear end of the flexible printed circuit board shown in FIG. 32 are cut off.

FIG. 32 is a plan view of a connection position of an IC tab mounted on a flexible printed circuit board; and FIG. 33 is a plan view of a completed state of the flexible printed circuit board.

The flexible printed circuit board 2 shown in FIG. 32 and FIG. 33 has a rectangularly shaped insulating film made of a material provided with both flexibility and an insulating property, for example, a polyester film or polyimide film.

The flexible printed circuit board 2 has a plurality of conductive patterns 3 individually corresponding to the individual electrodes of a not illustrated liquid crystal display panel. These conductive patterns 3 are arranged in parallel to each other. Note that the number of the conductive patterns 3 shown in the figure are reduced from the actual number to magnify the wiring structure for easy understanding and that the conductive patterns 3 existing on the back surface of the flexible printed circuit board 2 are shown through the film as if it were transparent (by solid lines).

A plurality of parallel conductive patterns 3 are formed along the longitudinal direction of the rectangularly shaped flexible printed circuit board 2. The front ends of two adjoining conductive patterns 3 arranged inside this are connected to each other in a conductive state by front end connection portions 3*a* exhibiting a substantially U-shape. Note that the shape of the front end connection portions 3*a* is not limitative and may be other pattern shapes, for example, a V-shape, an H-shape, or a W-shape so long as it electrically secures the connection state. Namely, the shape thereof is not particularly limited so far as it serves as a connection portion.

Further, the front ends of the conductive patterns 3 arranged at the left and right outermost sides are extended slightly to the front end from the other inside conductive patterns 3 to form inspection contactors 3*b*. Further, a similar inspection contactor 3*c* is also formed at a front end connection portion 3*a* located at an intermediate portion.

Further, a by-pass pattern 4 having a U-shaped base end connection portion 4*a* with two ends corresponding to the end portions of the conductive patterns 3 adjoining each other at a predetermined distance d is formed at the base end of all of the conductive patterns 3. The by-pass patterns 4 are formed so as to continue from the left and right conductive patterns 3 located at the outermost sides to the conductive patterns 3 adjoining them to the inside and are arranged to be offset from the above front end connection portions 3*a*.

An IC tab 5 is connected to the flexible printed circuit board 2. In the IC tab 5, an IC chip 5*c* is provided at the center, and connection patterns 5*a* corresponding to the conductive patterns 3 of the flexible printed circuit board 2 are arranged at one side thereof. The length of the connection patterns 5*a* is set longer than the predetermined distance d.

Further, input terminals 5*d* for inputting the drive signals to the mounted IC are arranged at the other side of the IC tab 5.

The front ends of the connection patterns 5*a* of the IC tab 5 correspond to the conductive patterns 3, the middle portions straddle a predetermined distance d, and the base ends are connected to the by-pass patterns 4. For the connection, an anisotropic conductive sheet, solder plating, etc. is utilized.

When inspecting the conduction of the electrical connection apparatus 1 of the flexible printed circuit board 2 and the IC tab 5 produced as described above, one first inspects the conduction between the left end inspection contactor 3*b* arranged at the front end of the flexible printed circuit board 2 and the inspection contactor 3*c* of the intermediate portion, then inspects the conduction between the inspection contactor 3*c* of the intermediate portion and the inspection contactor 3*b* of the right end. By these two inspections of conduction, it can be confirmed that all of the conductive patterns 3 are reliably connected to the IC tab 5 side. Note that there is no problem even if the order of the above inspections is switched. It is also possible to start the inspection of the conduction between the inspection contactor 3*b* at the right end and the intermediate inspection contactor 3*c*.

Further, it is also possible to perform the inspection between the left and right inspection contactors 3*b* without using (or providing) the intermediate inspection contactor 3*c*. Further, it is also possible to perform the inspection of conduction for each of a plurality of areas by providing inspection contactors 3*c* at a plurality of front end connection portions 3*a*.

After conducting the inspection of conduction as described above and finding that it is passed, as shown in FIG. 33, predetermined widths of the front end portion and base end portion of the flexible printed circuit board 2 are cut off. The front end connection portions 3*a* and the inspection contactors 3*b* and 3*c* are included in the cut off portion 2*a* at the front end. The front end portion of the flexible printed circuit board 2 after the cutting has the front ends of the conductive patterns 3 arranged in parallel in the form of a comb.

Further, the U-shaped connection portions 4*a* of the by-pass patterns 4 are included in the cut off portion 2*b* of the base end of the flexible printed circuit board 2. The base end portion of the flexible printed circuit board 2 after the cutting has the adjoining conductive patterns 3 cut off from each thereof.

The electrical connection apparatus 1 finished being inspected in this way can be accurately inspected for conduction in an extremely short time in comparison with the conventional structure.

Next, an explanation will be made of a 13th embodiment of the present invention by referring to FIG. 34 to FIG. 35.

Figure 34:
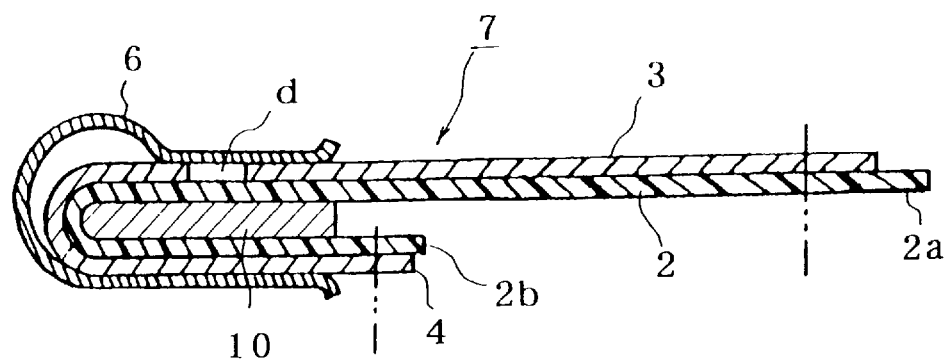
FIG. 34 is a side sectional view of the principal parts of the connector apparatus of a 13th embodiment.
Figure 35:
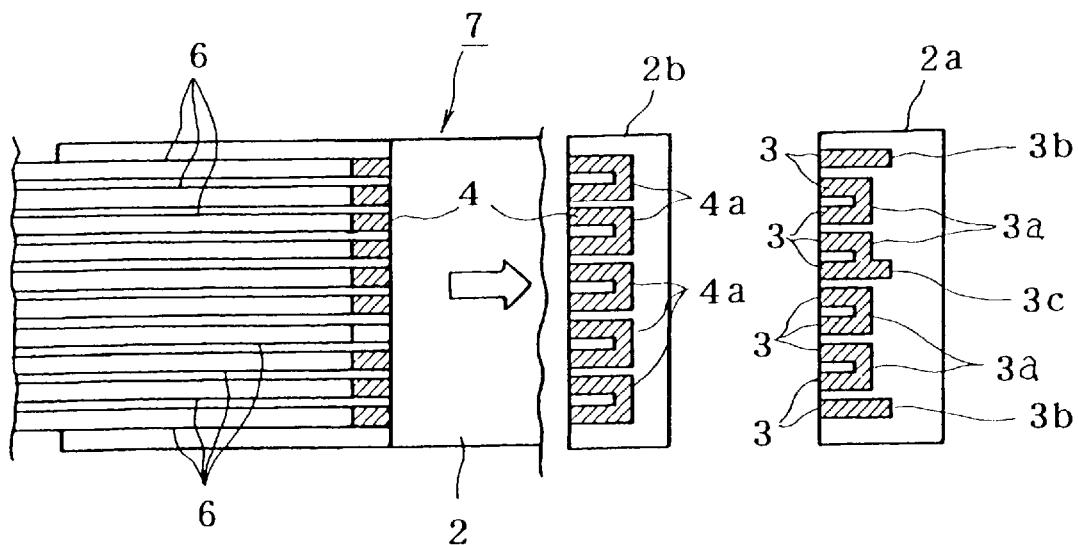
FIG. 35 is a plan view of the principal parts of the connector apparatus of FIG. 34.
Figure 36:
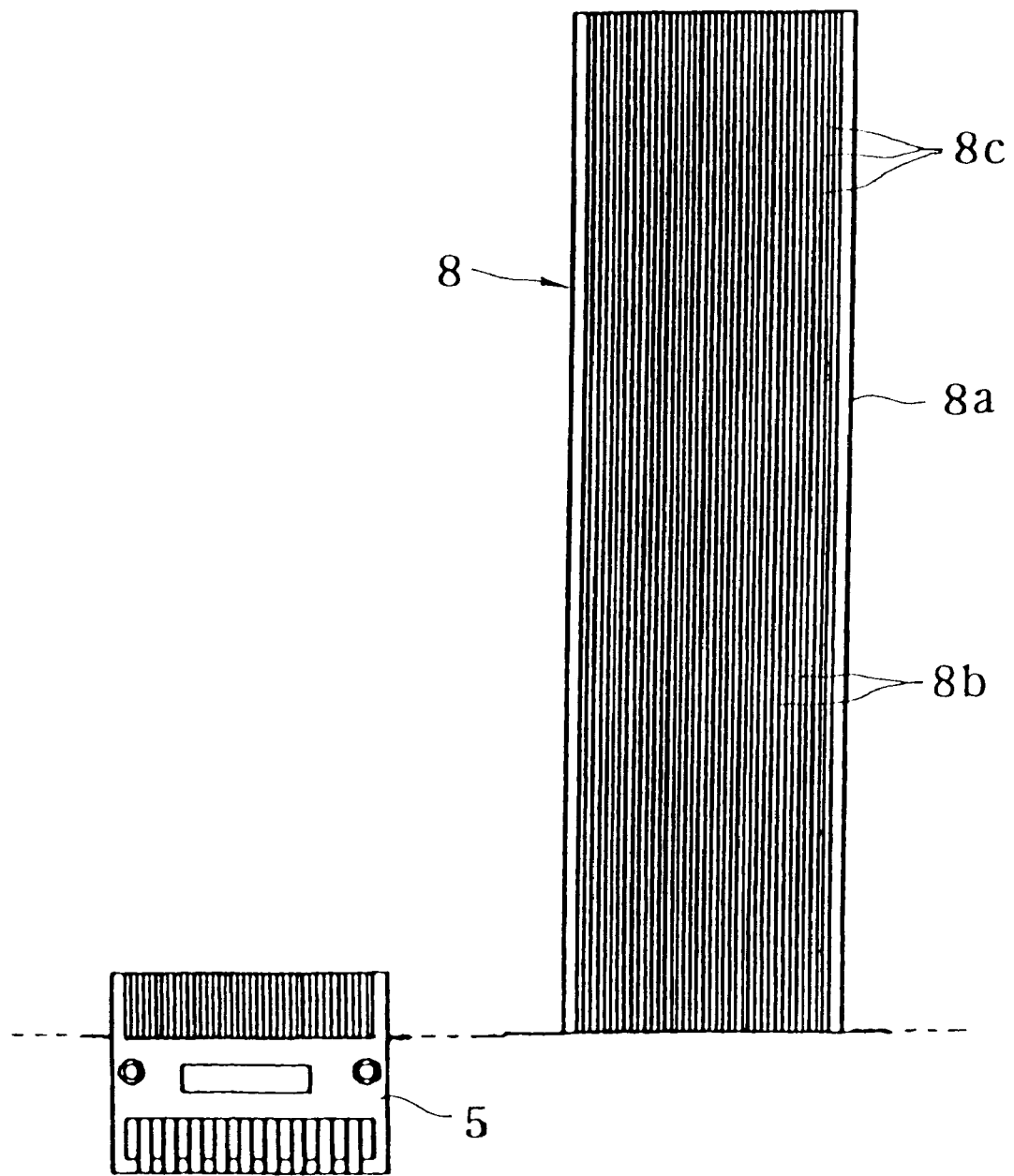
FIG. 36 is a plan view of the configuration of a conventional contact film.
Figure 37:
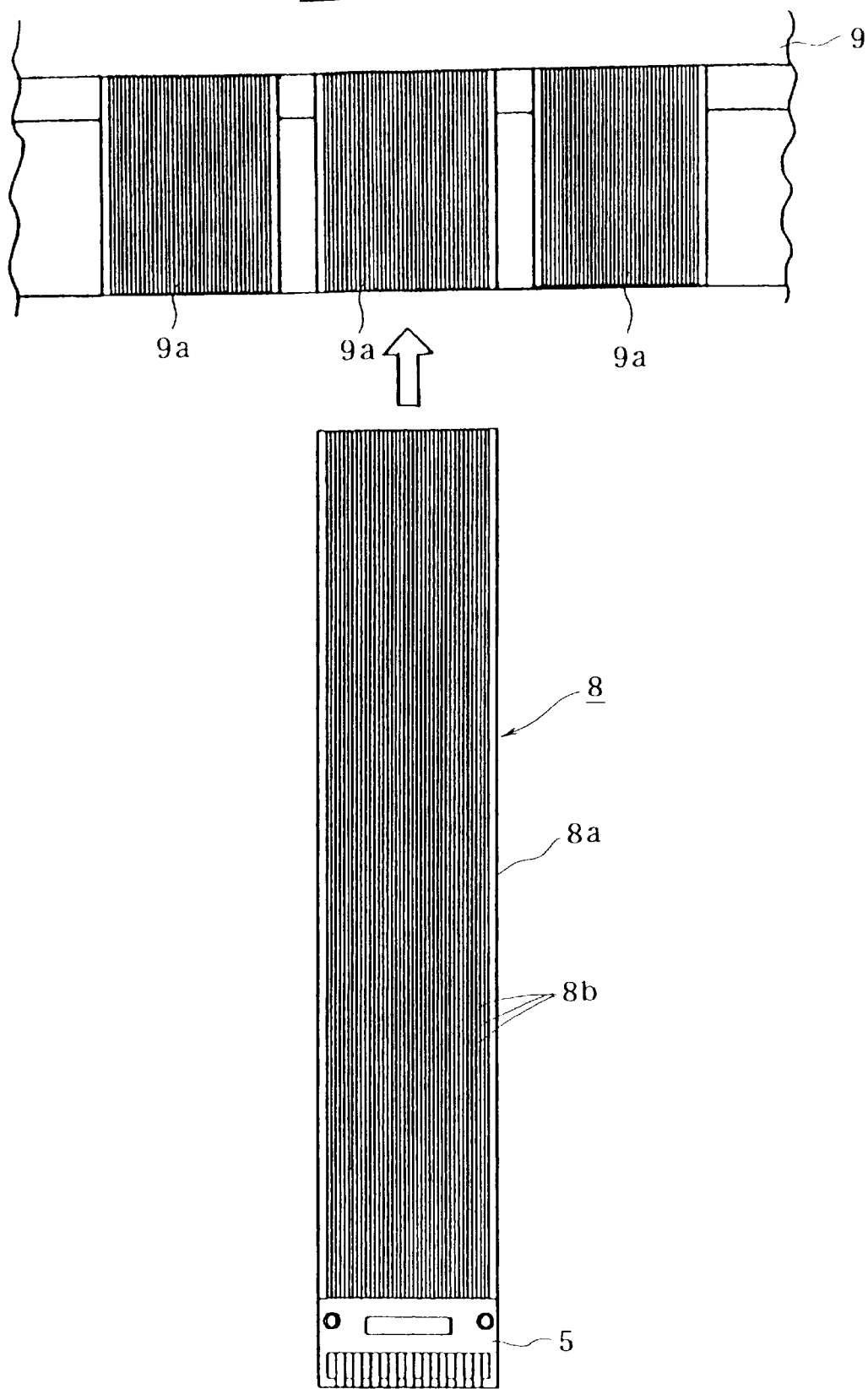
FIG. 37 is a plan view substantially showing a state where the contact film of FIG. 36 is connected to a liquid crystal display panel.

FIG. 34 is a side sectional view of a flexible printed circuit board inserted into connectors; and FIG. 35 is a plan view of the flexible printed circuit board inserted into the connectors.

The connectors 6 shown in these figures are formed like clips and are constituted so as to resiliently sandwich and hold a flexible printed circuit board 2 with a front end which is folded back so as to surround an elastic holding member 10 and thereby perform electrical connection and mechanical connection. The basic configuration of the flexible printed circuit board 2 becomes substantially the same as that shown in FIG. 32 of the above 12th embodiment. Note that no IC tab 5 is provided.

The connectors 6 are formed to a predetermined width. A plurality of connectors are arranged in parallel and are constituted so as to individually connect to the conductive patterns 3 formed on one surface of the flexible printed circuit board 2. The flexible printed circuit board 2 has the conductive patterns 3 bent back to face the inside surfaces of the connectors 6 and has them arranged to correspond to the inside surfaces serving as the conductive portions of the connectors 6 at portions of a predetermined distance d. The connectors 6 are connected so as to straddle the portions of the conductive patterns 3 and by-pass patterns 4 so that all of the conductive patterns 3 are connected in a conductive state.

When inspecting the conduction of the connector apparatus 7 constituted as described above, in the same way as the 12th embodiment, the inspection can be efficiently carried out by utilizing the inspection contactors 3*b* and 3*c* provided at the front ends of the conductive patterns 3.

After finishing the inspection, the front end portion 2*a* and the base end portion 2*b* of the flexible printed circuit board 2 are cut off as shown in FIG. 35 to provide the connector apparatus 7 as a good product.

Next, an explanation will be made of a 14th embodiment of the present invention by referring to FIG. 38 to FIG. 44.

Figure 38:
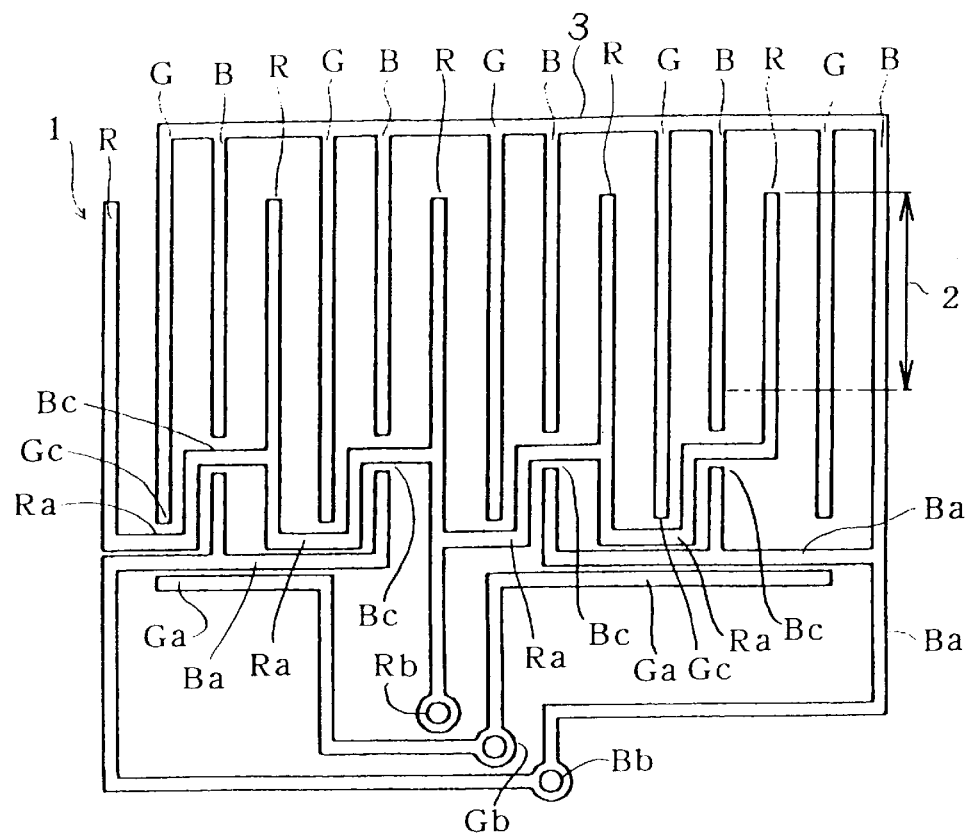
FIG. 38 shows the manufacturing process of a contact film according to a 14th embodiment of the present invention and is a plan view of the shapes of wiring patterns formed on a pliable film.
Figure 39:
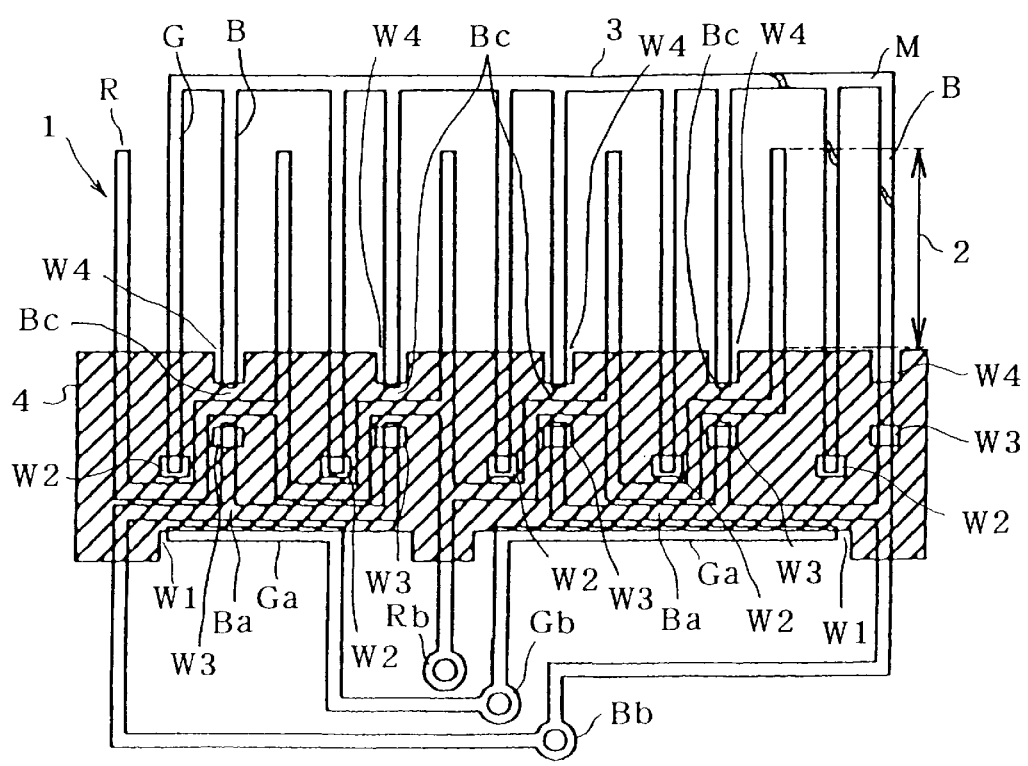
FIG. 39 is a plan view of the state where a resist serving as an insulating film is applied onto the signal lines shown in FIG. 38.
Figure 40:
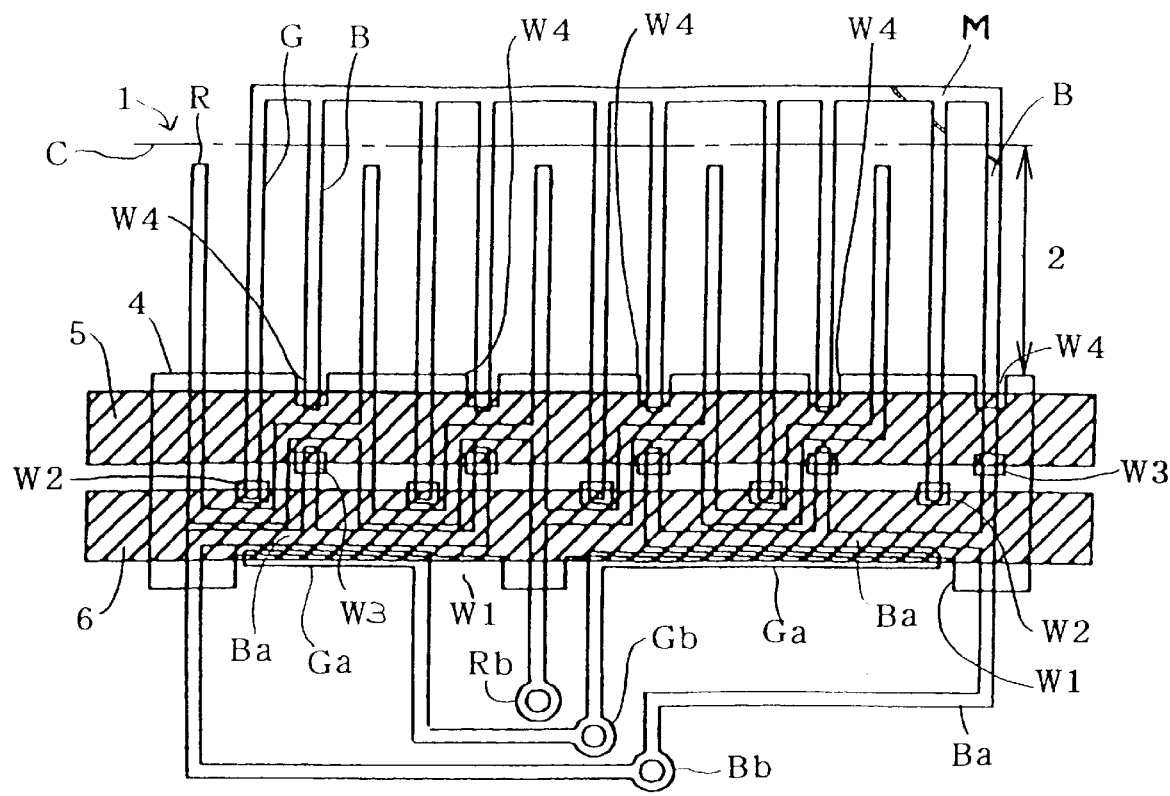
FIG. 40 is a plan view of the state where a conductive paste is printed on the resist shown in FIG. 39.
Figure 41:
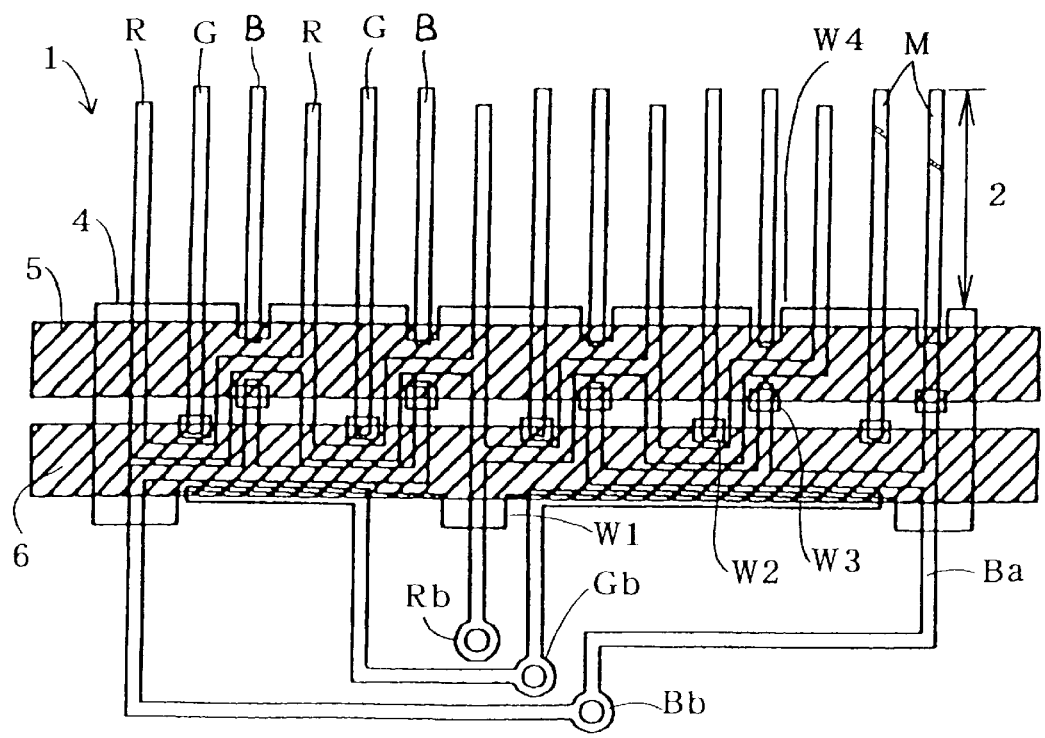
FIG. 41 is a plan view of the shape of the wiring patterns on the pliable film of the contact film of the 14th embodiment completed by the process of FIG. 38 to FIG. 40.
Figure 42:
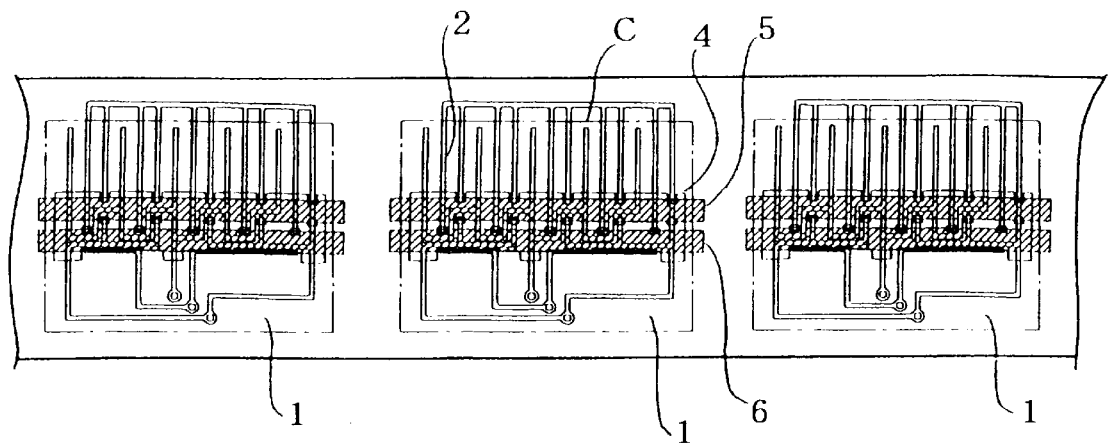
FIG. 42 is a schematic plan view of the pliable film material in a state where the process shown in FIG. 40 is completed.
Figure 43:
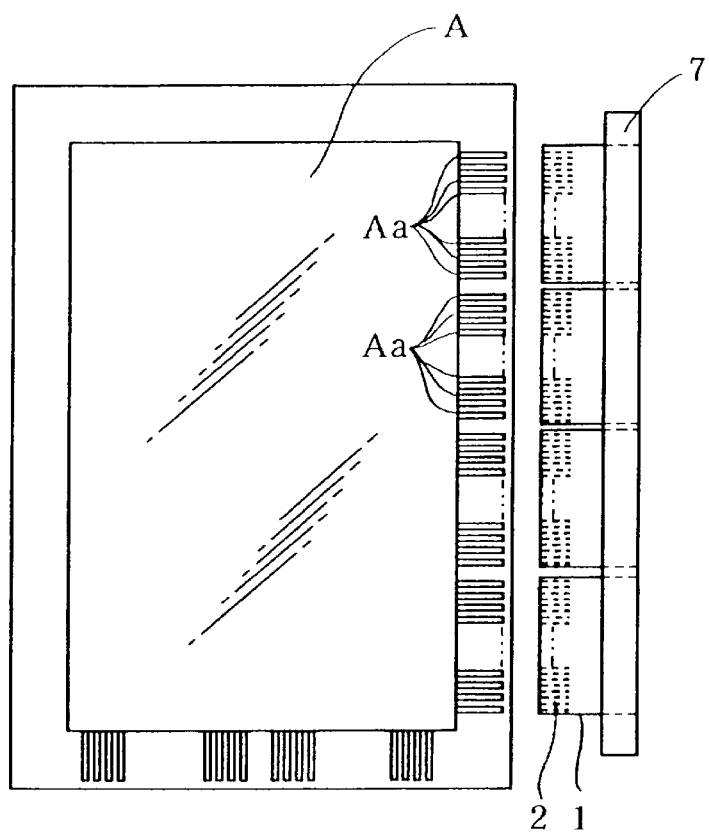
FIG. 43 is a plan view substantially showing an example of the configuration of a color liquid crystal display panel.
Figure 44:
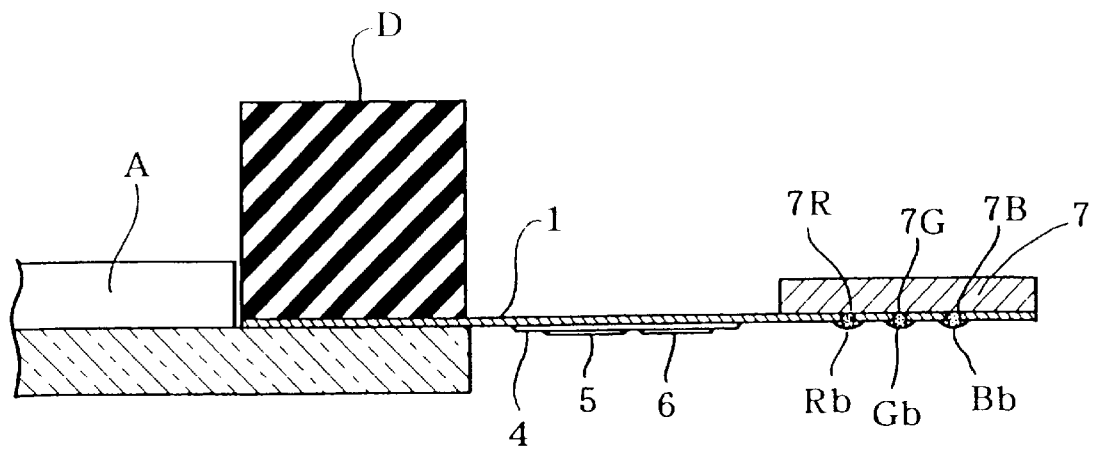
FIG. 44 is a sectional view of a state where the contact film of the 14th embodiment is brought into electrical contact with the terminals of the color liquid crystal display panel.

FIG. 38 is a plan view of the shape of the wiring patterns formed on a pliable film; FIG. 39 is a plan view of a state where a resist is applied onto the signal lines as an insulating film; FIG. 40 is a plan view of a state where a conductive paste is printed on the resist; FIG. 41 is a plan view of the shape of the wiring patterns on the pliable film of the completed contact film; and FIG. 42 is a schematic plan view of the pliable film material in a state where the process shown in FIG. 40 is completed. Further, FIG. 43 is a plan view substantially showing an example of the configuration of a color liquid crystal display panel; and FIG. 44 is a sectional view of a state where the contact film of the 14th embodiment is brought into electrical contact with the terminals of the color liquid crystal display panel.

Note that, in the following explanation, the color will be specified for each contactor in order to facilitate the understanding of the explanation of the state of arrangement and connection of the separate-color contactors, but the contactors do not correspond to just the electrode terminals for each specific color. Which color electrode terminal each contactor is brought into contact with is free. Further, when a larger number of contactors than the number of the electrode terminals are formed for every driving module, the electrode terminal to be brought into contact with each contactor may change with every positioning of the contact film with respect to the display panel. In any case, however, the signals to be input to the display panel via the contactors are the same.

Referring to FIG. 38, the contact film according to the present invention has an insulating pliable film 1 made of a plastic such as a polyimide film or polyester film formed to a substantially square shape. This pliable film 1 is preferably formed by cutting it from a continuous pliable film material in the final stage of the manufacturing process of the contact film. A plurality of contactors 2 are formed at equal distances in parallel, so as to individually contact the pixel electrode terminals corresponding to the three primary colors (red, green, and blue) of light of the color liquid crystal display panel A, at the front end portion of one surface of the pliable film 1. Further, separate-color signal input portions Rb, Gb, and Bb for the first through third colors are formed on the rear end portion of the same surface of the pliable film 1.

Further, on the same surface of the pliable film 1, first color signal lines Ra for connecting the rear end portions of the first color contactors R among the contactors 2 and the first color signal input portion Rb, second color signal lines Ga for connecting the rear end portions of the second color contactors G and the second color signal input portion Gb, and third color signal lines Ba for connecting the rear end portions of the third color contactors B and the third color signal input portion Bb are respectively formed.

The first color signal lines Ra are extended crossing the vertical direction separation portions Gc and Bc of the second color and third color signal lines Ga and Ba in the lateral direction. The first color signal lines Ra are connected to the first color signal input portion Rb located further back than the substantial centers of the signal lines Ra. Further, the third color signal lines Ba are extended crossing the vertical direction separation portions Gc of the second color signal lines Ga in the lateral direction at appropriate positions.

Further, the front end portions of the second color contactors G and the third color contactors B are connected to each other by a coupling line 3 extended in the direction of arrangement of the contactors 2. The coupling line 3 is extended up to the front end of the third color contactor B located at the right end of the direction of arrangement of the contactors 2. Only the third color contactor B on the right end is connected to the third color signal input portion Bb without being separated by a first color signal line Ra via the third color signal line Ba connected to the rear end portion thereof. Accordingly, the first color contactors R are in a conductive state with the first color signal input portion Rb, while the second color and third color contactors G and B are in a conductive state with the third color signal input portion Bb. Note that, as will be mentioned later, the coupling line 3 is cut off at an appropriate time after the electrolytic plating is applied to the surface of the contactors 2 (R, G, and B).

A resist 4 serving as an insulating film is formed on the pliable film 1 as shown in FIG. 39 with respect to the signal lines formed as described above. The resist 4 is extended along the direction of arrangement of the contactors 2 (R, G, and B), the front portion thereof is located at the rear side of the contactors 2. At the same time, the predetermined portions of the second color and third color signal lines Ga and Ba are left exposed. Namely, second color recess portions W1 and openings W2 for exposing the separation portions of the second color signal lines Ga are formed in the resist 4. Further, third color openings W3 and W4 for exposing the vicinity of the separation portions Bc of the third color signal lines Ba are formed.

Further, electrolytic plating M by a metal material excellent in corrosion resistance, for example, gold or platinum, is applied to the exposed surfaces of the conductors of the contactors 2 (R, G, and B) etc. in the state shown in FIG. 39. At this time, as mentioned above, the first color contactors R are in a conductive state with the first color signal input portion Rb and the second color contactors G and B are in a conductive state with the third color signal input portion Bb, therefore the electrolytic plating on the surfaces of the contactors 2 (R, G, and B) can be carried out without obstacle. If any contactor is isolated from the signal input portion, electrolytic plating cannot be adopted and nonelectrolytic plating must be carried out, but in nonelectrolytic plating, conduction defects such as short circuits are easily induced by bridges formed between contactors 2 of particularly narrow pitch, but with electrolytic plating, a high quality plated surface can be obtained. Note that, in FIG. 39 to FIG. 41, the electrolytic plating M is simply illustrated in a partially transparent state. Note that, it is also possible to perform this electrolytic plating not after the formation of the insulating film as mentioned above, but before the formation thereof, that is, in the first stage. In this case, there is the advantage that the durability against the plating solution does not have to be considered when selecting the resist forming the insulating film.

Next, as shown in FIG. 40, conductive pastes 5 and 6 such as copper or silver are printed by silk screen as strip shaped conductive films extending along the direction of arrangement of the contactors 2 (R, G, and B) from the top of the resist 4. The front side conductive paste 5 connects the separation portions Bc of the third color signal lines Ba at the positions of the openings W3 and W4, while the rear side conductive paste 6 connects the separation portions Gc of the second color signal lines Ga at the positions of the recess portions W1 and the openings W2. Accordingly, the rear end portions of the second color and third color contactors G and B are made conductive with the second color and third color signal input portions Gb and Bb via the signal lines Ga and Ba, respectively.

Note that the distance of connection by the conductive pastes 5 and 6 is desirably made as short as possible so as not to exert an adverse influence upon the resistance value.

Next, in FIG. 40, the coupling line 3 is cut off at the position substantially indicated by a line C. By this, as shown in FIG. 41, a contact film in which all contactors 2 (R, G, and B) are independent from each other separately for each of the colors is completed. Note that, as shown in FIG. 42, the cutting of the coupling line C is simultaneously achieved when cutting the pliable film 1 from the pliable film material to a substantially square shape.

Note that, in the example shown in FIG. 41, the coupling line 3 is cut off slightly to the front so as not to cut off the front end portions of the first color contactors R, therefore the service life of the cutting tool is prolonged and the manufacturing cost is reduced, but in FIG. 41, for easy understanding, the cut off position is drawn exaggerated large to the fronts of the contactors R.

The contact film produced after going through the above process is attached onto the flexible printed circuit board 7 as shown in for example FIG. 44. The signal input portions Rb, Gb, and Bb of the contact film and the signal lines 7R, 7G, and 7B on the flexible printed circuit board 7 are connected by soldering etc. for use. The contact film is pushed by a pushing member D made of an elastic body such as a silicone rubber as shown in FIG. 43 and FIG. 44 for causing individual contact with the pixel electrode terminals Aa arranged at the outside edge portion of the color liquid crystal display panel A with the required contact pressure. Then, by the input of the pixel driving signals to the color liquid crystal display panel via the contact film, separate-color display of the color liquid crystal display panel A becomes possible and inspection of separate-color display defects and the display quality etc. becomes possible.

Next, an explanation will be made of a 15th embodiment of the present invention by referring to FIG. 45 to FIG. 48.

Figure 45:
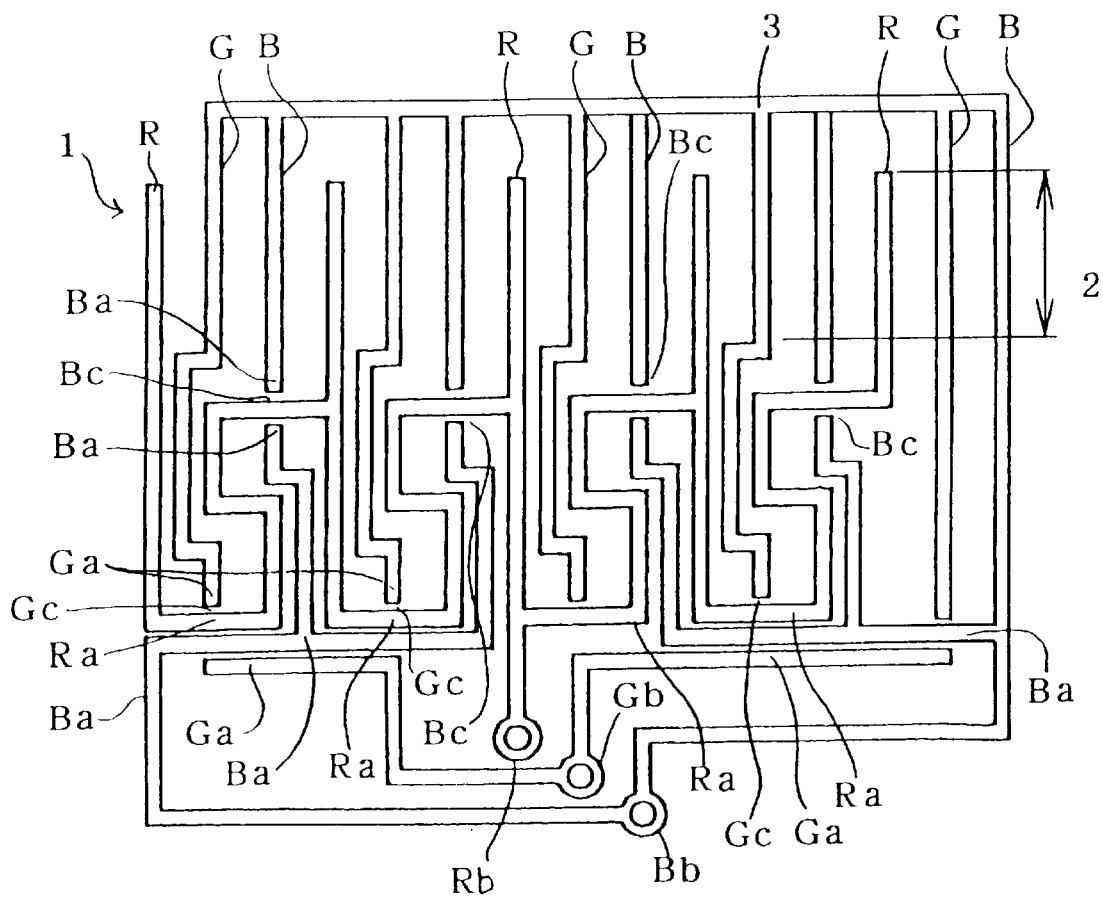
FIG. 45 shows the manufacturing process of the contact film according to a 15th embodiment of the present invention and is a plan view of the shapes of the wiring patterns formed on the pliable film.
Figure 46:
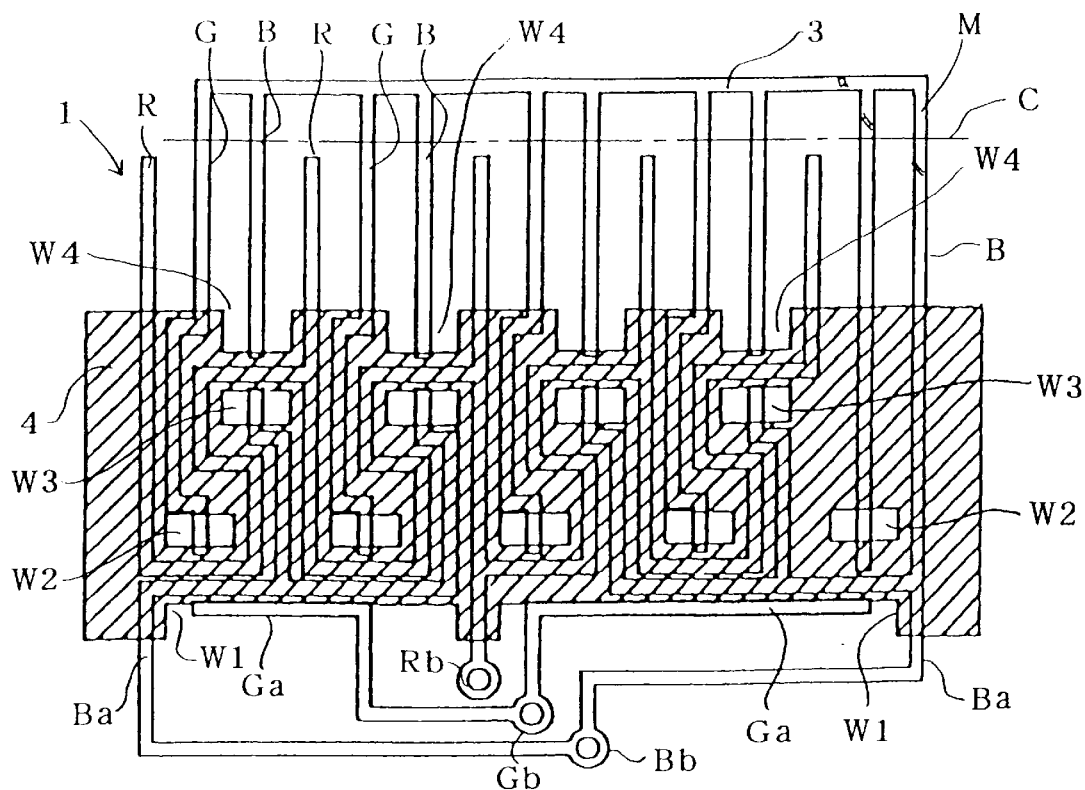
FIG. 46 is a plan view of the state where a resist is applied onto the signal lines shown in FIG. 45.
Figure 47:
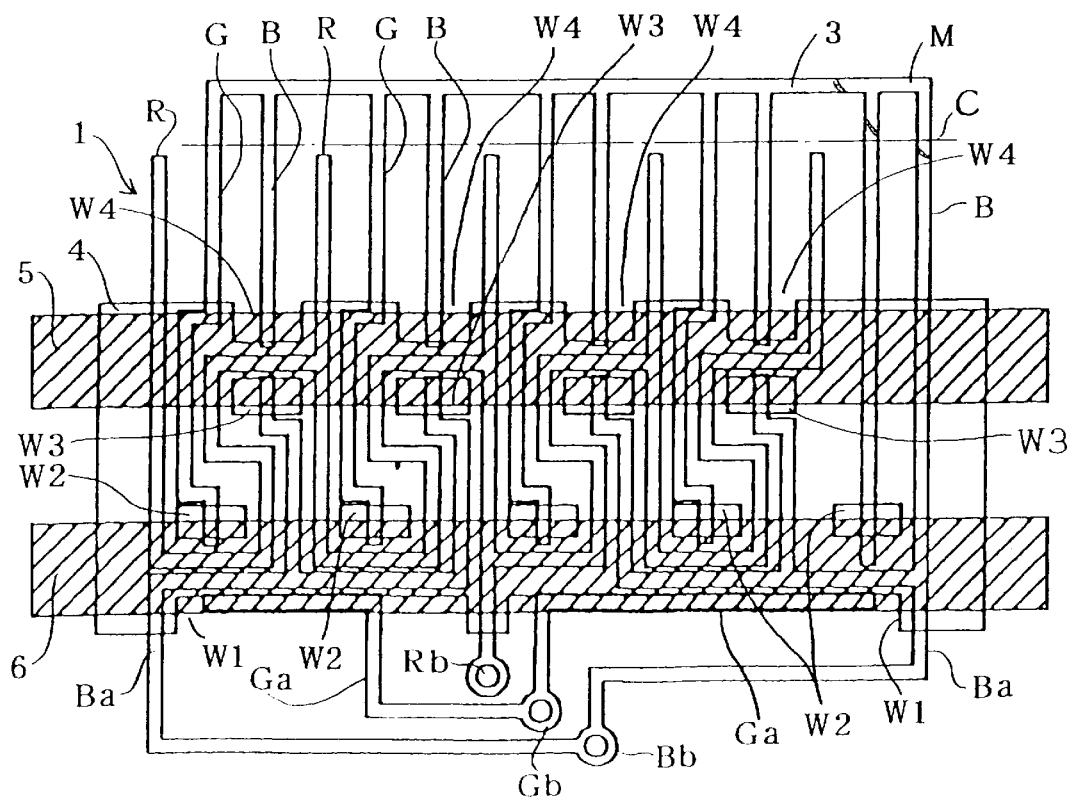
FIG. 47 is a plan view of a state where a conductive paste is printed on the resist shown in FIG. 46.
Figure 48:
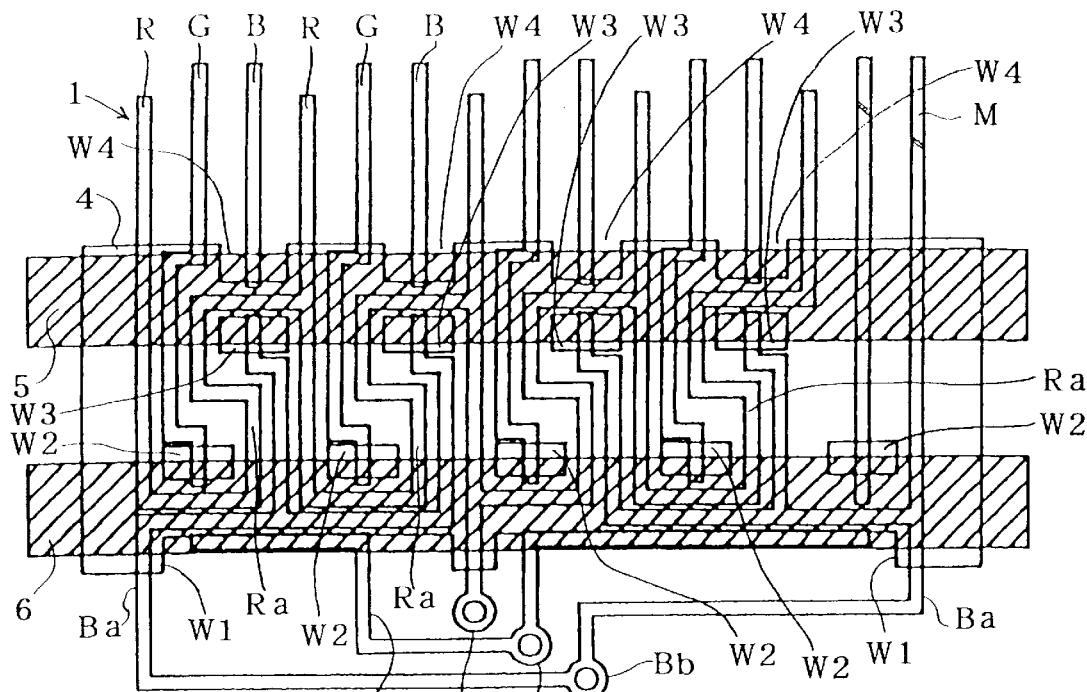
FIG. 48 is a plan view of the shapes of the wiring patterns on the pliable film of the contact film of the 15th embodiment completed by the process of FIG. 45 to FIG. 47.

FIG. 45 is a plan view of the shapes of the wiring patterns formed on the pliable film; FIG. 46 is a plan view of a state where a resist is applied onto the signal lines; FIG. 47 is a plan view of a state where a conductive paste is printed on the resist; and FIG. 48 is a plan view of the shapes of the wiring patterns on the pliable film of the completed contact film. In these figures, the same references are given to the same constituent elements as those of the 14th embodiment.

In this 15th embodiment as well, in the same way as the 14th embodiment, the signal lines Ra connected to the rear end portions of the first color contactors R are extended crossing the vertical direction separation portions Gc and Bc of the signal lines Ga connected to the rear end portions of the second color contactors G and the signal lines Ba connected to the rear end portions of the third color contactors B in the lateral direction. Further, the third color signal lines Ba are extended crossing the vertical direction separation portions Gc of the second color signal lines Ga at appropriate positions.

The 15th embodiment is different from the 14th embodiment in the point that, as shown in FIG. 45, spaces for interconnection substantially equivalent to the distance between the contactors 2 (R, G, and B) are secured on the two sides of the portions Gc and Bc separated by the first color signal lines Ra. Matching the wide spaces on the two sides of the separation portions of the signal lines Ga and Ba, as shown in FIG. 46, openings W2 and W3 and recess portions W4 of wide spaces in the lateral direction are formed in the resist 4. Accordingly, after the electrolytic plating M is applied to the surface of the conductors of the contactors 2 (R, G, and B) etc., the conductive paste 5 formed on the resist 4 covers and connects the separation portions Gc and Bc of the signal lines Ga and Ba with a wide lateral width in the openings W2 and W3 and recess portions W1 and W4 of wide space of the resist 4 as shown in FIG. 47. Accordingly, the reliability of connection between the separation portions of the signal lines Ga and Ba and the conductive paste 5 is enhanced. In this way, a contact film excellent in the reliability of electrical connection is completed (refer to FIG. 48).

Next, an explanation will be made of a 16th embodiment of the present invention by referring to FIG. 49 to FIG. 51.

Figure 49:
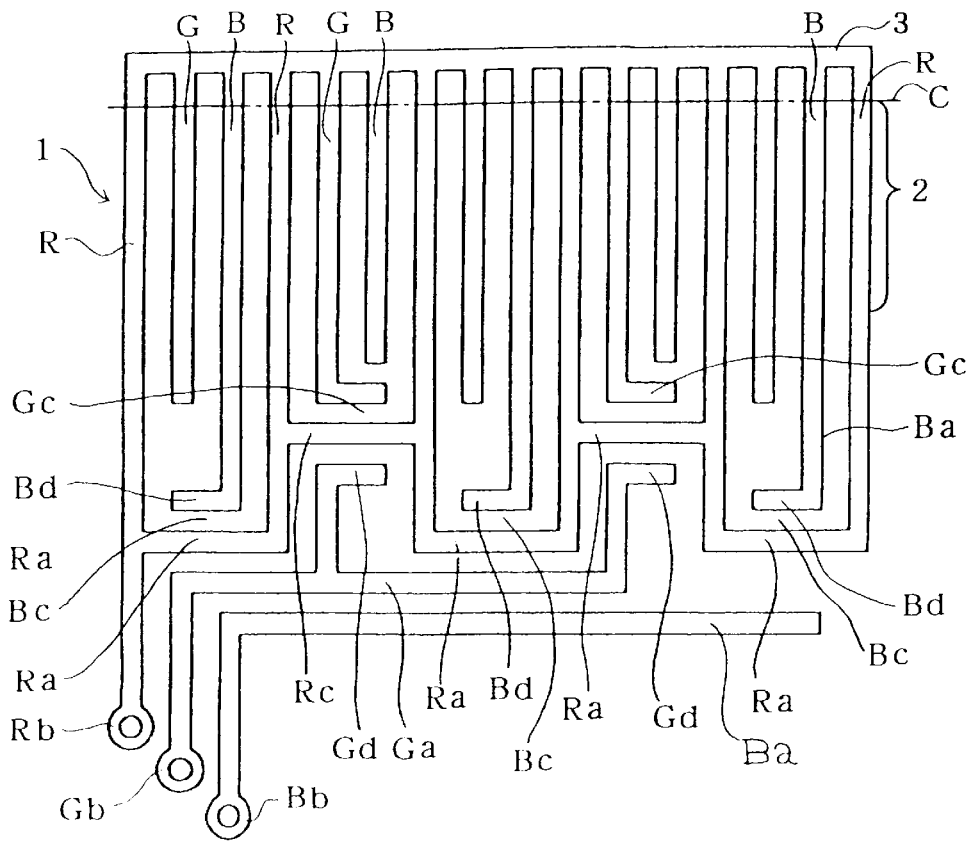
FIG. 49 shows the manufacturing process of the contact film according to a 16th embodiment of the present invention and is a plan view of the shapes of the wiring patterns formed on the pliable film.
Figure 50:
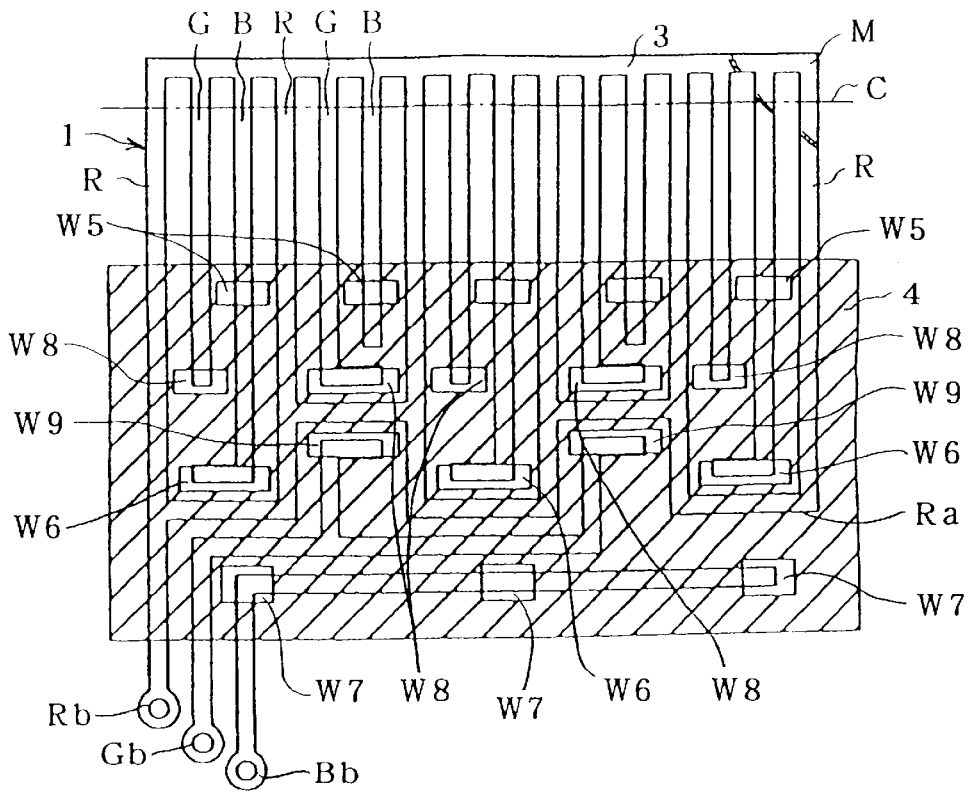
FIG. 50 is a plan view of the state where a resist is applied onto the signal lines shown in FIG. 49.

FIG. 49 is a plan view of the pattern shapes of the contactors, signal lines, and coupling lines formed on a pliable film; FIG. 50 is a plan view of a state where the resist is applied onto the signal lines; and FIG. 51 is a plan view of a state where the conductive paste is printed on the resist. In these figures, the same references are given to the same constituent elements as those of the 14th and 15th embodiments.

In this 16th embodiment, in the same way as the 14th and 15th embodiments, the signal lines Ra connected to the rear end portions of the first color contactors R are extended crossing the vertical direction separation portions Gc and Bc of the signal lines Ga connected to the rear end portions of the second color contactors G and the signal lines Ba connected to the rear end portions of the third color contactors B in the lateral direction, respectively. Further, the second color signal lines Ga are extended crossing the vertical direction separation portions Bc of the third color signal lines Ba in the lateral direction at appropriate positions.

In the 14th and 15th embodiments, there are positions where part of the signal lines Ra, Ga, and Ba adjoin each other with a pitch of about a half of the pitch of the contactors 2 (R, G, and B), but in this 16th embodiment, as shown in FIG. 49, a distance of substantially the same pitch as that of the contactors 2 (R, G, and B) is secured among the signal lines Ra, Ga, and Ba. Accordingly, the pitch of the contactors 2 (R, G, and B) can be made narrower without being restricted by the pitch of the signal lines Ra, Ga, and Ba.

When desiring to secure a distance of substantially the same pitch as that of the contactors 2 (R, G, and B) among the signal lines Ra, Ga, and Ba, the separation distance of the signal lines Ga and Ba separated in the vertical direction is inevitably increased by the signal lines Ra. In this case, when desiring to connect the separated signal lines by conductive paste in only the vertical direction, the distance thereof is large, therefore is a large influence of the conductive paste in increasing the resistance value and the levels of signals input from the contactors 2 (R, G, and B) to the display panel A become non-uniform.

Figure 51:
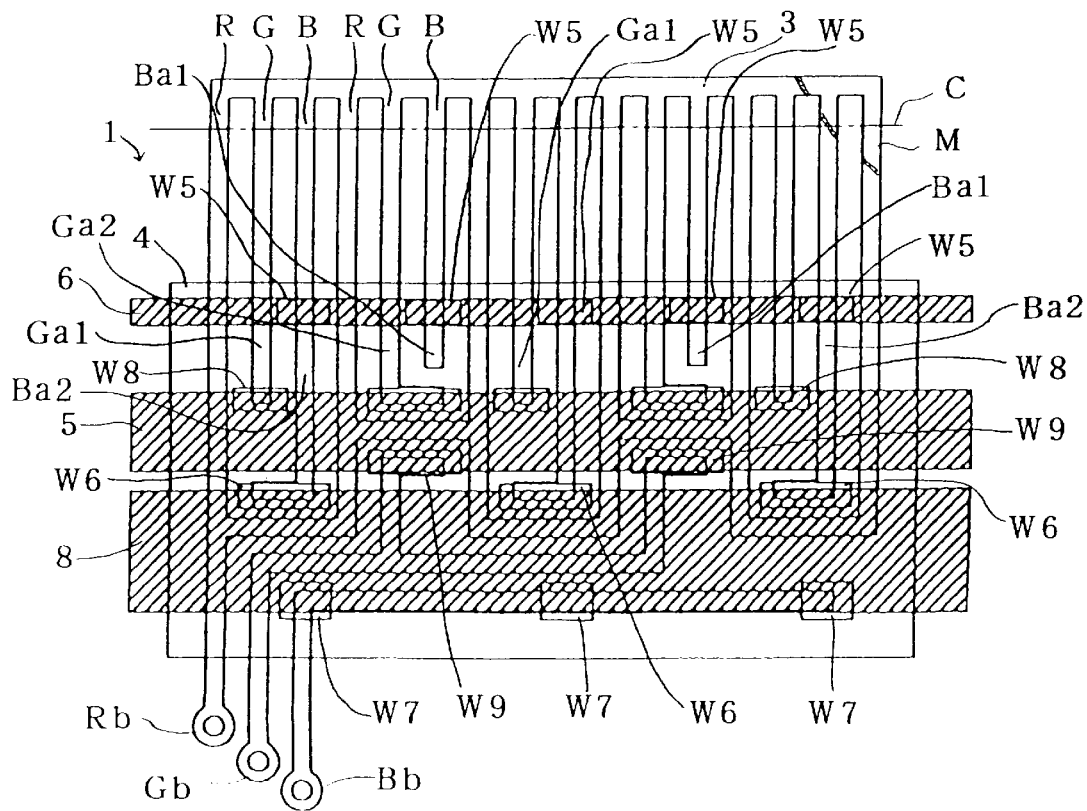
FIG. 51 is a plan view of a state where a conductive paste is printed on the resist shown in FIG. 50.

Therefore, in this 16th embodiment, in the resist 4, openings W5 to W9 are formed for exposing predetermined portions of the signal lines Ga and Ba (FIG. 50) and the signal lines Ga1 and Ba1 with large separation distances from the signal lines Ga and Ba connected to the signal input portions Gb and Bb are connected to the other signal lines Ga2 and Ba2 for the same color by the conductive pastes 5 and 6 in the lateral direction, respectively (FIG. 51). By this, the separated signal lines for the same one color can be connected with the shortest distance by the conductive pastes. In this 16th embodiment, as shown in FIG. 51, three strips of conductive pastes 5, 6, and 8 independent from each other are formed on the resist 4.

Further, in this embodiment, the coupling line 3 mutually coupling the front ends of the second color contactors G and the third color contactors B is connected to the front ends of the first color contactors R. By this, the front ends of the second color and third color contactors G and B are connected to the first color signal input portion Rb via the signal lines Ra connected to the rear end portions of the first color contactors R. Accordingly, in this 16th embodiment, the wiring layout of the signal lines Ra, Ga, and Ba and the coupling line 3 with respect to the contactors 2 (R, G, and B) can be simplified, therefore the process of forming the signal lines Ra, Ga, and Ba and the coupling line 3 with respect to the contactors 2 (R, G, and B) can be simplified. Note that, also in this 16th embodiment, after the resist 4 is printed on the pliable film 1, electrolytic plating M is applied to the surfaces of the contactors 2 etc. Further, the coupling line 3 is cut off at the position indicated by a line C in FIG. 51 to complete the contact film.

Next, an explanation will be made of a 17th embodiment of the present invention by referring to FIG. 52 and FIG. 53.

Figure 52:
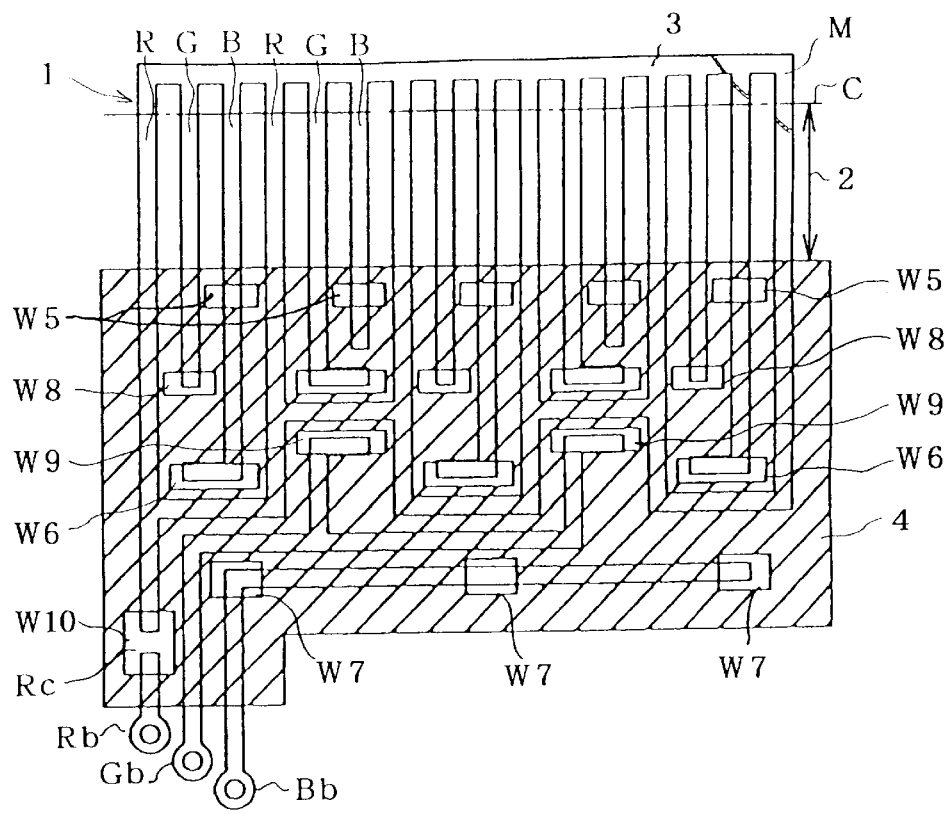
FIG. 52 shows the manufacturing process of the contact film according to a 17th embodiment of the present invention and is a plan view of the state where a resist is applied onto the signal lines of the wiring patterns formed on the pliable film.
Figure 53:
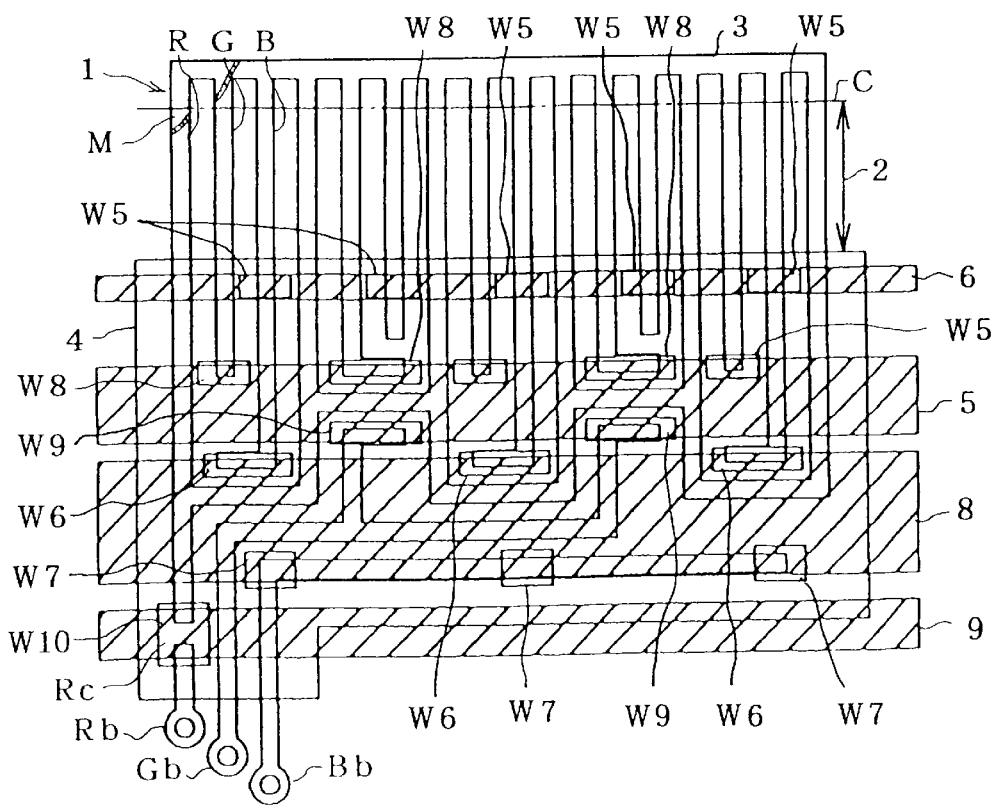
FIG. 53 is a plan view of a state where a conductive paste is printed on the resist shown in FIG. 52.

FIG. 52 is a plan view of a state where a resist is applied onto the signal lines of the wiring patterns formed on a pliable film; and FIG. 53 is a plan view of a state where a conductive paste is printed on the resist. In these figures, the same references are given to the same constituent elements as those of the 16th embodiment.

In this 17th embodiment, as shown in FIG. 52, a separation portion Rc is formed at the middle of the signal line Ra connecting the first color contactors R and the first color signal input portion. An opening W10 for exposing the separation portion Rc is formed in the resist 4. Further, as shown in FIG. 53, on the resist 4, a conductive paste 9 is printed separately from the conductive pastes 5, 6, and 8 mentioned above. The separation portion Rc in the opening W10 is made conductive by this conductive paste 9. In this way, by interposing the conductive portion by the conductive paste 9 in the middle of the signal line Ra connecting the first color contactors R and the first color signal input portion Rb, the signal routing conditions from the first color signal input portion Rb to the first color contactors R can be made similar to those of the other second color contactors G and third color contactors B. Accordingly, the levels of signals supplied from the separate-color contactors 2 (R, G, and B) to the display panel A can be made equal.

Next, an explanation will be made of an 18th embodiment of the present invention by referring to FIG. 54 and FIG. 55.

Figure 54:
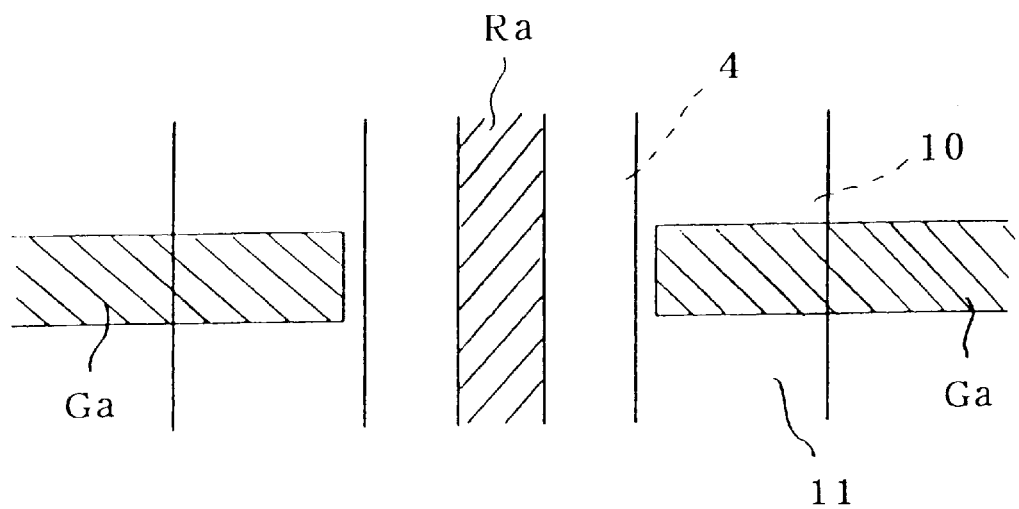
FIG. 54 is a plan view of the principal parts of the contact film according to an 18th embodiment of the present invention.
Figure 55:
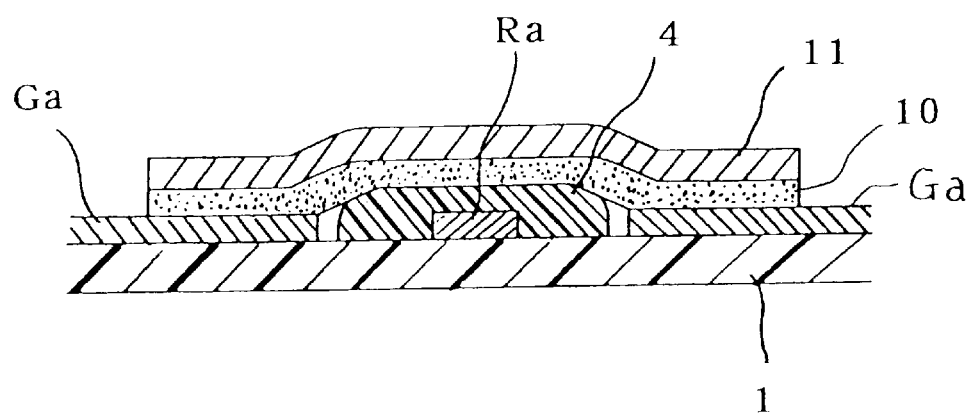
FIG. 55 is a vertical sectional view of the structure of the principal parts shown in FIG. 54.

FIG. 54 is a plan view of principal parts of the contact film according to the 18th embodiment of the present invention. Further, FIG. 55 is a vertical sectional view of the structure of the principal parts shown in FIG. 54. In these figures, the same references are given to the same constituent elements as those of the 14th to 17th embodiments.

In the above embodiments, as the conductive film to be provided on the insulating film (for example, the resist) 4, conductive pastes 5, 6, 8, and 9 were used, but in the 18th embodiment shown in FIGS. 54 and 18, a conductive sheet (for example an anisotropic conductive sheet) 10 is used. In this case, desirably a conductor 11 is additionally provided on the top of the conductive sheet 10, and the conductive sheet 10 is press-fixed to the signal lines G, B, etc.

While the above explanation was given for the 14th to 18th embodiments, the number of contactors 2 in the contact film illustrated here is only an example for facilitating the explanation and can be selected according to need. Further, in the contact film used for a color display panel provided with common electrode terminals, common electrode connectors, signal input portions, and signal lines connecting the two can be formed on the above surface of the pliable film. Further, as shown in FIG. 42, where a plurality of wiring patterns are arranged in columns on the material of a continuous pliable film, it is also possible to form continuous strips of resist and conductive paste covering a plurality of wiring patterns. Further, it is also possible to form wiring patterns such as contactors on pliable films independently one by one.

Further, the cutting of the coupling line need not be carried out after forming the conductive film as mentioned in the above embodiments. When performing the electrolytic plating to the contactors in the first process, the coupling line may be cut immediately after this. This cutting operation may be carried out at any timing so far as the process for performing at least the electrolytic plating is ended.

As apparent from the above explanation, in the contact films of the 14th to 18th embodiments, the three color contactors and the three color signal input portions are respectively connected via the signal lines separately for each of the colors on one surface of the pliable film, therefore it is possible to bring the contactors of the contact film into contact with the pixel electrode terminals of the color display panel and send the signals separately for each of the colors, whereby it is possible to light up the color display panel separately for each of the colors and inspect for display defects and display quality etc. In addition, the electrolytic plating is performed in a state where all of the three color contactors are conductive with the signal input portions, therefore a high quality contact surface can be formed on the contactors. Further, the coupling line at the front ends of the contactors are cut off after forming the electrolytic plating, therefore the front ends of the three color contactors can be brought into close contact with the bases of the pixel electrode terminals of the display panel having a relatively large resistance value. Accordingly, the maximum area of contact between each electrode terminal of the display panel and contactor can be secured and, at the same time, the loss of the signal level input to the display panel can be suppressed to the lowest limit, therefore the precision and reliability of the inspection of the display quality of the display panel can be enhanced. Accordingly, a compact display panel inspecting contact film with which electrical reliability can be secured can be provided at an inexpensive manufacturing cost.

What is claimed is:

1. A display panel contact apparatus wherein a front end area of a contact film is brought into contact with a plurality of individual separate-color electrodes arranged on the substrate of the liquid crystal display panel provided with a function of displaying red, green, and blue colors and wherein signals for inspection of the display quality etc. are supplied for each of the colors, characterized in that the contact film is provided with a pliable film substrate and a plurality of separate-color contactors arranged corresponding to the arrangement of the individual electrodes on one surface at the front end of the film substrate; the contactors for any one of the colors among the contactors are sequentially arranged shifted in position to the front side or rear side of the contactors for the other two colors in the front end area of the film substrate; the contactors for each of the colors are connected to a signal input portion formed at the rear end of the contact film via a wiring pattern formed on the film substrate without mutual intersection; and the wiring patterns are covered by an insulating film at least at the front end area of the film substrate.

2. A contact apparatus as set forth in claim 1, characterized in that a first color wiring pattern for connecting first color contactors arranged at the front side in the front end area of the film substrate with a signal input portion has a trunk line pattern connected to the first color contactors at the front end of the front end area of the film substrate; a second color wiring pattern for connecting the second color contactors arranged at the front side or rear side in the front end area of the film substrate with a signal input portion has a trunk line pattern connected to the second color contactors between the contactors on the front side and the contactors on the rear side in the front end area of the film substrate; and a third color wiring pattern for connecting the third color contactors arranged at the rear side in the front end area of the film substrate with a signal input portion has a trunk line pattern connected to the third color contactors at the rear end of the front end area of the film substrate.

3. A contact apparatus as set forth in claim 2, characterized in that the first color wiring pattern extends to the signal input portion from the two ends of the trunk line pattern thereof; the second color wiring pattern extends to the signal input portion at the inside of the first color wiring pattern from the two ends of the trunk line pattern of the second color wiring pattern; and the third color wiring pattern extends to the signal input portion at the inside of the second color wiring pattern from substantially the center portion of the trunk line pattern of the third color wiring pattern.

4. A contact apparatus as set forth in claim 1, characterized in that the first color wiring pattern arranged at the front side in the front end area of the film substrate for connecting the first color contactors with the signal input portion has a trunk line pattern connected to the first color contactors between the contactors at the front side and the contactors at the rear side in the front end area of the film substrate; the second color wiring pattern arranged at the front side or rear side in the front end area of the film substrate for connecting the second color contactors with the signal input portion has a trunk line pattern connected to the second color contactors between the contactors at front side and the contactors at the rear side in the front end area of the film substrate; and the third color wiring pattern arranged at the rear side in the front end area of the film substrate for connecting the third color contactors and the signal input portion has a trunk line pattern connected to the third color contactors at the rear side of the front end area of the film substrate.

5. A contact apparatus as set forth in any one of claims 1 to 5, characterized in that at the front side in the front end area of the film substrate with respect to the substrate of the liquid crystal display panel, there is formed a conductive pattern located on a forward extension of the contactors arranged at the rear side in the front end area.

6. A contact apparatus as set forth in any one of claims 1 to 5, characterized in that at a rear side in the front end area of the film substrate with respect to the substrate of the liquid crystal display panel, there is formed an auxiliary pattern located on a backward extension of the contactors arranged at the front side in the front end area.

7. A contact apparatus as set forth in any one of claims 1 to 6, characterized in that a concave groove of a depth of an amount of at least the thickness of the insulating film is formed in a pushing surface of an elastic pad for pushing the contact film against the individual electrode side of the liquid crystal display panel corresponding to the area where the wiring patterns are covered by the insulating film.

8. A contact apparatus as set forth in any one of claims 1 to 7, characterized in that openings are formed behind the wiring patterns at the front end area of the film substrate.

9. A contact apparatus as set forth in any one of claims 1 to 8, characterized in that a part of the film substrate between the contactors at the front side at the front end area and the contactors at the rear side is bent to the back surface side of the film substrate.

10. A display panel contact apparatus which brings a contact film into contact with separate-color electrodes arranged successively in groups of three colors on the substrate of a color liquid crystal display panel and supplies signals for inspection of the display quality etc. for each of the colors, characterized in that the contact film is provided with a pliable film substrate, a plurality of separate-color contactors arranged on one surface of the film substrate in a one-to-one correspondence with the electrodes, and wiring patterns for connecting the separate-color contactors with separate-color signal input portions formed on the film substrate; the contactors for one color among the three colors are connected to each other via a wiring pattern, and the contactors for the other two colors are respectively independently formed separated from their respectively corresponding wiring patterns; an insulating film is formed on the film substrate so as to leave exposed the base end portions of the contactors for the two colors formed separated from the wiring patterns and a part of their wiring patterns; and the base end portions of the contactors for the two colors formed separated from the wiring patterns are respectively connected with the wiring patterns by conductive patterns formed on the insulating film.

11. A contact apparatus as set forth in claim 10, characterized in that the base ends of the contactors for the two colors formed separated from the wiring patterns are arranged separate for each of the colors in a zig-zag manner along the directions of arrangement of the contactors, and the wiring patterns are located on the extensions of the directions of arrangement.

12. A display panel contact apparatus for bringing a contact film into contact with separate-color electrodes arranged successively in groups of three on a substrate of a color liquid crystal display panel and supplying signals for inspection of display quality etc. separately for each of the colors, characterized in that the contact film is provided with a pliable film substrate, a plurality of separate-color contactors arranged on one surface of the film substrate in a one-to-one correspondence with the electrodes, and wiring patterns for connecting the separate-color contactors with separate-color signal input portions formed on the film substrate; the contactors for two colors among the three colors are connected to each other separately for each of the colors via the wiring patterns; the contactors for the other one color are respectively independently formed separated from the wiring pattern; an insulating film is formed on the film substrate so as to leave exposed the base ends of the contactors for the one color formed separated from the wiring pattern and a part of the wiring pattern; and the base ends of the contactors for the one color formed separated from the wiring pattern are connected with the wiring pattern by a conductive pattern formed on the insulating film.

13. A display panel socket according to claim 12, wherein the contactors of one color among the contactors connected to each other separately for each of the colors via the wiring patterns are connected to the wiring pattern on the base ends thereof, while the other contactors are connected to the wiring pattern on the front ends thereof.

14. A display panel socket according to claim 12 or 13, wherein the base ends of the contactors for the one color formed separated from the wiring pattern are arranged in the form of a column along the direction of arrangement of the contactors, while the wiring pattern separated from the contactors for the one color is arranged along the direction of arrangement of the base ends of the contactors across the other wiring patterns.

15. A display panel contact film characterized in that a plurality of contactors respectively to be connected to a plurality of signal line terminals for the pixel electrodes for three colors of red, green, and blue arranged on a display panel are arranged on one surface of a contact film body having an insulating property and pliability; the front ends of the contactors corresponding to any one color among the three colors are connected with a wiring pattern linked with the signal input portion of that color; the base ends of the contactors corresponding to any of the other colors are connected with a wiring pattern linked with the signal input portion of that color; connection lands long in the front-back direction are formed at the base ends of the contactors corresponding to other color between the two colors; connection terminals to be connected with the front ends and the rear ends of these vertically long connection terminals are laid out on a connection film to be bonded with the contact film body in the form of a laminate on the bonding surface of the connection film corresponding to the connection lands so that the adjoining front ends and rear ends are connected offset from each other and the connection lands are in series; and the two ends of the wiring pattern are linked with the separately arranged signal input portion of that color.

16. A display panel contact film characterized in that a plurality of contactors respectively to be connected to a plurality of signal line terminals for the pixel electrodes for three colors of red, green, and blue arranged on a display panel are arranged on one surface of a contact film body having an insulating property and pliability; the front ends of the contactors corresponding to any one color among the three colors are connected with a wiring pattern linked with the signal input portion of that color; an insulating film is formed on the wiring pattern connected to the front ends of the contactors; the base ends of the contactors corresponding to any of the other colors are connected with a wiring pattern linked with the signal input portion of that color; vertically long connection lands are formed at the base ends of the contactors corresponding to other color between the two colors; connection terminals to be connected with the front ends and the rear ends of the vertically long connection terminals are laid out on a connection film to be bonded with the contact film body in the form of a laminate on the bonding surface of the connection film corresponding to the connection lands so that the adjoining front ends and rear ends are connected offset from each other and the connection lands are in series; the two ends of the wiring pattern are linked with the separately arranged signal input portion of that color; the other wiring pattern portions except the connection terminals and the signal input portions are covered by an insulating film; and said contact film body and the connection film are thermally press-fixed by using an anisotropic conduction film or a solder plating.

17. A display panel contact apparatus according to claim 15 or 16, wherein signal input portions provided at the two ends of the wiring pattern of the other color among the two colors are arranged on the connection film so as to adjoin each other around a single through hole in a state where mutual insulation is held.

18. A display panel contact apparatus according to claim 15 or 16, wherein three signal input portions selected from among the two ends and the middle of the wiring pattern of the other color between the two colors are arranged on the connection film adjoining each other around a single through hole separately held in insulated states.

19. A display panel contact apparatus according to claim 15 or 16, wherein the connection terminals provided on the connection film are made shapes that engage or mesh along the contours of the connection lands formed on the contact film body.

20. A display panel inspecting contact film characterized in that one surface of a pliable film having an insulating property has formed on it, corresponding to three color pixel electrode terminals of a display panel, a plurality of separate-color contactors to be individually brought in contact with three color pixel electrode terminals at the front end of the pliable film, separate-color signal input portions located on the other end of the pliable film, and separate-color signal lines for connecting the rear ends of said contactors and the signal input portions separately for each of the colors, the signal lines connected to the contactors for one color and the signal input portion for the one color are extended separating the signal lines connected to the contactors for the other two colors;

the signal lines connected to the contactors for the other two colors are mutually connected separately for each of the colors by a conductive film formed on an insulating film formed on the pliable film so as to cover the signal lines while leaving open predetermined portions of the same, whereby the contactors for the other two colors are connected to the signal input portions for the other two colors separately for each of the colors via signal lines connected to the rear end thereof; and the contactors for the other two colors are connected to one of the signal input portions via coupling lines mutually coupling the front ends thereof, and the coupling lines are cut off after electrolytic plating is applied to at least the surface of the contactors and the signal lines.

21. A display panel inspecting contact film according to claim 20, characterized in that the coupling lines are connected to the front ends of the contactors for one color, whereby the front ends of the contactors for the other two colors are coupled with the signal input portion for the one color via the contactors for the one color and the signal lines.

22. A display panel inspecting contact film according to claim 20, characterized in that at least the outermost side contactor located at one end in the direction of arrangement of the contactors is one of the contactors for the other two colors; the rear end of the outermost side contactor is connected to the signal input portion via a signal line without being separated by the signal line connecting the rear ends of the contactors for the one color and the signal input portion for the one color; and a coupling line is extended at a distance away from the front ends of the contactors for the one color to be connected to the front end of the outermost contactor.

23. A display panel inspecting contact film according to claim 20, characterized in that said conductive film is divided into at least two and extended in the form of strips on the insulating film along the direction of arrangement of the contactors.

24. A display panel inspecting contact film according to claim 20, characterized in that electrolytic plating is performed on the surface of the signal lines and contactors exposed from the insulating film.

25. A display panel inspecting contact film according to claim 23, characterized in that a cut off portion is formed at the middle of the signal lines connecting the contactors for the one color and the signal input portion for the one color; and the cut off portion of the signal lines is connected by the conductive film formed on the insulating film.

* * * * *